US012660184B2

(12) United States Patent
Rabkin et al.

(10) Patent No.: US 12,660,184 B2
(45) Date of Patent: Jun. 16, 2026

(54) MEMORY DEVICE INCLUDING COMPOSITE METAL OXIDE SEMICONDUCTOR CHANNELS AND METHODS FOR FORMING THE SAME

(71) Applicant: SANDISK TECHNOLOGIES LLC, Addison, TX (US)

(72) Inventors: Peter Rabkin, Cupertino, CA (US); Masaaki Higashitani, Cupertino, CA (US)

(73) Assignee: Sandisk Technologies, Inc., Milpitas, CA (US)

(*) Notice: Subject to any disclaimer, the term of this patent is extended or adjusted under 35 U.S.C. 154(b) by 562 days.

(21) Appl. No.: 18/158,783

(22) Filed: Jan. 24, 2023

(65) Prior Publication Data

US 2023/0363162 A1 Nov. 9, 2023

Related U.S. Application Data

(63) Continuation-in-part of application No. 18/045,070, filed on Oct. 7, 2022, now Pat. No. 12,598,749, which
(Continued)

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02);

*H10B 43/35* (2023.02); *H10W 20/42* (2026.01); *H10W 20/435* (2026.01)

(58) Field of Classification Search
CPC ........ H10B 43/35; H10B 43/10; H10B 41/10; H10B 41/35; H10D 30/693; H10D 64/037; H01L 23/5283; H10W 20/42; H10W 20/435
See application file for complete search history.

(56) References Cited

U.S. PATENT DOCUMENTS 7,994,588 B2 8/2011 Yin et al.
9,240,420 B2 1/2016 Rabkin et al.
(Continued)

OTHER PUBLICATIONS

USPTO Office Communication, Non-Final Office Action for U.S. Appl. No. 17/661,783, mailed Jan. 27, 2025, 14 pages.
(Continued)

*Primary Examiner* — Matthew C Landau
*Assistant Examiner* — Halee Cramer
(74) *Attorney, Agent, or Firm* — THE MARBURY LAW GROUP PLLC

(57) ABSTRACT

A three-dimensional memory device includes an alternating stack of insulating layers and electrically conductive layers, a memory opening vertically extending through the alternating stack, a memory film located in the memory opening, and a composite metal oxide semiconductor channel containing a first semiconducting metal oxide channel layer having a first band gap and a second semiconducting metal oxide channel layer having a second band gap that is different from the first band gap.

11 Claims, 70 Drawing Sheets

Related U.S. Application Data is a continuation-in-part of application No. 17/661, 783, filed on May 3, 2022, now Pat. No. 12,457,741.

(51) Int. Cl.

| | |
|---|---|
| *H10B 41/27* | (2023.01) |
| *H10B 41/35* | (2023.01) |
| *H10B 43/10* | (2023.01) |
| *H10B 43/35* | (2023.01) |
| *H10W 20/41* | (2026.01) |
| *H10W 20/42* | (2026.01) |

(56) References Cited

U.S. PATENT DOCUMENTS

| | | | |
|---|---|---|---|
| 9,634,097 | B2 | 4/2017 | Rabkin et al. |
| 9,842,651 | B2 | 12/2017 | Harari |
| 9,892,800 | B2 | 2/2018 | Harari |
| 10,497,712 | B2 | 12/2019 | Tezuka et al. |
| 10,593,692 | B2 | 3/2020 | Borukhov |
| 10,629,616 | B1 | 4/2020 | Kai et al. |
| 10,950,626 | B2 | 3/2021 | Kai et al. |
| 11,018,153 | B2 | 5/2021 | Kai et al. |
| 11,069,410 | B1 | 7/2021 | Cui et al. |
| 11,127,861 | B2 | 9/2021 | Sharma |
| 11,164,890 | B2 | 11/2021 | Zhang et al. |
| 11,195,781 | B2 | 12/2021 | Okina et al. |
| 11,201,107 | B2 | 12/2021 | Okina et al. |
| 11,251,199 | B2 | 2/2022 | Zhang et al. |
| 11,296,113 | B2 | 4/2022 | Kim et al. |
| 11,482,531 | B2 | 10/2022 | Said et al. |
| 2009/0057745 | A1 | 3/2009 | Yin et al. |
| 2015/0069377 | A1 | 3/2015 | Rabkin et al. |
| 2016/0064406 | A1* | 3/2016 | Natori ..................... H10D 99/00 |
| | | | 257/43 |
| 2016/0099250 | A1* | 4/2016 | Rabkin ................ H10D 64/035 |
| | | | 257/66 |
| 2016/0148947 | A1 | 5/2016 | Seo et al. |
| 2016/0149004 | A1 | 5/2016 | Rabkin et al. |
| 2018/0331116 | A1 | 11/2018 | Tezuka et al. |
| 2021/0066458 | A1* | 3/2021 | Tak .................... H10D 30/6757 |
| 2021/0066509 | A1 | 3/2021 | Sharma |
| 2021/0175251 | A1 | 6/2021 | Zhang et al. |
| 2021/0202703 | A1* | 7/2021 | Rajashekhar .......... H10B 43/27 |
| 2021/0202751 | A1 | 7/2021 | Goda et al. |
| 2021/0242241 | A1 | 8/2021 | Rajashekhar et al. |
| 2021/0327897 | A1* | 10/2021 | Kasai ..................... H10B 43/10 |
| 2022/0068903 | A1 | 3/2022 | Kim et al. |
| 2022/0068966 | A1 | 3/2022 | Rabkin et al. |
| 2022/0130853 | A1 | 4/2022 | Sharangpani et al. |
| 2022/0254797 | A1 | 8/2022 | Said et al. |
| 2022/0310655 | A1 | 9/2022 | Rabkin et al. |
| 2022/0310656 | A1 | 9/2022 | Rabkin et al. |

OTHER PUBLICATIONS

Endoh et al., "Novel Ultra High-Density Memory with a Stacked-Surrounding Gate Transistor (S-SGT) Structured Cell," IEDM Proc. (2001) 33-36.

Jang, J.T. et al., "Study on the Photoresponse of Amorphous In—Ga—Zn—O and Zinc Oxynitride Semiconductor Devices by the Extraction of Sub-Gap-State Distribution and Device Simulation," *ACS Appl. Mater. Interfaces* 2015, 7, 28, 15570-15577, Publication Date: Jun. 22, 2015, https://doi.org/10.1021/acsami.5b04152.

Kim, HS. et al. "Anion control as a strategy to achieve high-mobility and high-stability oxide thin-film transistors," *Sci. Rep.* 3, 1459 (2013). https://doi.org/10.1038/srep01459.

Rim, Y. S. et al., "Boost Up Mobility of Solution-Processed Metal Oxide Thin-Film Transistors via Confining Structure on Electron Pathways," *Advanced Materials*, vol. 26, No. 25, pp. 4273-4278, (2014), DOI: 10.1002/adma.201400529.

Yamazaki, S. et al., "In—Ga—Zn-Oxide Semiconductor and its Transistor Characteristics," *ECS Journal of Solid State Science and Technology*, vol. 3, No. 9, Q3012, (2014) https://looscience.lop.org/article/10.1149/2.003409iss/meta.

U.S. Appl. No. 17/534,528, filed Nov. 24, 2021, SanDisk Technologies LLC.

U.S. Appl. No. 17/661,783, filed May 3, 2022, SanDisk Technologies LLC.

U.S. Appl. No. 17/664,542, filed May 23, 2022, SanDisk Technologies LLC.

U.S. Appl. No. 17/664,550, filed May 23, 2022, SanDisk Technologies LLC.

U.S. Appl. No. 17/673,137, filed Feb. 16, 2022, SanDisk Technologies LLC.

U.S. Appl. No. 18/045,070, filed Oct. 7, 2022, SanDisk Technologies LLC.

UPSTO Office Communication, Non-Final Office Action for U.S. Appl. No. 18/045,070, mailed Apr. 2, 2025, 22 pages.

* cited by examiner

MEMORY DEVICE INCLUDING COMPOSITE METAL OXIDE SEMICONDUCTOR CHANNELS AND METHODS FOR FORMING THE SAME

RELATED APPLICATIONS

This application is a continuation-in-part (CIP) application of U.S. application Ser. No. 18/045,070 filed on Oct. 7, 2022, which is a CIP application of U.S. application Ser. No. 17/661,783 filed on May 3, 2022, the entire contents of which are incorporated herein by reference.

FIELD

The present disclosure relates generally to the field of semiconductor devices, and particularly to a three-dimensional memory device including composite metal oxide semiconductor channels and methods for forming the same.

BACKGROUND

A three-dimensional memory device including a three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers, a memory opening vertically extending through the alternating stack, a memory film located in the memory opening, and a composite metal oxide semiconductor channel containing a first semiconducting metal oxide channel layer having a first band gap and a second semiconducting metal oxide channel layer having a second band gap that is different from the first band gap, wherein the composite metal oxide semiconductor channel comprises at least one metal and oxygen, or at least one metal, oxygen and nitrogen.

According to another aspect of the present disclosure, a method of forming a memory device comprises: forming at least one unit layer stack over a substrate, wherein the unit layer stack comprises a vertical-isolation insulating layer, a source-level material layer, a channel-level sacrificial layer, and a drain-level material layer, wherein each source-level material layer is formed as or is subsequently replaced with a source layer, and each drain-level material layer is formed as or is subsequently replaced with a drain layer; forming a memory opening through the at least one unit layer stack; forming a memory film and a gate electrode in the memory opening; forming at least one channel-level backside recess by removing each channel-level sacrificial layer without removing the memory film, and without removing the vertical-isolation insulating layer, the source-level material layer, or the drain-level material layer within the at least one unit layer stack; and forming a composite metal oxide semiconductor channel layer within each of the at least one channel-level backside recess, wherein the composite metal oxide semiconductor channel layer comprises a first semiconducting metal oxide channel layer having a first band gap and a second semiconducting metal oxide channel layer having a second band gap that is different from the first band gap, wherein the composite metal oxide semiconductor channel layer comprises at least one metal and oxygen, or at least one metal, oxygen and nitrogen.

According to an aspect of the present disclosure, a three-dimensional memory device comprises an alternating stack of insulating layers and electrically conductive layers; a memory opening vertically extending through the alternating stack; and a memory opening fill structure located in the memory opening and comprising a memory film and a vertical composite metal oxide semiconductor channel comprising an outer semiconducting metal oxide channel layer having a first band gap and an inner semiconducting metal oxide channel layer having a second band gap that is different from the first band gap.

According to another aspect of the present disclosure, a method of forming a memory device is provided, which comprises: forming an alternating stack of insulating layers and spacer material layers over a substrate, wherein the spacer material layers are formed as or are subsequently replaced with electrically conductive layers; forming a memory opening through the alternating stack; and forming a memory opening fill structure in the memory opening, wherein the memory opening fill structure comprises a memory film and a vertical composite metal oxide semiconductor channel comprising an outer semiconducting metal oxide channel layer having a first band gap and an inner semiconducting metal oxide channel layer having a second band gap that is different from the first band gap.

According to an aspect of the present disclosure, a memory die includes an alternating stack of insulating layers and electrically conductive layers, a memory opening vertically extending through the alternating stack, and a memory opening fill structure located in the memory opening and including a memory film and a vertical composite metal oxide semiconductor channel having a different composition between its inner and outer portions.

According to another aspect of the present disclosure, a method of forming a memory structure includes forming an alternating stack of insulating layers and spacer material layers over a substrate, wherein the spacer material layers are formed as or are subsequently replaced with electrically conductive layers, forming a memory opening through the alternating stack, and forming a memory opening fill structure in the memory opening, wherein the memory opening fill structure comprises a memory film and a vertical composite metal oxide semiconductor channel having a different composition between its inner and outer portions.

DETAILED DESCRIPTION

Figure 1:
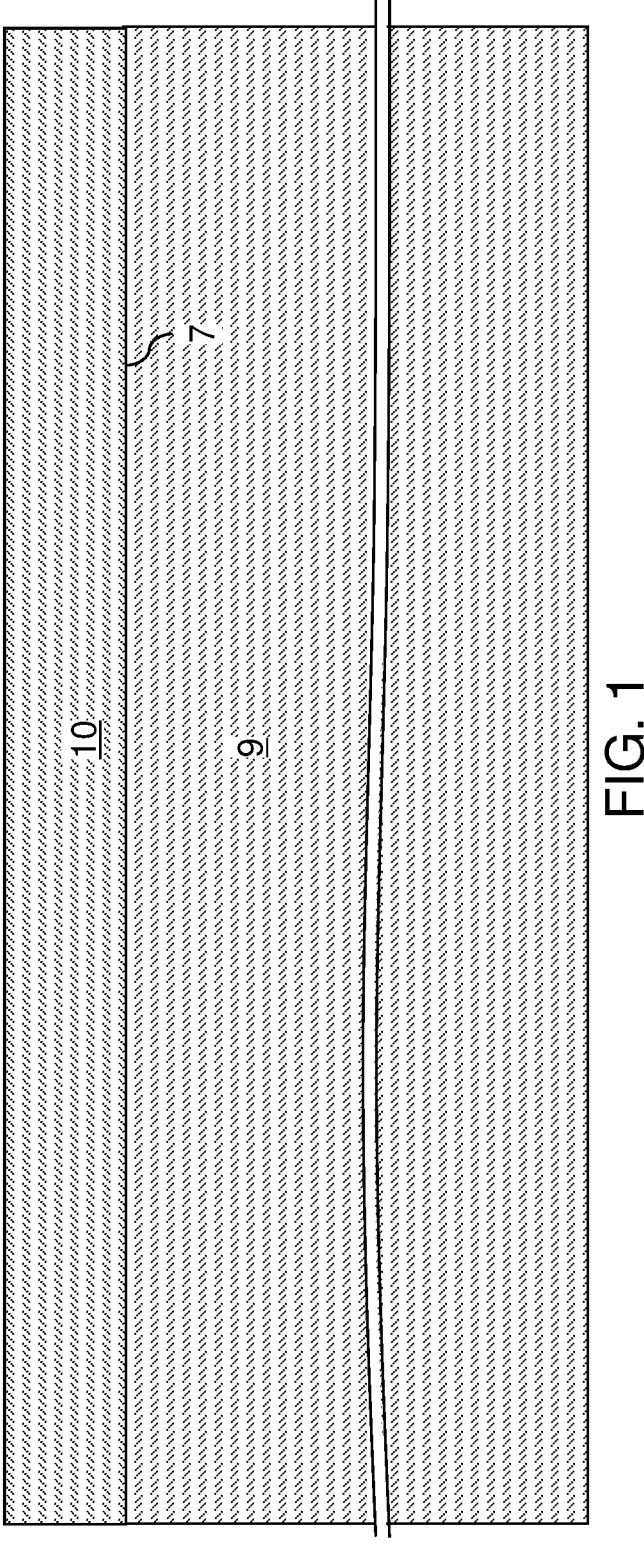
FIG. 1 is a schematic vertical cross-sectional view of a first exemplary structure including a carrier substrate according to a first embodiment of the present disclosure.

As discussed above, the embodiments of the present disclosure are directed to a three-dimensional memory device including composite metal oxide semiconductor channels and methods for forming the same, the various aspects of which are described below. The embodiments of the present disclosure can be used to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "proto-type" structure or an "in-process" structure refers to a transient structure that is subsequently modified in the shape or composition of at least one component therein. As used herein, a first electrical component is electrically connected to a second electrical component if there exists an electrically conductive path between the first electrical component and the second electrical component.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of dies therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. Each plane contains a number of memory blocks (or "blocks"), which are the smallest unit that can be erased by in a single erase operation. Each memory block contains a number of pages, which are the smallest units that can be selected for programming.

Metal oxide semiconductor materials, such as indium gallium zinc oxide (IGZO), exhibit a number of issues affecting device performance and reliability, such as insufficient on-current and bias instability (e.g., Vt shift), etc. Generally, it is desirable to achieve higher mobility, higher on current and lower leakage current in the metal oxide semiconductor channel. The embodiments of the present disclosure provide composite metal oxide semiconductor channels for use in a three-dimensional memory device, such as a three-dimensional NAND device. Embodiments of the present disclosure may be employed to provide higher charge carrier mobility, a lower subthreshold slope, a higher cell current and on current, and lower leakage current compared to prior art single layer metal oxide semiconductor channels. As used herein, the term "metal oxide semiconductor channel" includes a channel that includes one or more metals and oxygen, and optionally one or more additional elements, such as nitrogen. Thus, in one embodiment, the "metal oxide semiconductor channel" may include one or more metals (e.g., indium, gallium and/or zinc) and oxygen. In another embodiment, the "metal oxide semiconductor channel" may include one or more metals, oxygen and nitrogen (e.g., a metal nitride oxide, also referred to as a metal oxynitride).

Referring to FIG. 1, a first exemplary structure according to a first embodiment of the present disclosure is illustrated, which can be used, for example, to fabricate a device structure containing vertical NAND memory devices. The first exemplary structure includes a carrier substrate 9 and a semiconductor material layer 10 located on a top surface of the carrier substrate 9. The carrier substrate 9 can include a substrate material layer, which may include a semiconductor material (such as silicon), a dielectric material (such as silicon oxide), or a conductive material (such as a metal). In one embodiment, the carrier substrate 9 and the semiconductor material layer 10 may be provided as a commercially available single crystalline silicon wafer. A surface portion of the single crystalline semiconductor wafer can include a doped semiconductor well which comprises the semiconductor material layer 10. An interface 7 is located between the carrier substrate 9 and the semiconductor material layer 10.

Alternatively, the semiconductor material layer 10 can include a single crystalline or polycrystalline semiconductor (e.g., silicon) material layer provided on the carrier substrate 9. In this case, the carrier substrate 9 can include an insulating material (such as sapphire or silicon oxide), a conductive material, or a semiconductor material which is the same as or different from the material of the semiconductor material layer 10. Thus, the semiconductor material layer 10 includes at least one elemental semiconductor material (e.g., single crystal silicon or polysilicon layer or well), at least one III-V compound semiconductor material, at least one II-VI compound semiconductor material, at least one organic semiconductor material, or other semiconductor materials known in the art.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Figure 2:
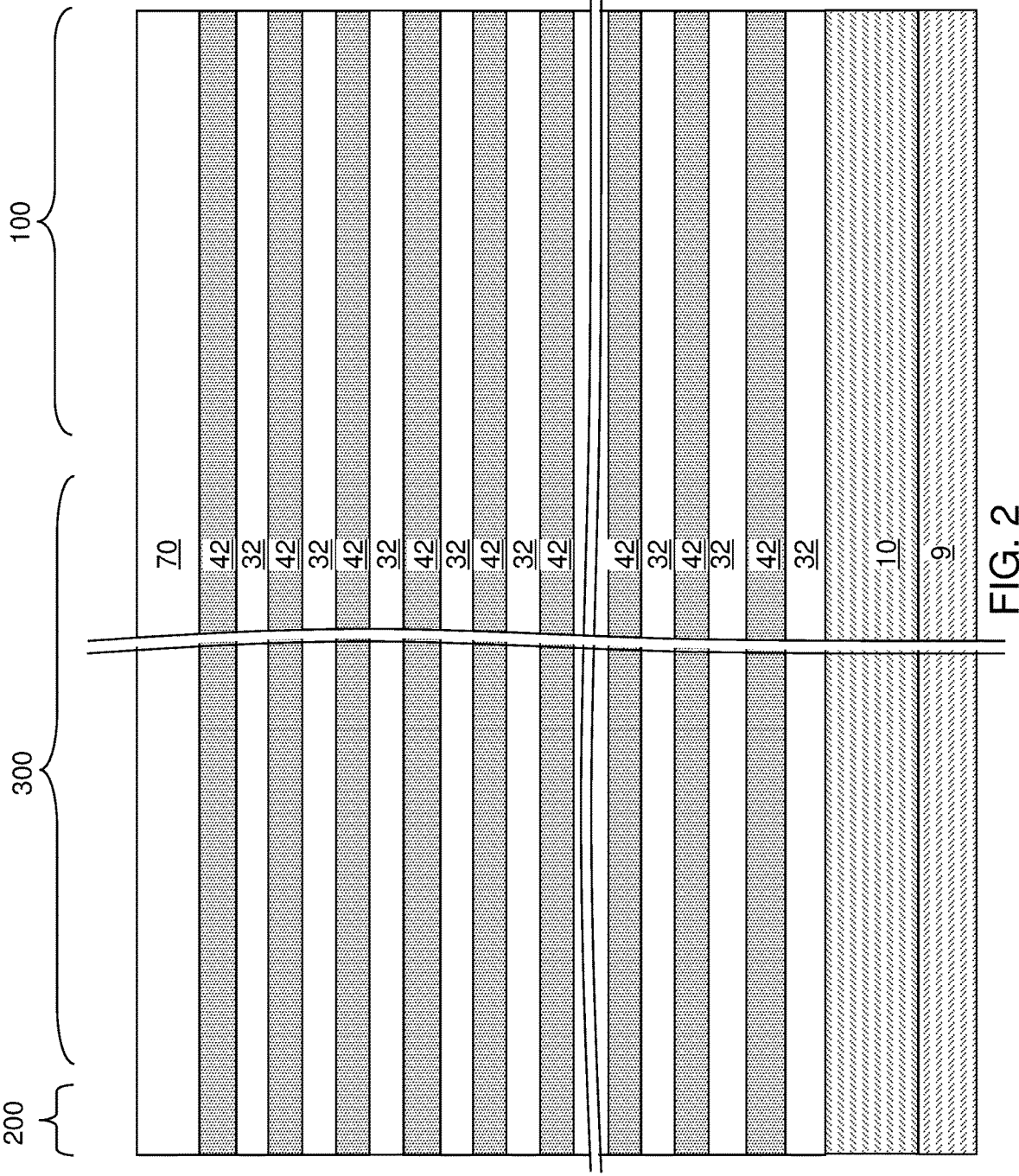
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the semiconductor material layer 10. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the three-dimensional NAND string memory devices to be subsequently formed.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While an embodiment is described above in which the spacer material layers are sacrificial material layers 42 that are subsequently replaced with electrically conductive layers, in other embodiments, the sacrificial material layers are formed as electrically conductive layers. In such embodiments, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

The first exemplary structure can include at least one memory array region 100 in which a three-dimensional array of memory elements is to be subsequently formed, at least one staircase region 300 in which stepped surfaces of the alternating stack (32, 42) are to be subsequently formed, and an interconnection region 200 in which interconnection via structures extending through the levels of the alternating stack (32, 42) are to be subsequently formed.

In one alternative embodiment, a peripheral device region containing the at least one semiconductor device for a peripheral circuitry may be located in the memory array region 100 under the alternating stack (32, 42) in a CMOS under array configuration.

Figure 3:
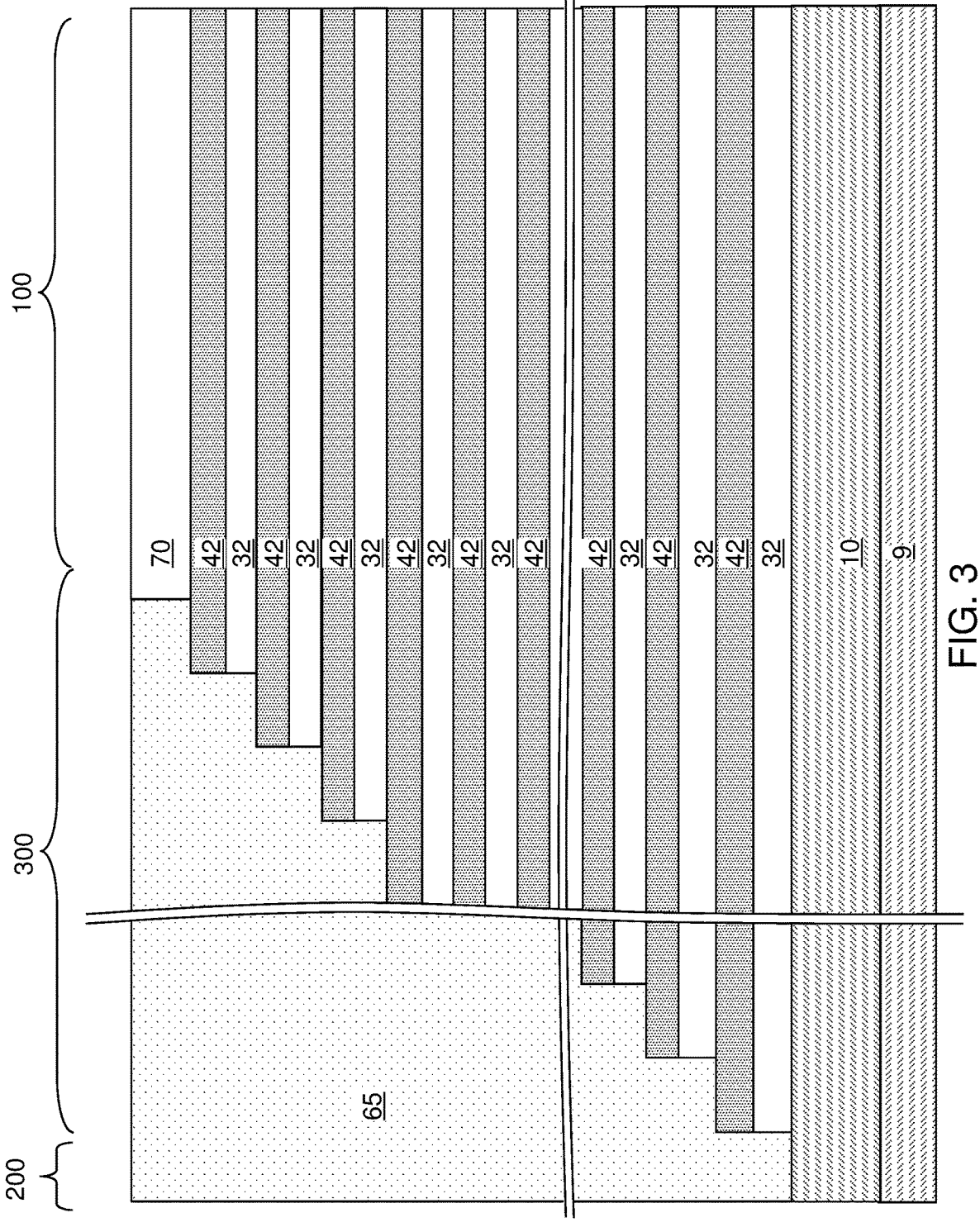
FIG. 3 is a schematic vertical cross-sectional view of the first exemplary structure after formation of stepped surfaces and a stepped dielectric material portion according to the first embodiment of the present disclosure.

Referring to FIG. 3, stepped surfaces are formed in the staircase region 300, which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the interconnection region 200 containing the at least one semiconductor device for the peripheral circuitry. The stepped cavity can have various stepped surfaces such that the horizontal cross-sectional shape of the stepped cavity changes in steps as a function of the vertical distance from the top surface of the semiconductor material layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset one from another such that each of the sacrificial material layers 42 has a physically exposed top surface in a respective column of staircases.

In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the stepped dielectric material portion 65.

As used herein, a "stepped" element refers to an element that has stepped surfaces and a horizontal cross-sectional area that increases monotonically as a function of a vertical distance from a top surface of a substrate on which the element is present. If silicon oxide is used for the stepped dielectric material portion 65, the silicon oxide of the stepped dielectric material portion 65 may, or may not, be doped with dopants such as B, P, and/or F. In one embodiment, the stepped dielectric material portion 65 has a stepwise-increasing lateral extent that increases with a vertical distance from the carrier substrate 9.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
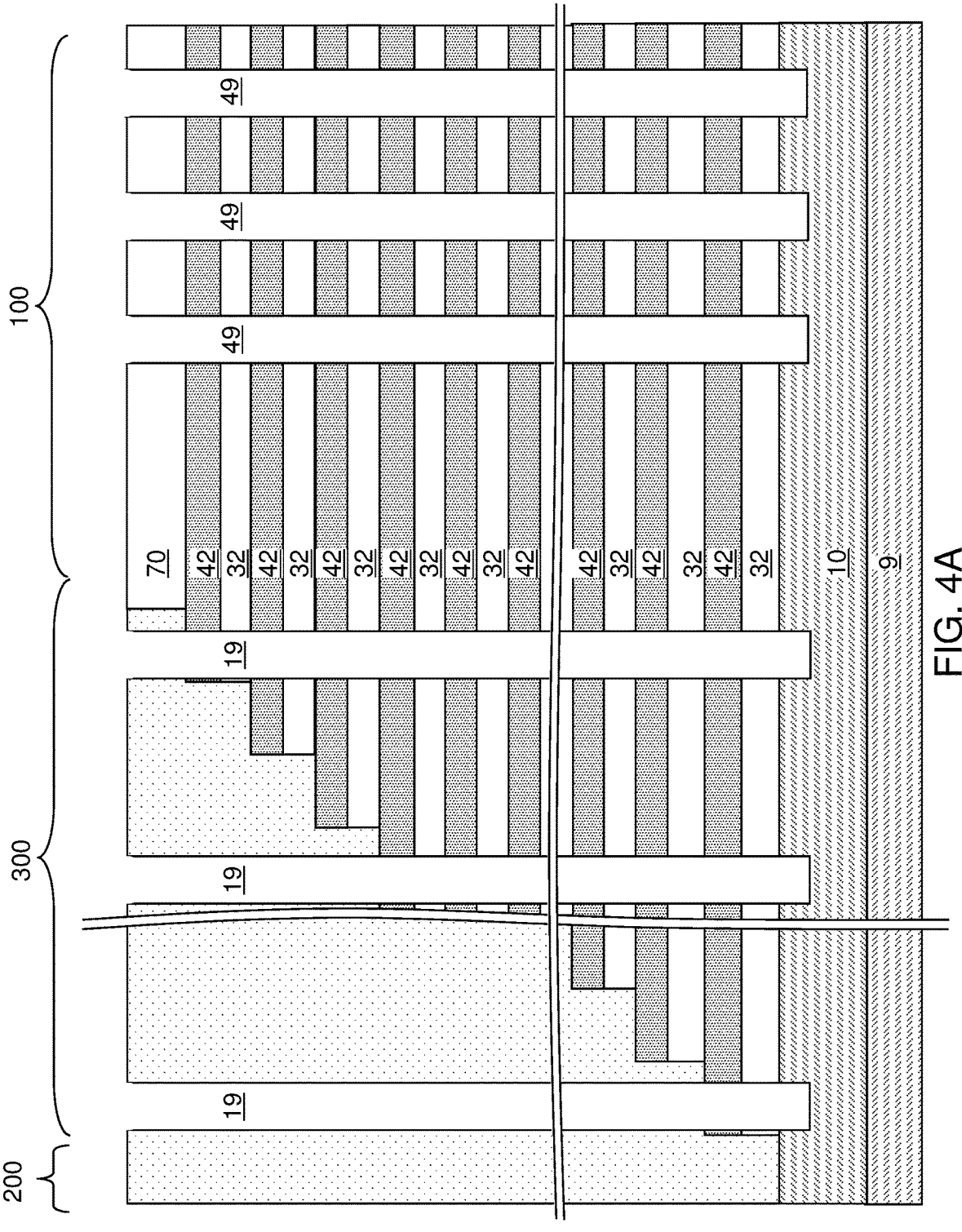
FIG. 4A is a schematic vertical cross-sectional view of the first exemplary structure after formation of memory openings and support openings according to the first embodiment of the present disclosure.
Figure 4B:
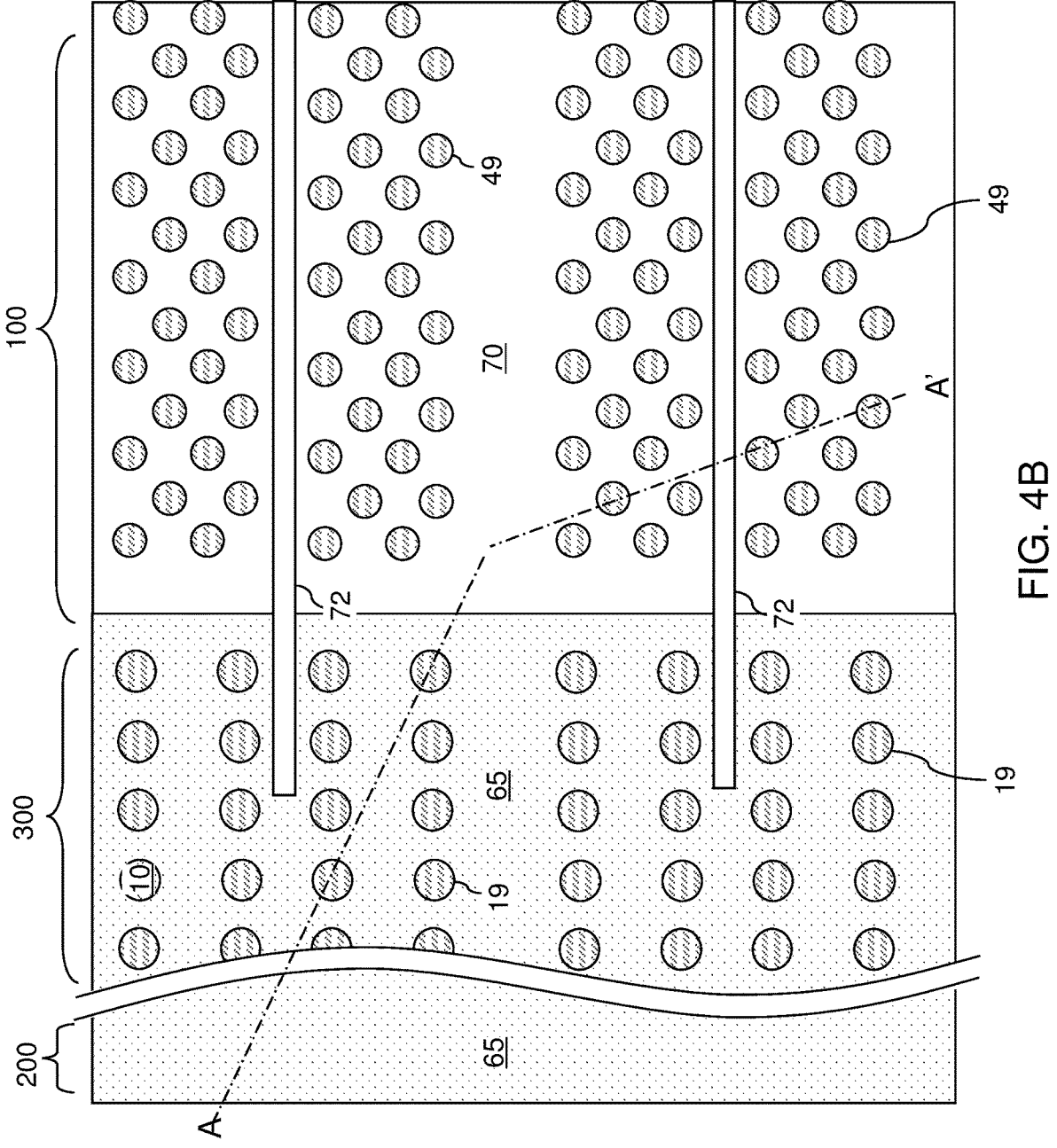
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300.

FIGS. 5A-5E are sequential schematic vertical cross-sectional views of a memory opening within the first exemplary structure during formation of a first exemplary memory opening fill structure therein according to the first embodiment of the present disclosure. The same structural change occurs simultaneously in each of the other memory openings 49 and in each support opening 19.

Figures 5A, 5B:
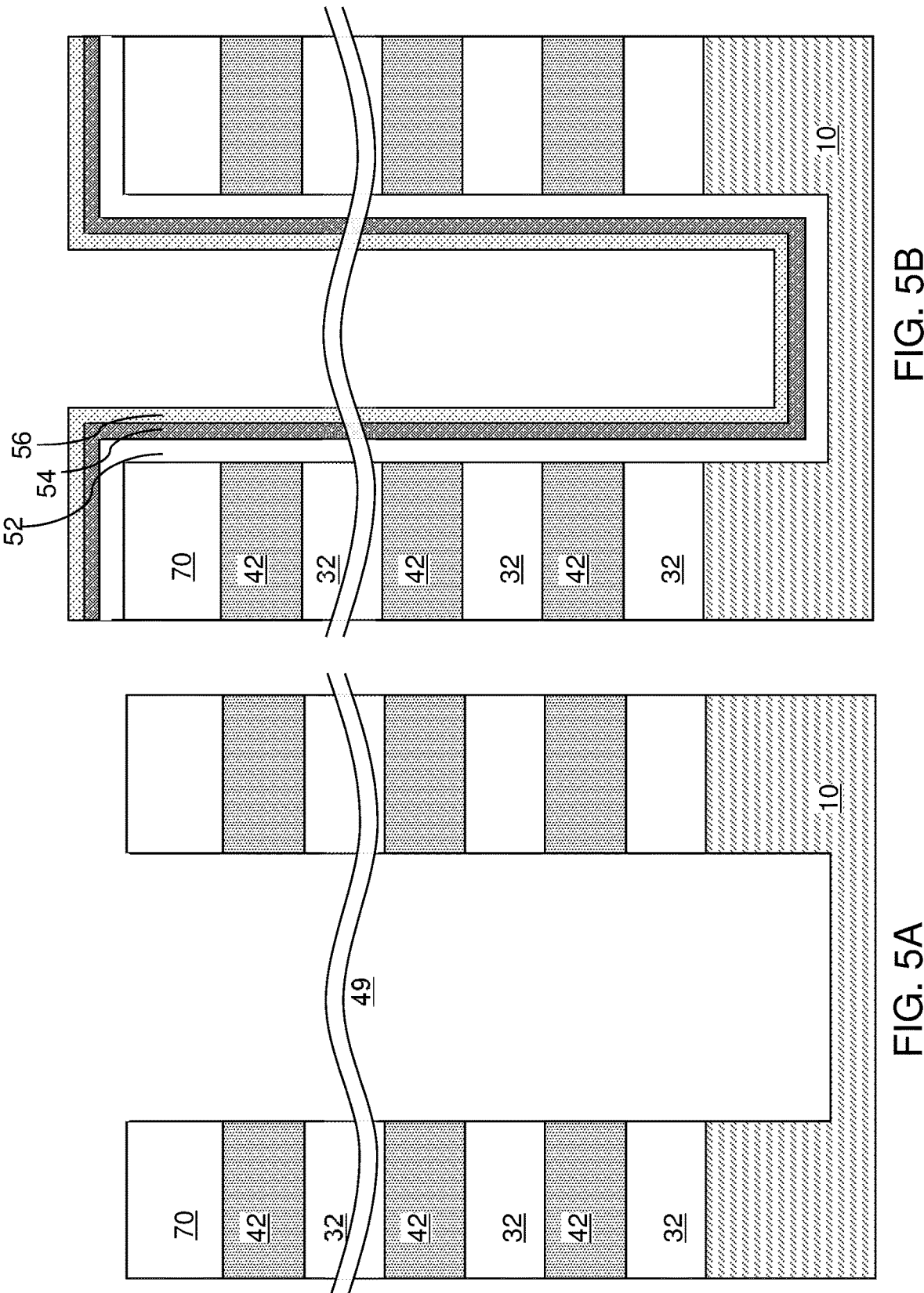
FIGS. 5A-5E are sequential schematic vertical cross-sectional views of a memory opening within the first exemplary structure during formation of a first exemplary memory opening fill structure therein according to the first embodiment of the present disclosure.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the stepped dielectric material portion 65, a subset of layers in the alternating stack (32, 42), and into the upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 5B, a stack of layers including a blocking dielectric layer 52, a charge storage layer 54, and a tunneling dielectric layer 56 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

Figures 5C, 5D:
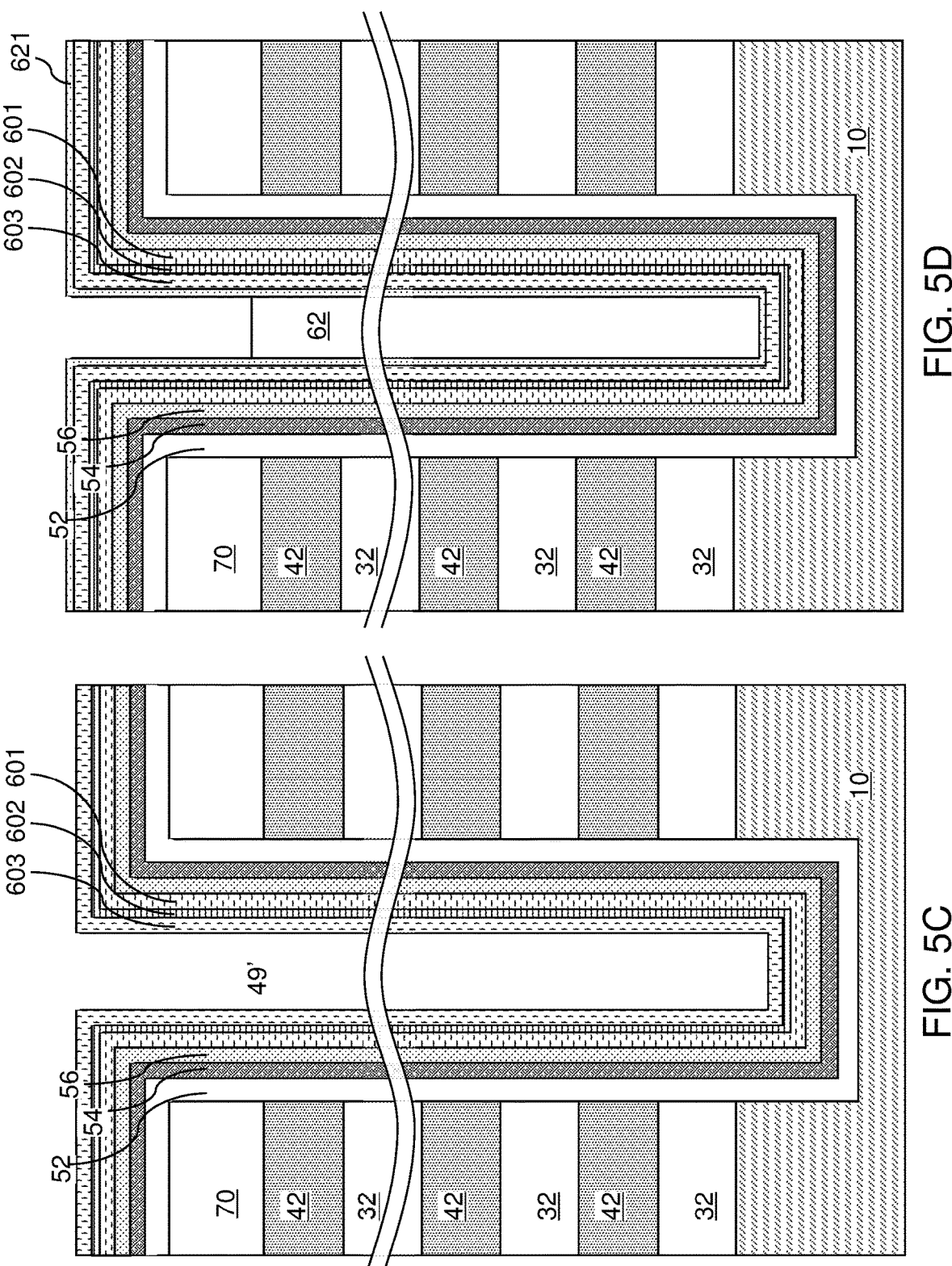

Referring to FIG. 5C and according to an aspect of the present disclosure, a first metal oxide semiconductor layer 601 can be deposited on the physically exposed surfaces of the tunneling dielectric layer 56. In one embodiment, the first metal oxide semiconductor layer 601 comprises an indium tin zinc oxide ("ITZO") layer 601. The indium tin zinc oxide layer 601 may be stoichiometric or non-stoichiometric. Optionally, the indium tin zinc oxide layer 601 may be doped with at least one dopant species such that a total atomic concentration of the at least one dopant species is not greater than 1.0% and/or 0.5% and/or 0.2% and/or 0.1%. In an illustrative example, the indium tin zinc oxide layer 601 may have a composition of $In_\alpha Sn_\beta Zn_\gamma O_\delta$, in which $\alpha$ is in a range from 0.5 to 1.5, $\beta$ is in a range from 0.5 to 1.5, and $\gamma$ is in a range from 0.5 to 1.5, and $\delta$ is in a range from 3.5 to 5.5. In one embodiment, $\alpha$ is in a range from 0.75 to 1.25, $\beta$ is in a range from 0.75 to 1.25, and $\gamma$ is in a range from 0.75 to 1.25, and $\delta$ is in a range from 4.0 to 5.0. In an illustrative example, $\alpha$ may be about 1, $\beta$ may be about 1, and $\gamma$ may be about 1.

The indium tin zinc oxide layer 601 may be formed by radio frequency (RF) physical vapor deposition (PVD) (i.e., RF sputtering) and/or by direct current (DC) physical vapor deposition (PVD) (i.e., DC sputtering) employing a sintered target including indium, tin, zinc, and optionally oxygen. The atomic ratio of indium, tin, and zinc in the sintered target may be the same as the atomic ratio of indium, tin, and zinc in the indium tin zinc oxide layer 601. In an illustrative example, the atomic ratio of indium, tin, and zinc in the sintered target may be about 1:1:1. The target may contain oxygen or may lack oxygen. If the target contains insufficient oxygen or no oxygen, then the sputtering process may comprise a reactive sputtering process in an oxygen containing ambient. The deposition temperature during the RFPVD process and/or the DCPVD process may be in a range from 250 degrees Celsius to 350 degrees Celsius. The plasma power may be in a range from 150 watts to 250 watts, although lesser and greater plasma powers may be employed depending on the size of the substrate. The deposition pressure may be in a range from 0.2 Pa to 0.6 Pa, although lesser and greater deposition pressures may also be employed. The composition of the gas ambient during deposition may be, for example, 50% argon and 50% oxygen, for reactive sputtering. In one embodiment, DC sputtering and RF sputtering may be alternately performed in a same process chamber by switching the plasma power sources. The RF frequency may be, for example, 13.56 MHz. While composite metal containing targets (e.g., In—Sn—Zn or In—Sn—Zn—)) targets are described above, plural separate targets containing one or two of the above metals may be used, such as a combination of In—Sn—O target and a ZnO target for example.

Generally, any alternative deposition process may be employed in lieu of the RFPVD and/or DCPVD processes to form the indium tin zinc oxide layer 601. For example, chemical vapor deposition (CVD), atomic layer deposition (ALD), and/or pulsed laser deposition (PLD) may be employed in lieu of, and/or in combination with, the RFPVD process and/or the DCPVD process. The thickness of the indium tin zinc oxide layer 601 may be in a range from 1 nm to 4 nm, such as from 1.5 nm to 3 nm, although lesser and greater thicknesses may also be employed. The indium tin zinc oxide layer 601 may be conformal or non-conformal.

A second metal oxide semiconductor layer 602 can be optionally deposited on the indium tin zinc oxide layer 601. The second metal oxide semiconductor layer 602 may comprise an indium gallium tin zinc oxide (IGTZO) layer. The indium gallium tin zinc oxide layer 602 may be stoichiometric or non-stoichiometric. Optionally, the indium gallium tin zinc oxide layer 602 may be doped with at least one dopant species such that a total atomic concentration of the at least one dopant species is not greater than 1.0% and/or 0.5% and/or 0.2% and/or 0.1%. In an illustrative example, the indium gallium tin zinc oxide layer 602 may have a composition of $In_\alpha Sn_{\beta\eta} Ga_{\beta(1-\eta)} Zn_\gamma O_\delta$, in which $\alpha$ is in a range from 0.5 to 1.5, $\beta$ is in a range from 0.5 to 1.5, and $\gamma$ is in a range from 0.5 to 1.5, and $\delta$ is in a range from 3.5 to 5.5. The value of $\eta$ may continuously decrease within a distance from the indium tin zinc oxide layer 601. In an illustrative example, the value of $\eta$ may continuously decrease from 1 to 0 with an increase in the distance from the indium tin zinc oxide layer 601. In one embodiment, $\alpha$ is in a range from 0.75 to 1.25, $\beta$ is in a range from 0.75 to 1.25, and $\gamma$ is in a range from 0.75 to 1.25, and $\delta$ is in a range from 4 to 5. In an illustrative example, a may be about 1, $\beta$ may be about 1, and $\gamma$ may be about 1.

The indium gallium tin zinc oxide layer 602 may be formed by radio frequency (RF) physical vapor deposition (PVD) and/or by direct current (DC) physical vapor deposition (PVD) employing a dual target system that employs a first sintered target including indium, tin, zinc, and optionally oxygen and a second sintered target including indium, gallium, zinc, and optionally oxygen. In this case, the sputtering rate from the first target may continuously decrease, and the sputtering rate from the second target may continuously increase during the deposition process or the substrate may be moved laterally in a direction from the first target to the second target in the sputtering chamber. The atomic ratio of indium, tin, and zinc in the first sintered target may be the same as the atomic ratio of indium, tin, and zinc in the indium tin zinc oxide layer 601. The atomic ratio of indium, gallium, and zinc in the second sintered target may be the same as the atomic ratio of indium, gallium, and zinc in a tin-free surface layer of the indium gallium tin zinc oxide layer 602, which may be the last monolayer to be deposited. In an illustrative example, the atomic ratio of indium, tin, and zinc in the first sintered target may be about 1:1:1. The atomic ratio of indium, gallium, and zinc in the second sintered target may be about 1:1:1. Other target compositions including one or two metals may also be used as described above. The deposition temperature during the RFPVD process and/or the DCPVD process may be in a range from 250 degrees Celsius to 350 degrees Celsius. The plasma power may be in a range from 150 watts to 250 watts, although lesser and greater plasma powers may be employed depending on the size of the substrate. The deposition pressure may be in a range from 0.2 Pa to 0.6 Pa, although lesser and greater deposition pressures may also be employed. As described above, the sputtering may be reactive sputtering in an oxygen ambient or non-reactive sputtering without an oxygen ambient if sufficient oxygen is provided in the targets. The composition of the gas ambient during deposition may be, for example, 50% argon and 50% oxygen. In one embodiment, DC sputtering and RF sputtering may be alternately performed in a same process chamber by switching the plasma power sources. The RF frequency may be, for example, 13.56 MHz.

Generally, any alternative deposition process may be employed in lieu of the RFPVD and/or DCPVD processes to form the indium gallium tin zinc oxide layer 602. For example, chemical vapor deposition (CVD), atomic layer deposition (ALD), and/or pulsed laser deposition (PLD) may be employed in lieu of, and/or in combination with, the RFPVD process and/or the DCPVD process. In one embodiment, the indium gallium tin zinc oxide layer 602 may be formed by atomic layer deposition with a modulation in the ratio of tin to gallium in the reactant gas stream during the deposition process. In other words, the material composition of the indium gallium tin zinc oxide layer 602 may be modulated by decreasing Sn content and increasing Ga content over the deposition cycles. The thickness of the indium gallium tin zinc oxide layer 602 may be in a range from 1 nm to 3 nm, such as from 1.5 nm to 2.5 nm, although lesser and greater thicknesses may also be employed. The indium gallium tin zinc oxide layer 602 may be conformal or non-conformal. In an alternative embodiment, indium gallium tin zinc oxide layer 602 may be omitted.

A third metal oxide semiconductor layer 603 can be deposited on the surface of the second metal oxide semiconductor layer 602 (if present) or the first metal oxide semiconductor layer 601 if layer 602 is omitted. The third metal oxide semiconductor layer 603 may comprise an indium gallium zinc oxide (IGZO) layer 603. The indium gallium zinc oxide layer 603 may be stoichiometric or non-stoichiometric. Optionally, the indium gallium zinc oxide layer 603 may be doped with at least one dopant species such that a total atomic concentration of the at least one dopant species is not greater than 1.0% and/or 0.5% and/or 0.2% and/or 0.1%. In an illustrative example, the indium gallium zinc oxide layer 603 may have a composition of $In_\alpha Ga_\beta Zn_\gamma O_\delta$, in which $\alpha$ is in a range from 0.5 to 1.5, $\beta$ is in a range from 0.5 to 1.5, and $\gamma$ is in a range from 0.5 to 1.5, and $\delta$ is in a range from 3.5 to 5.5. In one embodiment, $\alpha$ is in a range from 0.75 to 1.25, $\beta$ is in a range from 0.75 to 1.25, and $\gamma$ is in a range from 0.75 to 1.25, and $\delta$ is in a range from 4.0 to 5.0. In an illustrative example, $\alpha$ may be about 1, $\beta$ may be about 1, and $\gamma$ may be about 1.

The indium gallium zinc oxide layer 603 may be formed by radio frequency (RF) physical vapor deposition (PVD) and/or by direct current (DC) physical vapor deposition (PVD) employing a sintered target including indium, gallium, zinc, and optionally oxygen. The atomic ratio of indium, gallium, and zinc in the sintered target may be the same as the atomic ratio of indium, gallium, and zinc in the indium gallium zinc oxide layer 603. In an illustrative example, the atomic ratio of indium, gallium, and zinc in the sintered target may be about 1:1:1. Other target compositions including one or two metals may also be used as described above. The deposition temperature during the RFPVD process and/or the DCPVD process may be in a range from 250 degrees Celsius to 350 degrees Celsius. The plasma power may be in a range from 150 watts to 250 watts, although lesser and greater plasma powers may be employed depending on the size of the substrate. The deposition pressure may be in a range from 0.2 Pa to 0.6 Pa, although lesser and greater deposition pressures may also be employed. As described above, the sputtering may be reactive sputtering in an oxygen ambient or non-reactive sputtering without an oxygen ambient if sufficient oxygen is provided in the targets. The composition of the gas ambient during deposition may be, for example, 50% argon and 50% oxygen. In one embodiment, DC sputtering and RF sputtering may be alternately performed in a same process chamber by switching the plasma power sources. The RF frequency may be, for example, 13.56 MHz.

Generally, any alternative deposition process may be employed in lieu of the RFPVD and/or DCPVD processes to form the indium gallium zinc oxide layer 603. For example, chemical vapor deposition (CVD), atomic layer deposition (ALD), and/or pulsed laser deposition (PLD) may be employed in lieu of, and/or in combination with, the RFPVD process and/or the DCPVD process. The thickness of the indium gallium zinc oxide layer 603 may be in a range from 3 nm to 10 nm, such as from 4 nm to 9 nm and/or from 5 nm to 8 nm, although lesser and greater thicknesses may also be employed. The indium gallium zinc oxide layer 603 may be conformal or non-conformal. A memory cavity 49' may be present within each memory opening 49. The memory cavity 49' is an unfilled volume, i.e., a void, within respective memory opening 49.

Referring to FIG. 5D, an optional interfacial dielectric liner 621 may be optionally formed on the indium gallium zinc oxide layer 603. The interfacial dielectric liner 621 includes a dielectric material that can improve charge carrier mobility within the indium gallium zinc oxide layer 603 by reducing the density of surface defects in the indium gallium zinc oxide layer 603. For example, the interfacial dielectric liner 621 may include a dielectric metal oxide, such as aluminum oxide. The thickness of the interfacial dielectric liner 621 may be in a range from 2 nm to 4 nm, although lesser and greater thicknesses may also be employed.

A dielectric core layer can be deposited in the memory cavity 49'. The dielectric core layer includes a dielectric material, such as silicon oxide or organosilicate glass. The dielectric core layer can be deposited by a conformal deposition method such as low pressure chemical vapor deposition (LPCVD), or by a self-planarizing deposition process such as spin coating. Subsequently, the dielectric core layer can be recessed selective to the material of the indium gallium zinc oxide layer 603, for example, by a recess etch. The material of the dielectric core layer can be vertically recessed below the horizontal plane including the top surface of the insulating cap layer 70. Each remaining portion of the dielectric core layer constitutes a dielectric core 62.

Figure 5E:
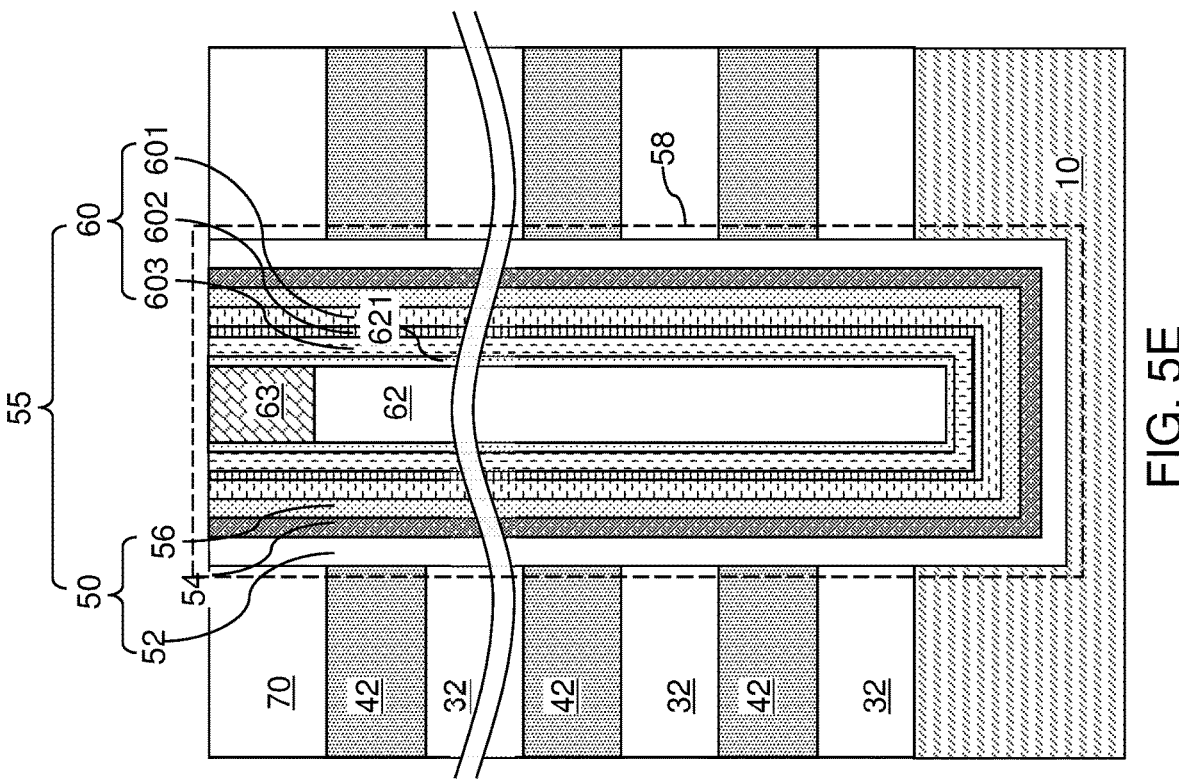

Referring to FIG. 5E, a doped semiconductor material can be deposited within each recessed region above the dielectric cores 62. In one embodiment, the indium tin zinc oxide layer 601, the indium gallium tin zinc oxide layer 602, and the indium gallium zinc oxide layer 603 may have a doping of a first conductivity type (such as p-type or n-type), and the deposited doped semiconductor material may have a doping of a second conductivity type that is the opposite of the first conductivity type. For example, if the first conductivity type is p-type, the second conductivity type is n-type, and vice versa. In one embodiment, the doped semiconductor material may be deposited as an amorphous semiconductor material or as a polycrystalline semiconductor material. The doped semiconductor material may include at least one elemental semiconductor material (such as silicon and/or germanium), or may comprise a compound semiconductor material (such as indium arsenide or indium antimonide), or may comprise a heavily doped metal oxide semiconductor material that is conductive, i.e. having electrical conductivity greater than $1.0 \times 10^5$ S/cm. The dopant concentration in the doped semiconductor material having a doping of the second conductivity type can be in a range from $5.0 \times 10^{18}/$ $cm^3$ to $2.0 \times 10^{21}/cm^3$, although lesser and greater dopant concentrations can also be used.

A planarization process can be performed to remove portions of the doped semiconductor material having a doping of the second conductivity type, the indium tin zinc oxide layer 601, the indium gallium tin zinc oxide layer 602, the indium gallium zinc oxide layer 603, the tunneling dielectric layer 56, the charge storage layer 54, and the blocking dielectric layer 52 from above the horizontal plane including the top surface of the insulating cap layer 70, for example, by chemical mechanical planarization (CMP) or a recess etch. Each remaining portion of the semiconductor material having a doping of the second conductivity type constitutes a drain region 63.

Each of the indium tin zinc oxide layer 601, the optional indium gallium tin zinc oxide layer 602, the indium gallium zinc oxide layer 603, the tunneling dielectric layer 56, the charge storage layer 54, and the blocking dielectric layer 52 is divided into a respective set of discrete layers located within a respective one of the memory openings 49 or within a respective one of the support openings 19. Specifically, the indium tin zinc oxide layer 601 as provided at the processing steps of FIG. 5D is divided into a plurality of indium tin zinc oxide layers 601. The indium gallium tin zinc oxide layer 602 (if present) as provided at the processing steps of FIG. 5D is divided into a plurality of indium gallium tin zinc oxide layers 602. The indium gallium zinc oxide layer 603 as provided at the processing steps of FIG. 5D is divided into a plurality of indium gallium zinc oxide layers 603. The tunneling dielectric layer 56 as provided at the processing steps of FIG. 5D is divided into a plurality of tunneling dielectric layers 56. The charge storage layer 54 as provided at the processing steps of FIG. 5D is divided into a plurality of charge storage layers 54. The blocking dielectric layer 52 as provided at the processing steps of FIG. 5D is divided into a plurality of blocking dielectric layers 52. The interfacial dielectric liner 621 as provided at the processing steps of FIG. 5D is divided into a plurality of interfacial dielectric liners 621.

Each contiguous combination of an indium tin zinc oxide layer 601, an indium gallium tin zinc oxide layer 602 (if present), and an indium gallium zinc oxide layer 603 located within a respective memory opening 49 constitutes a vertical channel 60. Electrical current can flow through each vertical channel 60 when a vertical NAND device including the vertical channel 60 is turned on. Each contiguous combination of a blocking dielectric layer 52, a charge storage layer 54, and a tunneling dielectric layer 56 located within a respective memory opening constitutes a memory film 50, which can store electrical charges with a macroscopic retention time. As used herein, a macroscopic retention time refers to a retention time suitable for operation of a memory device as a permanent memory device such as a retention time in excess of 24 hours.

Generally, the memory film 50 includes a vertical stack of memory elements that can store information at levels of the sacrificial material layers 42. For example, the vertical stack of memory elements may comprise portions of a charge storage layer 54 located at the levels of the sacrificial material layers 42. In one embodiment, the tunneling dielectric layer 56 laterally surrounds the vertical channel 60, the vertical stack of memory elements (which may comprise portions of the charge storage layer 54) laterally surrounds the tunneling dielectric layer 56, and the blocking dielectric layer 52 laterally surrounds the vertical stack of memory elements. In some embodiments, a blocking dielectric layer 52 may not be present in the memory film 50 at this step, and a blocking dielectric layer may be subsequently formed after formation of backside recesses. Each combination of a memory film 50 and a vertical channel 60 constitutes a memory stack structure 55. The set of all material portions located within a memory opening 49 constitutes a memory opening fill structure 58. The set of all material portions located within a support opening 19 constitutes a support pillar structure.

An anneal process can be performed to crystallize the semiconducting materials of the indium tin zinc oxide layer 601, the indium gallium tin zinc oxide layer 602, and the indium gallium zinc oxide layer 603 within each vertical channel 60, and optionally to crystallize the semiconductor material of the drain region 63 in case the drain region includes an amorphous semiconductor material. The anneal process may be performed, for example, at an elevated temperature in a range from 600 degrees Celsius to 700 degrees Celsius, such as from 620 degrees Celsius to 650 degrees Celsius, although higher and lower temperatures may also be employed. The duration of the anneal process may be, for example, in a range from 10 minutes to 120 minutes, such as from 20 minutes to 60 minutes, although a shorter or longer duration may also be employed.

Crystalline (e.g., polycrystalline) indium tin zinc oxide material in the indium tin zinc oxide layer 601 has a band gap of about 3.40 eV. Crystalline indium gallium zinc oxide material in the indium gallium zinc oxide layer 603 has a band gap of about 3.81 eV. The material composition of the crystalline indium gallium tin zinc oxide material in the indium gallium tin zinc oxide layer 602 (if present) is graded, and the band gap of the indium gallium tin zinc oxide layer 602 gradually increases from 3.40 eV to 3.81 eV from the interface with the indium tin zinc oxide layer 601 to the interface with the indium gallium zinc oxide layer 603.

In one embodiment, the indium tin zinc oxide layer 601, the indium gallium tin zinc oxide layer 602, and the indium gallium zinc oxide layer 603 within each vertical channel 60 may be n-doped. In this case, the donor atomic concentration in the indium tin zinc oxide layer 601 may be in a range from $1 \times 10^{18}/cm^3$ to $1 \times 10^{19}/cm^3$, such as from $3 \times 10^{18}/cm^3$ to $5 \times 10^{18}/cm^3$, although lesser and greater donor atomic concentrations may also be employed. The donor atomic concentration in the indium gallium zinc oxide layer 603 may be in a range from $1 \times 10^{16}/cm^3$ to $1 \times 10^{18}/cm^3$, such as from $3 \times 10^{16}/cm^3$ to $3 \times 10^{17}/cm^3$, although lesser and greater donor atomic concentrations may also be employed. The donor atomic concentration in the indium gallium tin zinc oxide layer 602 gradually changes from the level of the donor atomic concentration in the indium tin zinc oxide layer 601 to the level of the donor atomic concentration in the indium gallium tin zinc oxide layer 602 with a distance from the indium tin zinc oxide layer 601.

The non-uniform donor atomic concentration profile within the vertical channel 60 can provide a higher on-current while suppressing leakage current, thereby providing overall enhanced channel characteristics for the vertical channel 60. Specifically, the layer stack including the indium tin zinc oxide layer 601, the optional indium gallium tin zinc oxide layer 602, and the indium gallium zinc oxide layer 603 can provide a higher charge carrier mobility, a lower sub-threshold slope (SS), and as a consequence, a higher on-off current ratio than a semiconducting channel including a single semiconducting metal oxide material, such as indium gallium zinc oxide. The conduction band off-set between indium tin zinc oxide and indium gallium zinc oxide contributes to better electron confinement, and higher mobility for the vertical channel. For example, composite channel mobility of the vertical channel 60 of an embodiment of the present disclosure may be in a range from 20 cm²/Vs to 40 cm²/Vs, which is about 5 to 10 times higher than the channel mobility of a channel consisting of indium gallium zinc oxide alone.

Figures 6A, 6B:
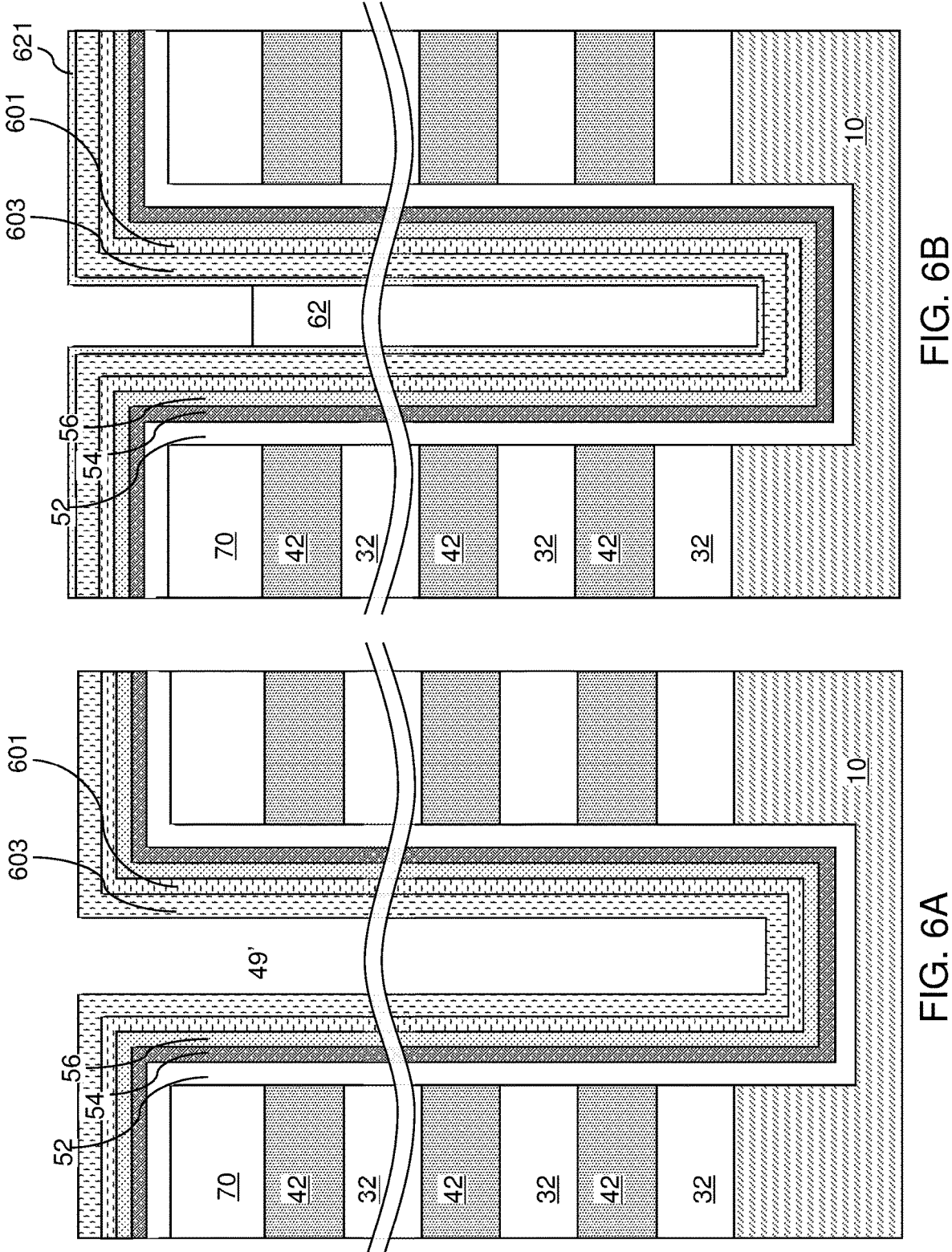
FIGS. 6A-6C are sequential schematic vertical cross-sectional views of a memory opening within the first exemplary structure during formation of a second exemplary memory opening fill structure therein according to the first embodiment of the present disclosure.
Figure 6C:
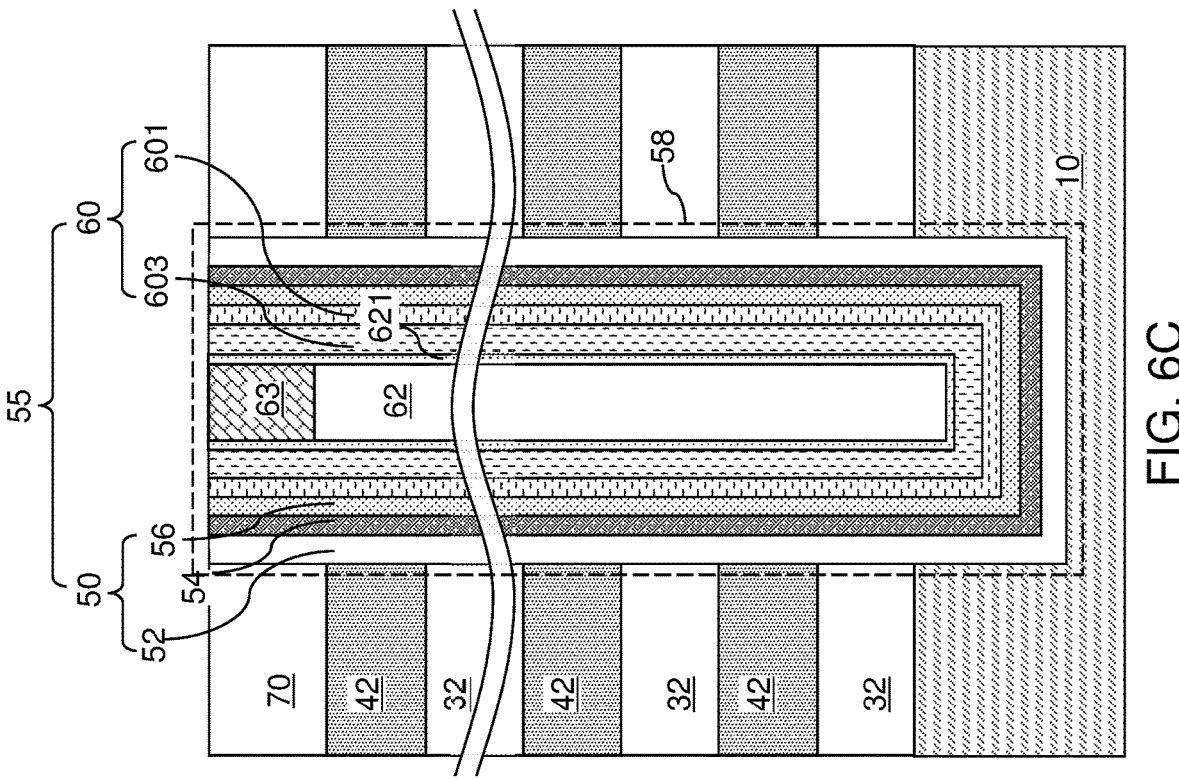

FIGS. 6A-6C are sequential schematic vertical cross-sectional views of a memory opening 49 within the first exemplary structure during formation of a second exemplary memory opening fill structure 58 therein according to the first embodiment of the present disclosure. Generally, the second exemplary memory opening fill structure 58 can be derived from the first exemplary memory opening fill structure 58 illustrated in FIG. 5E by omitting formation of the optional indium gallium tin zinc oxide layer 602.

Referring to FIG. 6A, an alternative configuration of the first exemplary structure can be derived from the configuration of the first exemplary structure illustrated in FIG. 5C by omitting formation of the optional indium gallium tin zinc oxide layer 602. In this case, the indium gallium zinc oxide layer 603 can be formed directly on the indium tin zinc oxide layer 601.

Referring to FIG. 6B, the processing steps of FIG. 5D can be performed to optionally form the interfacial dielectric liner 621, and to form the dielectric core 62 within each memory opening 49.

Referring to FIG. 6C, the processing steps of FIG. 5E can be performed to form a memory opening fill structure 58 in each memory opening 49.

Figure 7:
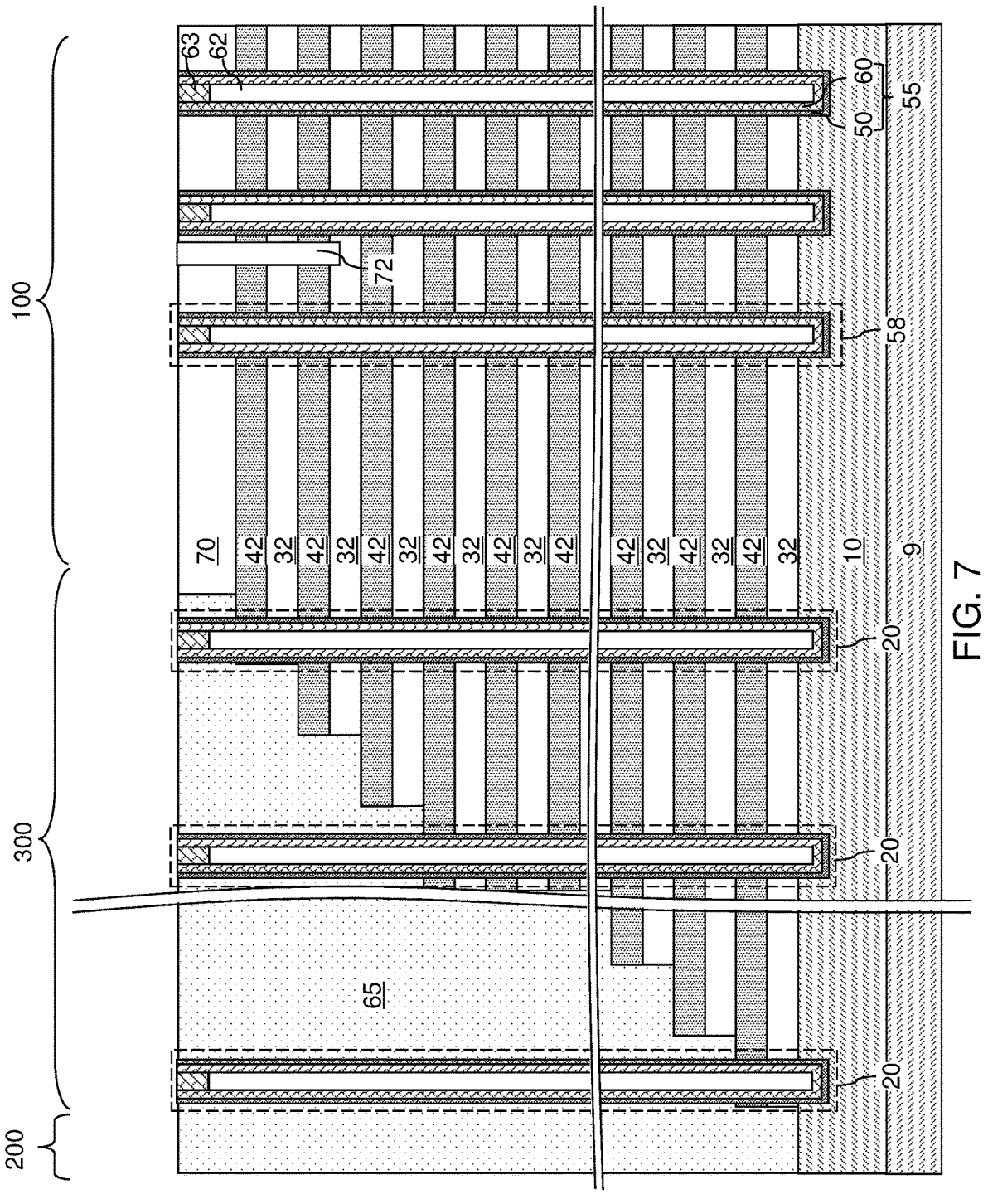
FIG. 7 is a schematic vertical cross-sectional view of the first exemplary structure after formation of memory opening fill structures and support pillar structures according to the first embodiment of the present disclosure.

Referring to FIG. 7, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. The support pillar structures 20 are formed through a region of the alternating stack (32, 42) that underlie the stepped surfaces and a region of the stepped dielectric material portion 65 that overlie the stepped surfaces. Each of the support pillar structures 20 comprises a semiconductor material portion (i.e., a vertical channel 60 of the support pillar structure 20) having a same composition as the vertical channels 60 of the memory opening fill structures 58, and a dielectric layer stack (i.e., a memory film 50 of a support pillar structure 20) containing a same set of dielectric material layers as each of the memory films 50 of the memory opening fill structures 58. While the present disclosure is described using the illustrated configuration for the memory stack structure, the methods of the present disclosure can be applied to alternative memory stack structures including different layer stacks or structures for the memory film 50.

Referring collectively to FIGS. 5E, 6C, and 7, a memory opening fill structure 58 is located in each memory opening 49. The memory opening fill structure 58 comprises a memory film 50 and a vertical composite metal oxide semiconductor channel 60 comprising a different composition between its inner and outer portions. In one embodiment, the vertical composite metal oxide semiconductor channel 60 comprises an indium tin zinc oxide layer 601 in the outer portion, and an indium gallium zinc oxide layer 603 in the inner portion. In one embodiment, the composite metal oxide semiconductor channel 60 comprises the indium tin zinc oxide layer 601, the optional indium tin gallium zinc oxide layer 602, and the indium gallium zinc oxide layer 603. In one embodiment, the memory film 50, the indium tin zinc oxide layer 601, the optional indium tin gallium zinc oxide layer, and the indium gallium zinc oxide layer 603 may vertically extend through each sacrificial material layer 42 within the alternating stack. In one embodiment, the atomic concentration of free charge carriers within the indium tin zinc oxide layer 601 is at least three times, and may be at least ten times, an atomic concentration of free charge carriers within the indium gallium zinc oxide layer 603. In one embodiment, the indium tin zinc oxide layer 601 is in direct contact with the memory film 50. In one embodiment, the indium gallium zinc oxide layer 603 is laterally spaced from the memory film 50 by the indium tin zinc oxide layer 601.

In one embodiment, the memory film 50 has a cylindrical inner sidewall that vertically extends through each of the electrically conductive layers 46 within the alternating stack (32, 46). In one embodiment, the indium tin zinc oxide layer 601 comprises a cylindrical outer sidewall that contacts the cylindrical inner sidewall of the memory film 50. In one embodiment, the memory opening fill structure 58 comprises: a vertical channel 60 that includes the indium tin zinc oxide layer 601 and the indium gallium zinc oxide layer 603; and a drain region 63 that is formed at an end of the vertical channel 60 that is distal from the substrate. In one embodiment, the memory film 50 comprises: a tunneling dielectric layer 56 in contact with the indium tin zinc oxide layer 601; a vertical stack of charge storage elements located at levels of the electrically conductive layers 46 (as portions of the charge storage layer 54) and contacting the tunneling dielectric layer 56; and a blocking dielectric layer 52 interposed between the vertical stack of charge storage elements and the electrically conductive layers 46.

In one embodiment, a cylindrical outer sidewall of the indium gallium zinc oxide layer 603 contacts a cylindrical inner sidewall of the indium tin zinc oxide layer 601. Alternatively, the memory opening fill structure 58 comprises an indium gallium tin zinc oxide layer 602 that is interposed between the indium tin zinc oxide layer 601 and the indium gallium zinc oxide layer 603. In one embodiment, the indium gallium tin zinc oxide layer 602 has a radial compositional gradient such that: an atomic concentration of tin decreases with a lateral distance from the indium tin zinc oxide layer 601 within the indium gallium tin zinc oxide layer 602; and an atomic concentration of gallium decreases with a lateral distance from the indium gallium zinc oxide layer 603 within the indium gallium tin zinc oxide layer 602.

Figure 8A:
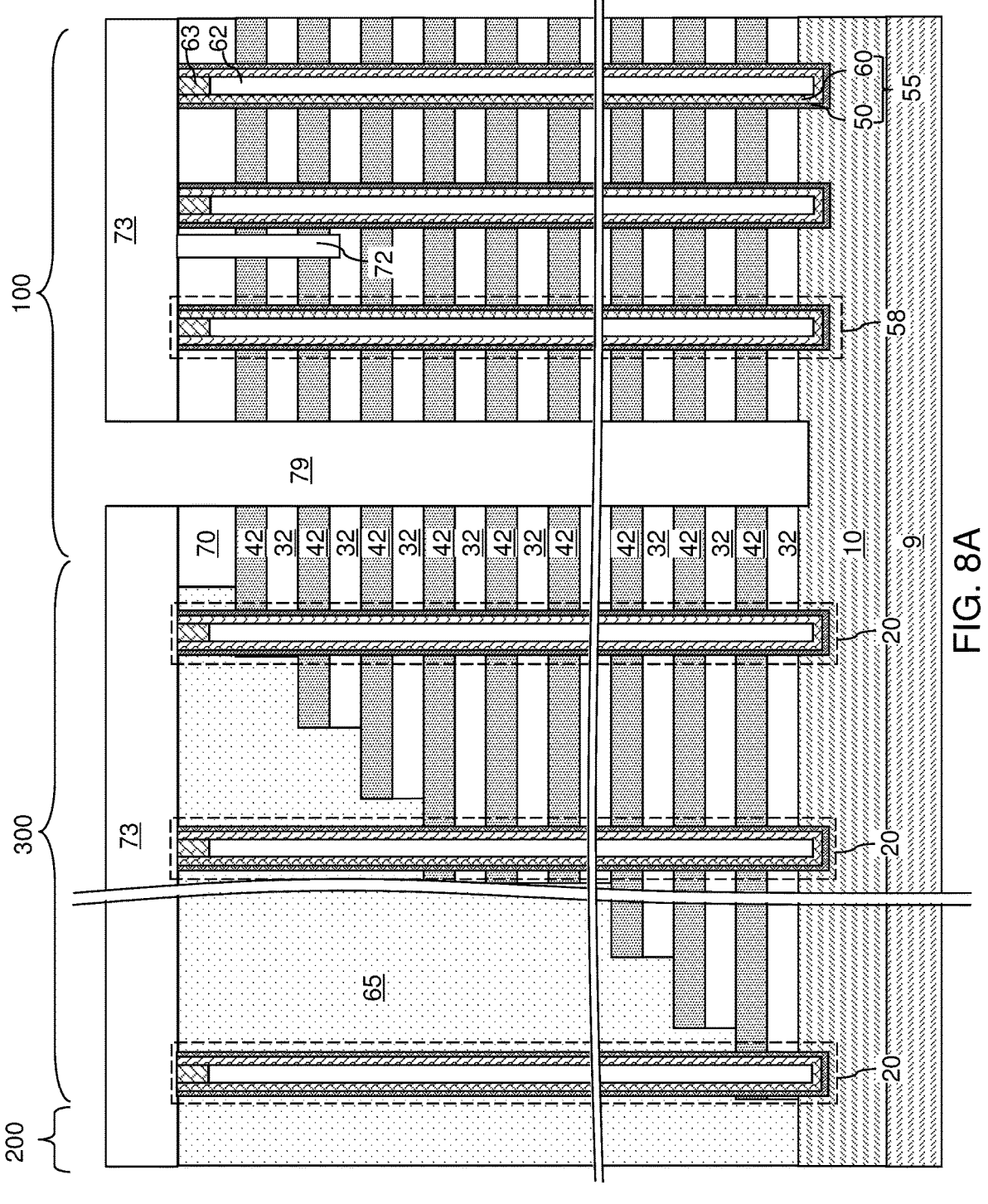
FIG. 8A is a schematic vertical cross-sectional view of the first exemplary structure after formation of a contact-level dielectric layer and backside trenches according to the first embodiment of the present disclosure.
Figure 8B:
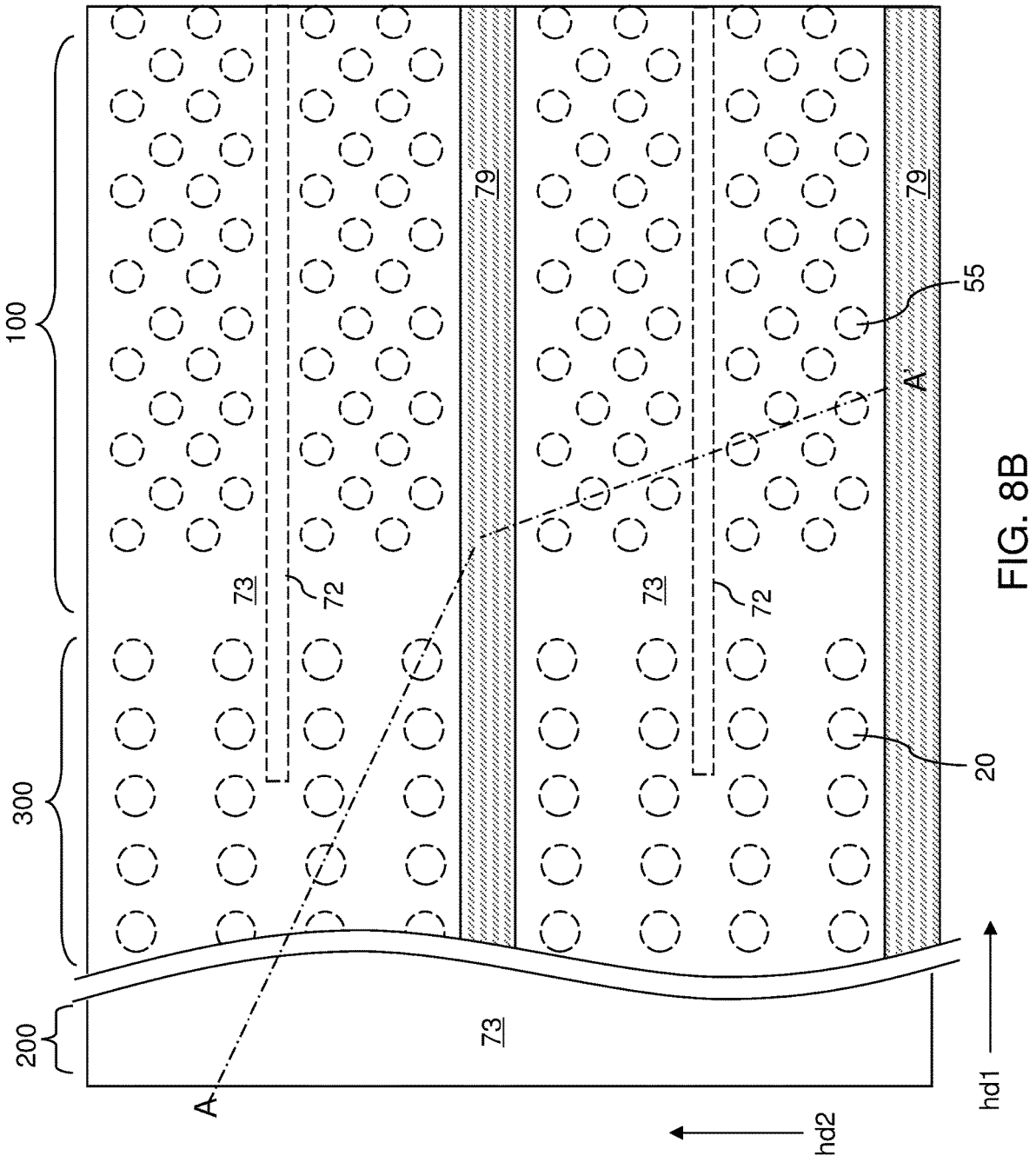
FIG. 8B is a partial see-through top-down view of the first exemplary structure of FIG. 8A. The vertical plane A-A' is the plane of the schematic vertical cross-sectional view of FIG. 8A.

Referring to FIGS. 8A and 8B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be used. A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the stepped dielectric material portion 65 using an anisotropic etch to form backside trenches 79, which vertically extend from the top surface of the contact level dielectric layer 73 at least to the top surface of the semiconductor material layer 10, and laterally extend through the memory array region 100 and the staircase region 300.

In one embodiment, the backside trenches 79 can laterally extend along a first horizontal direction hd1 and can be laterally spaced apart one from another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Figure 9:
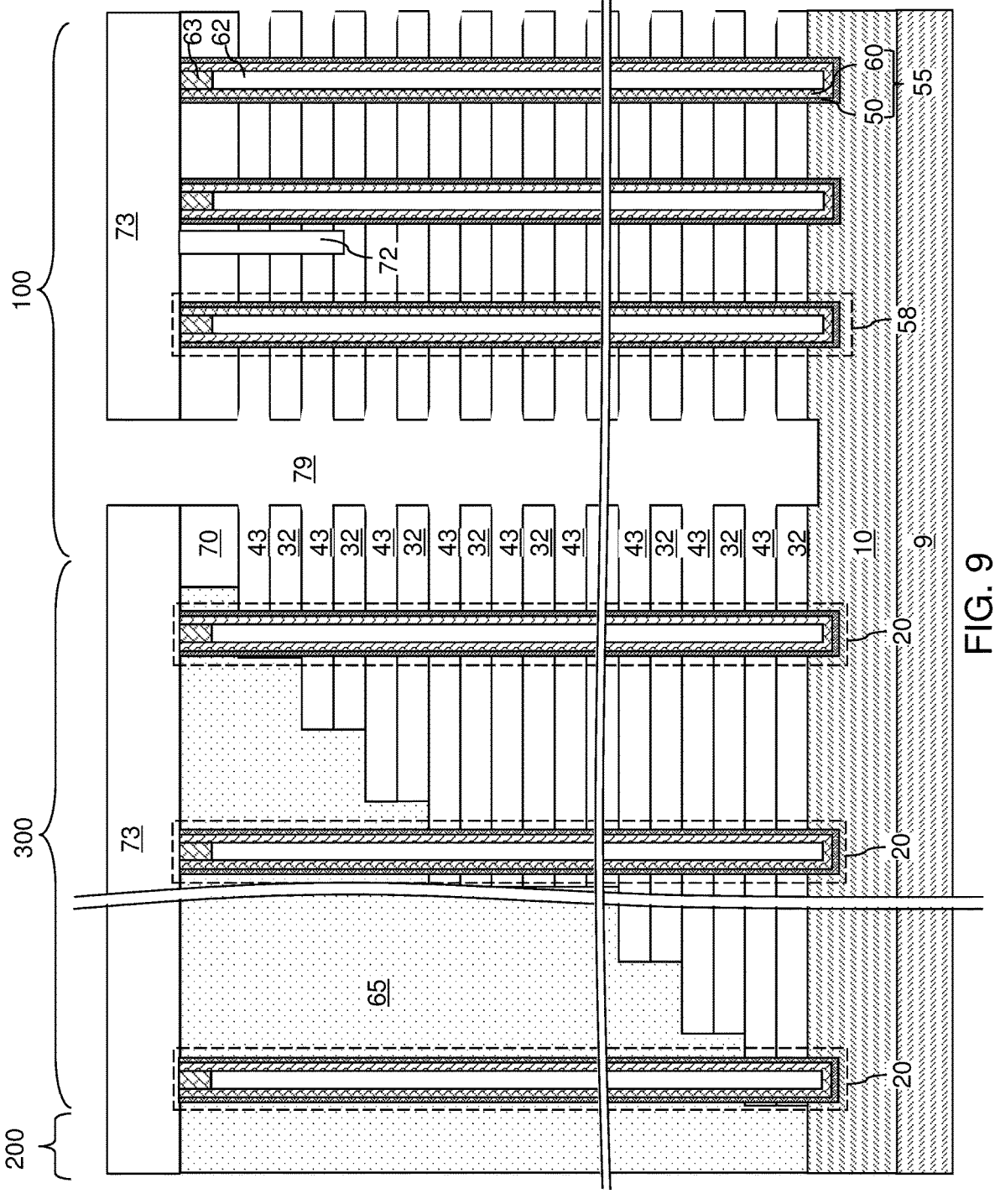
FIG. 9 is a schematic vertical cross-sectional view of the first exemplary structure after formation of backside recesses according to the first embodiment of the present disclosure.

Referring to FIG. 9, an etchant that selectively etches the second material of the sacrificial material layers 42 with respect to the first material of the insulating layers 32 can be introduced into the backside trenches 79, for example, using an etch process. Backside recesses 43 are formed in volumes from which the sacrificial material layers 42 are removed. The removal of the second material of the sacrificial material layers 42 can be selective to the first material of the insulating layers 32, the material of the stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the stepped dielectric material portion 65 can be selected from silicon oxide and dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials used in the art. The support pillar structure 20, the stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the semiconductor material layer 10. In this case, each backside recess 43 can define a space for receiving a respective word line of the array of three-dimensional NAND strings. Each of the plurality of backside recesses 43 can extend substantially parallel to the top surface of the semiconductor material layer 10. A backside recess 43 can be vertically bounded by a top surface of an underlying insulating layer 32 and a bottom surface of an overlying insulating layer 32. In one embodiment, each backside recess 43 can have a uniform height throughout.

Figure 10:
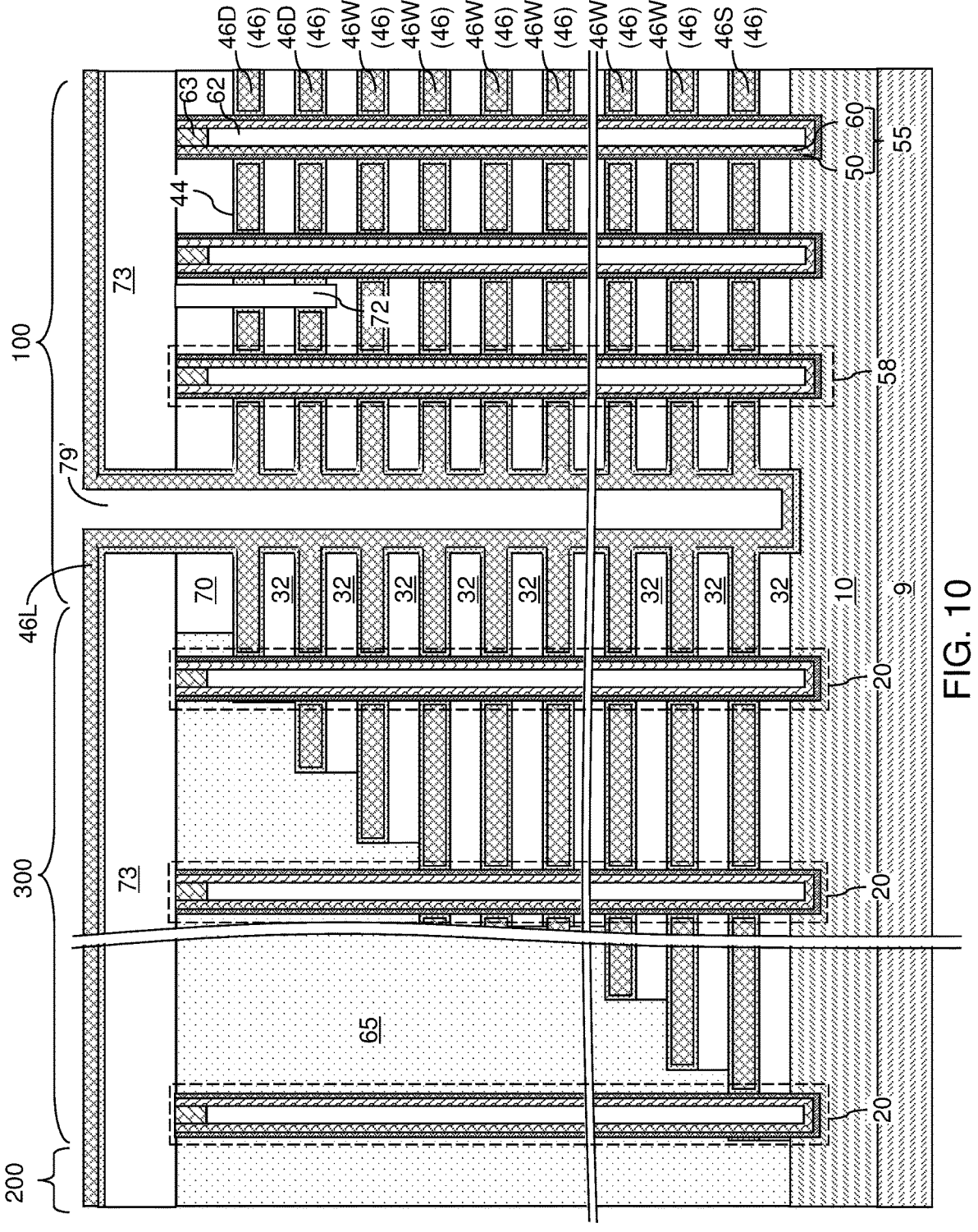
FIG. 10 is a schematic vertical cross-sectional view of the first exemplary structure after formation of electrically conductive layers according to the first embodiment of the present disclosure.

Referring to FIG. 10, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

At least one metallic material is deposited in the plurality of backside recesses 43, on the sidewalls of the at least one the backside trench 79, and over the top surface of the contact level dielectric layer 73. The at least one metallic material can include a conductive metal nitride material (such as TiN, TaN, or WN) and a metallic fill material (such as W, Co, Ru, Ti, and/or Ta). Each metallic material can be deposited by a conformal deposition method, which can be, for example, chemical vapor deposition (CVD), atomic layer deposition (ALD), electroless plating, electroplating, or a combination thereof.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous electrically conductive material layer 46L includes a continuous portion of the metallic barrier layer and a continuous portion of the metallic fill material layer that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L.

Figure 11A:
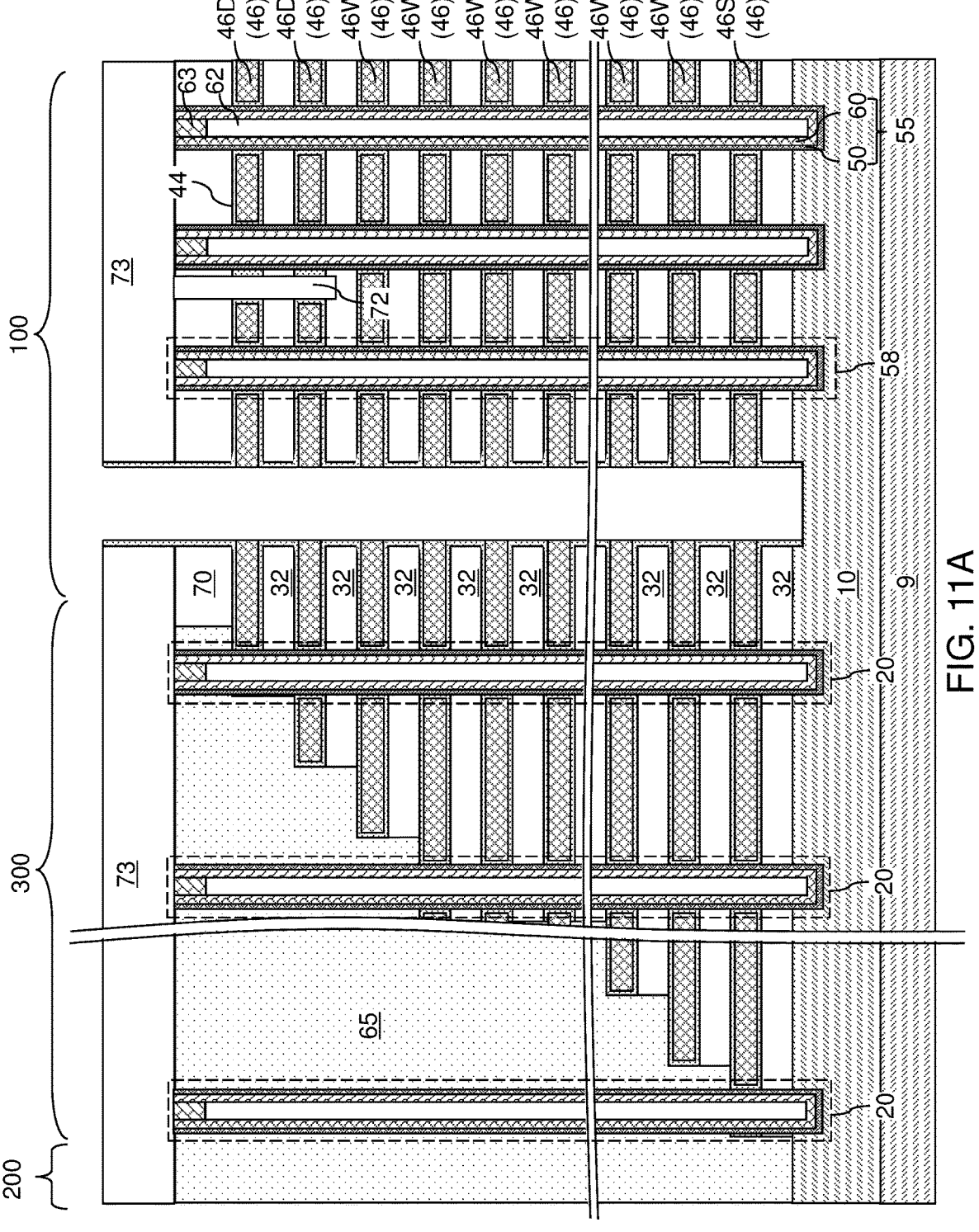
FIG. 11A is a schematic vertical cross-sectional view of the first exemplary structure after removal of a deposited conductive material from within the backside trench according to the first embodiment of the present disclosure.
Figure 11B:
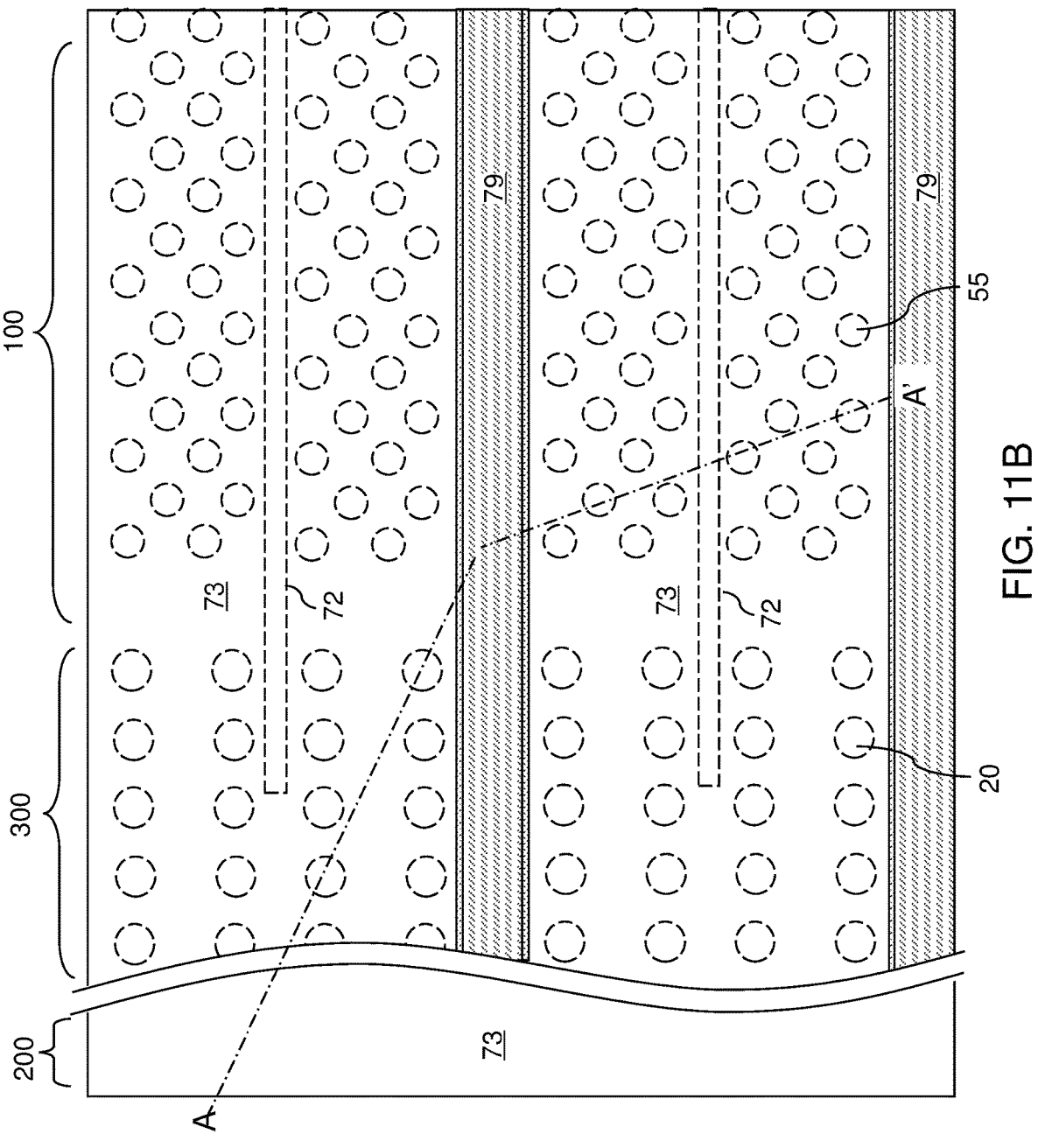
FIG. 11B is a partial see-through top-down view of the first exemplary structure of FIG. 11A. The vertical plane A-A' is the plane of the schematic vertical cross-sectional view of FIG. 11A.

Referring to FIGS. 11A and 11B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. A backside cavity 79' is present within each backside trench 79.

Figure 12A:
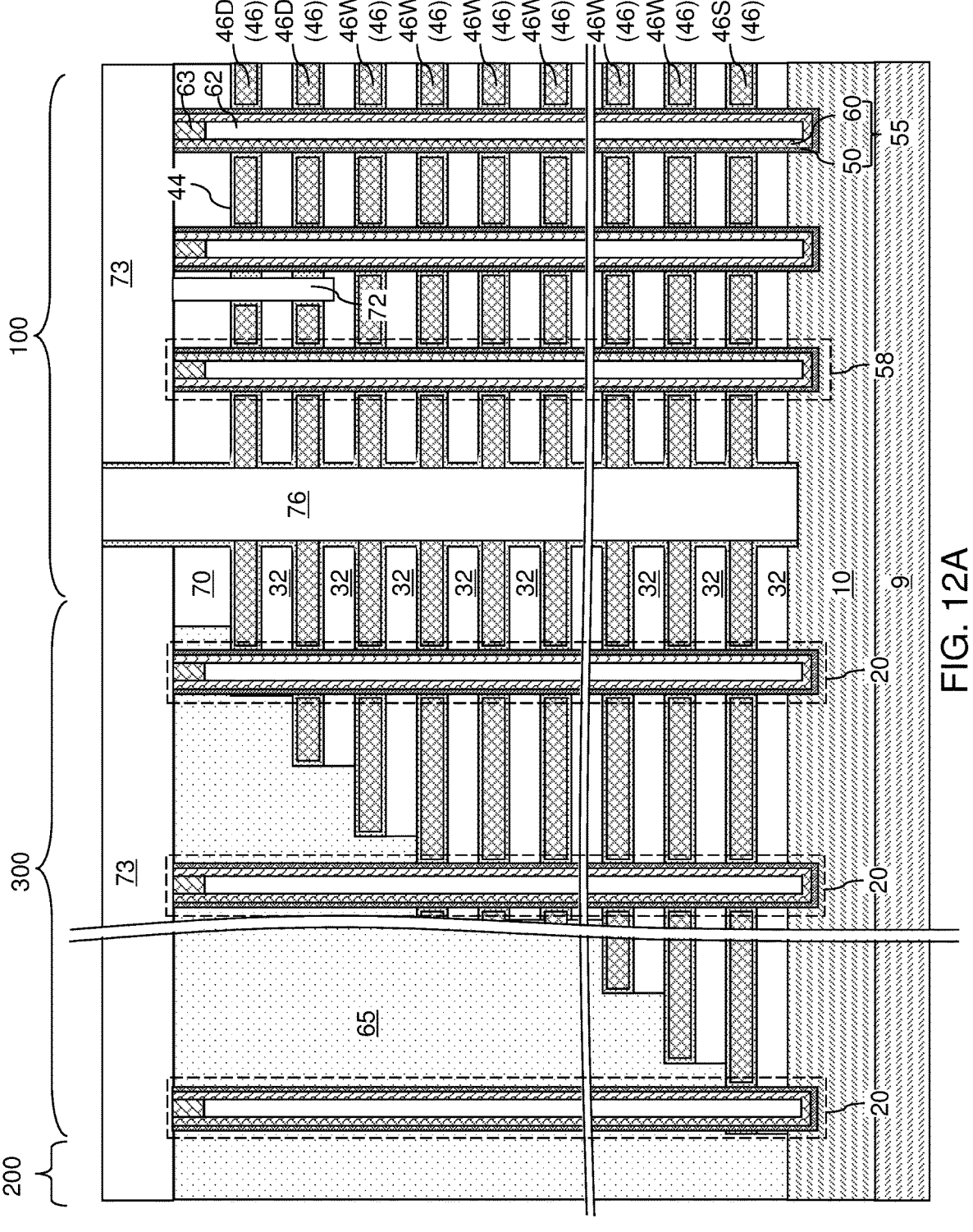
FIG. 12A is a schematic vertical cross-sectional view of the first exemplary structure after formation of backside trench fill structures according to the first embodiment of the present disclosure.
Figure 12B:
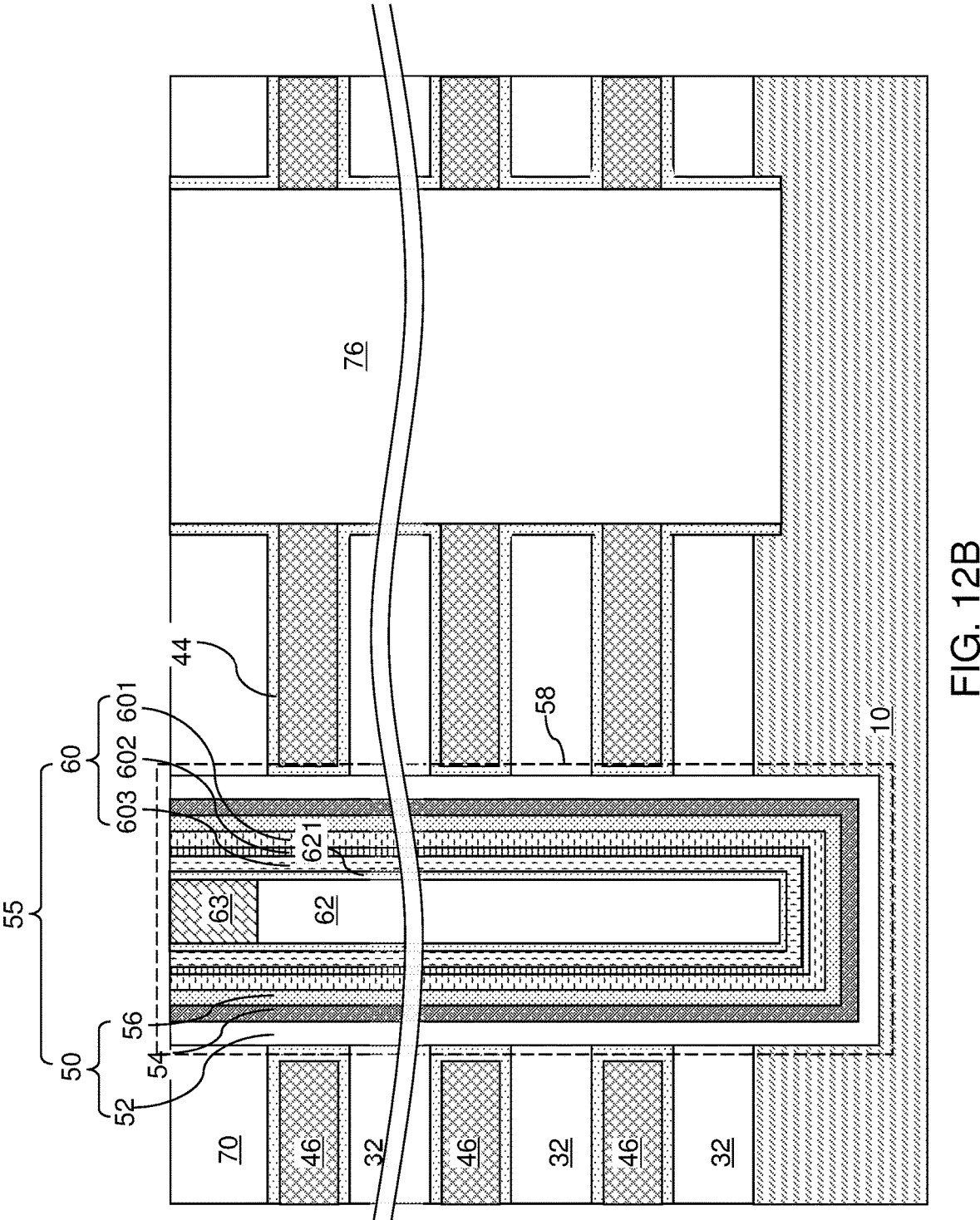
FIG. 12B is a magnified view of a region of the first exemplary structure in case first exemplary memory opening fill structures are present in the memory openings according to the first embodiment of the present disclosure.
Figure 12C:
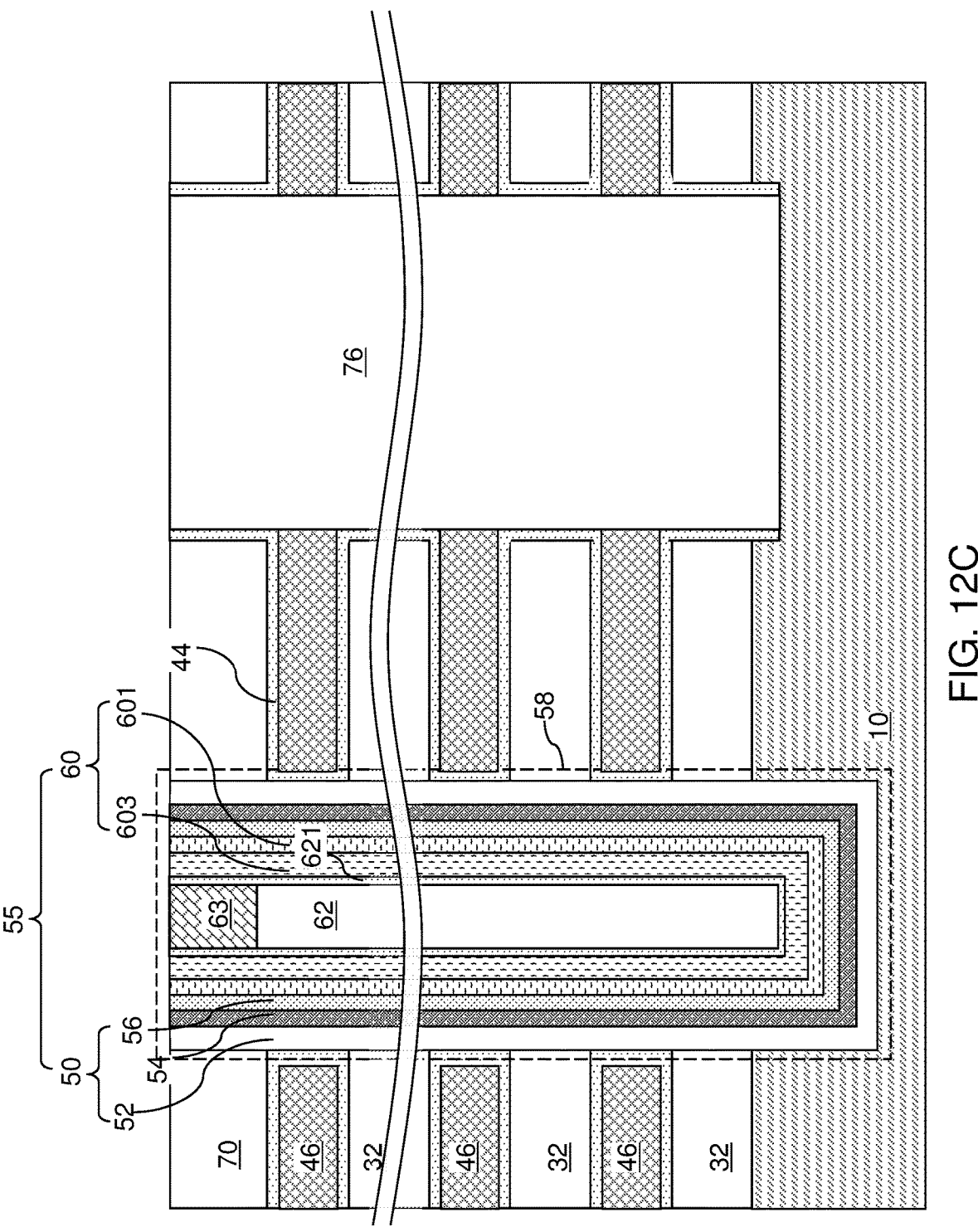
FIG. 12C is a magnified view of a region of the first exemplary structure in case second exemplary memory opening fill structures are present in the memory openings according to the first embodiment of the present disclosure.

Referring to FIGS. 12A, 12B, and 12C, a dielectric wall structure 76 can be formed within each backside cavity 79' by depositing at least one dielectric material in the remaining unfilled volume (i.e., the backside cavity 79') of the backside trench 79. FIG. 12B illustrates a case in which the memory opening fill structures 58 have a first configuration illustrated in FIG. 5E. FIG. 12C illustrates a case in which the memory opening fill structures 58 have a second configuration illustrated in FIG. 6C. The at least one dielectric material can include silicon oxide, silicon nitride, a dielectric metal oxide, an organosilicate glass, or a combination thereof. In one embodiment, the insulating material layer can include silicon oxide. The at least one dielectric material can be deposited, for example, by low pressure chemical vapor deposition (LPCVD) or atomic layer deposition (ALD). Optionally, the at least one dielectric material can be planarized using the contact level dielectric layer 73 as a stopping layer. If chemical mechanical planarization (CMP)

process is used, the contact level dielectric layer 73 can be used as a CMP stopping layer. Each remaining continuous portion of the at least one conductive material in the backside trenches 79 constitutes a dielectric wall structure 76. The dielectric wall structures 76 can be formed between each neighboring pair of alternating stacks (32, 46) of insulating layers 32 and electrically conductive layers.

Figure 13A:
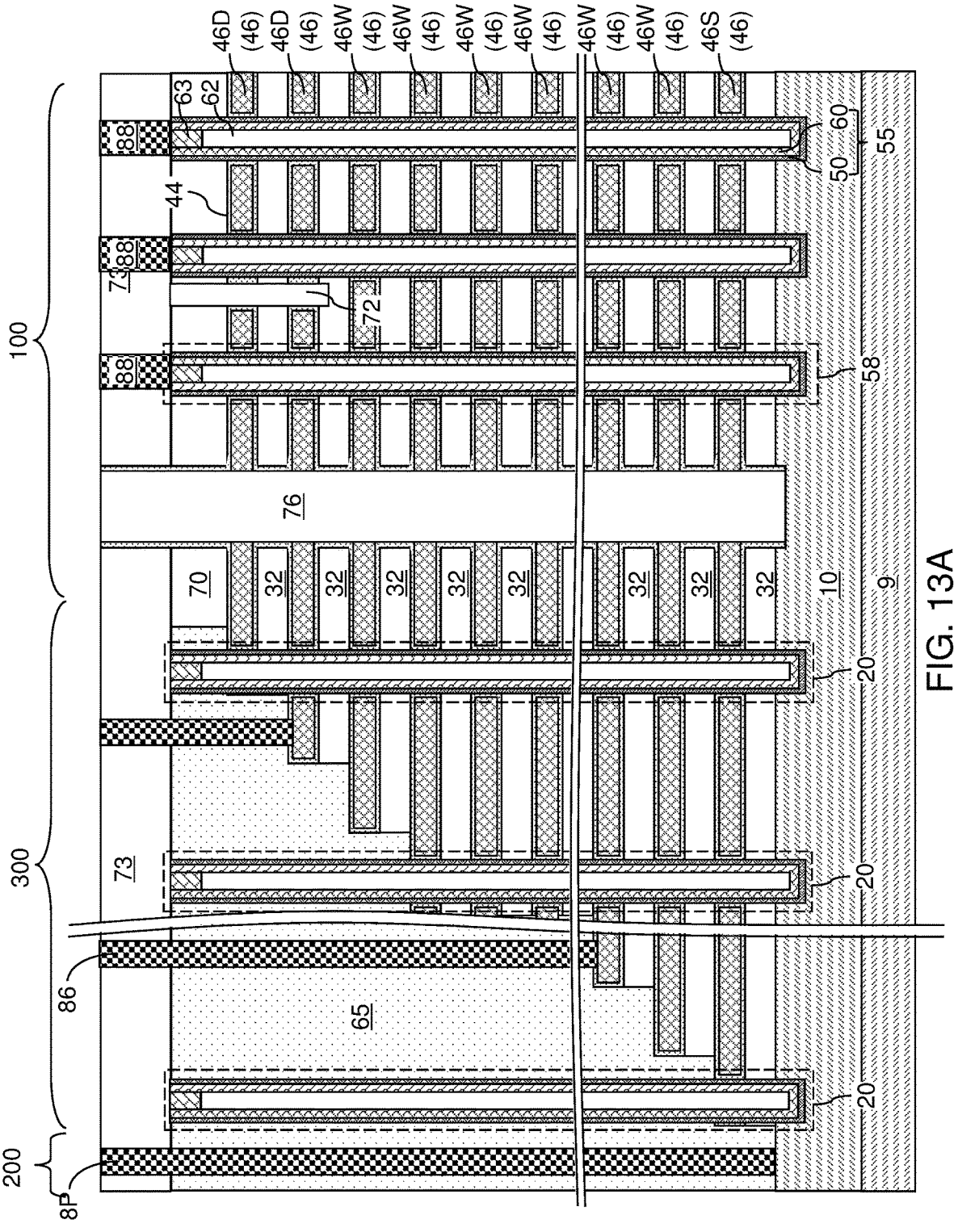
FIG. 13A is a schematic vertical cross-sectional view of the first exemplary structure after formation of contact via structures according to the first embodiment of the present disclosure.
Figure 13B:
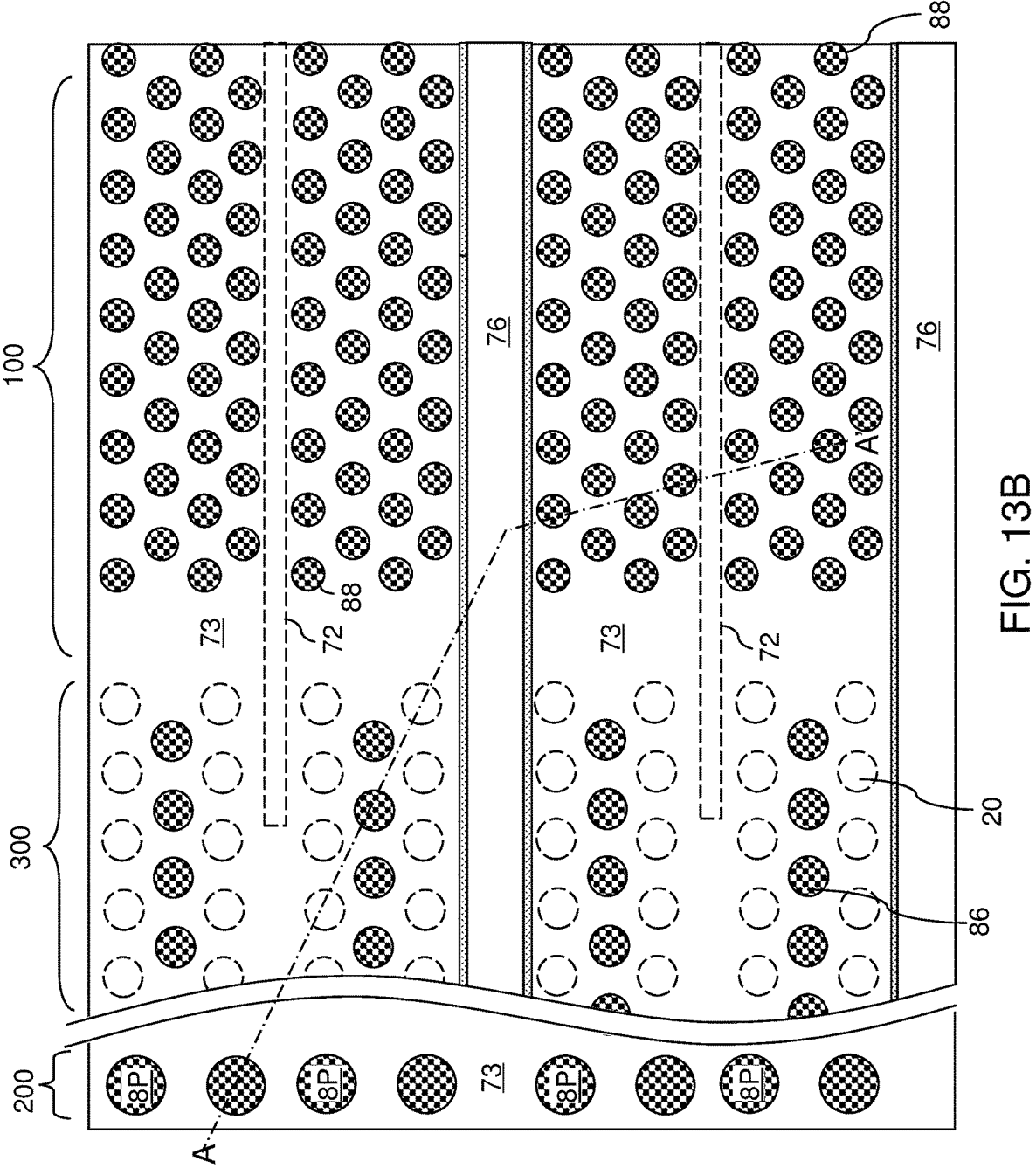
FIG. 13B is a top-down view of the first exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the stepped dielectric material portion 65. Pass-through via structures 8P can be formed through the stepped dielectric material portion 65 to the semiconductor material layer 10.

Figure 14A:
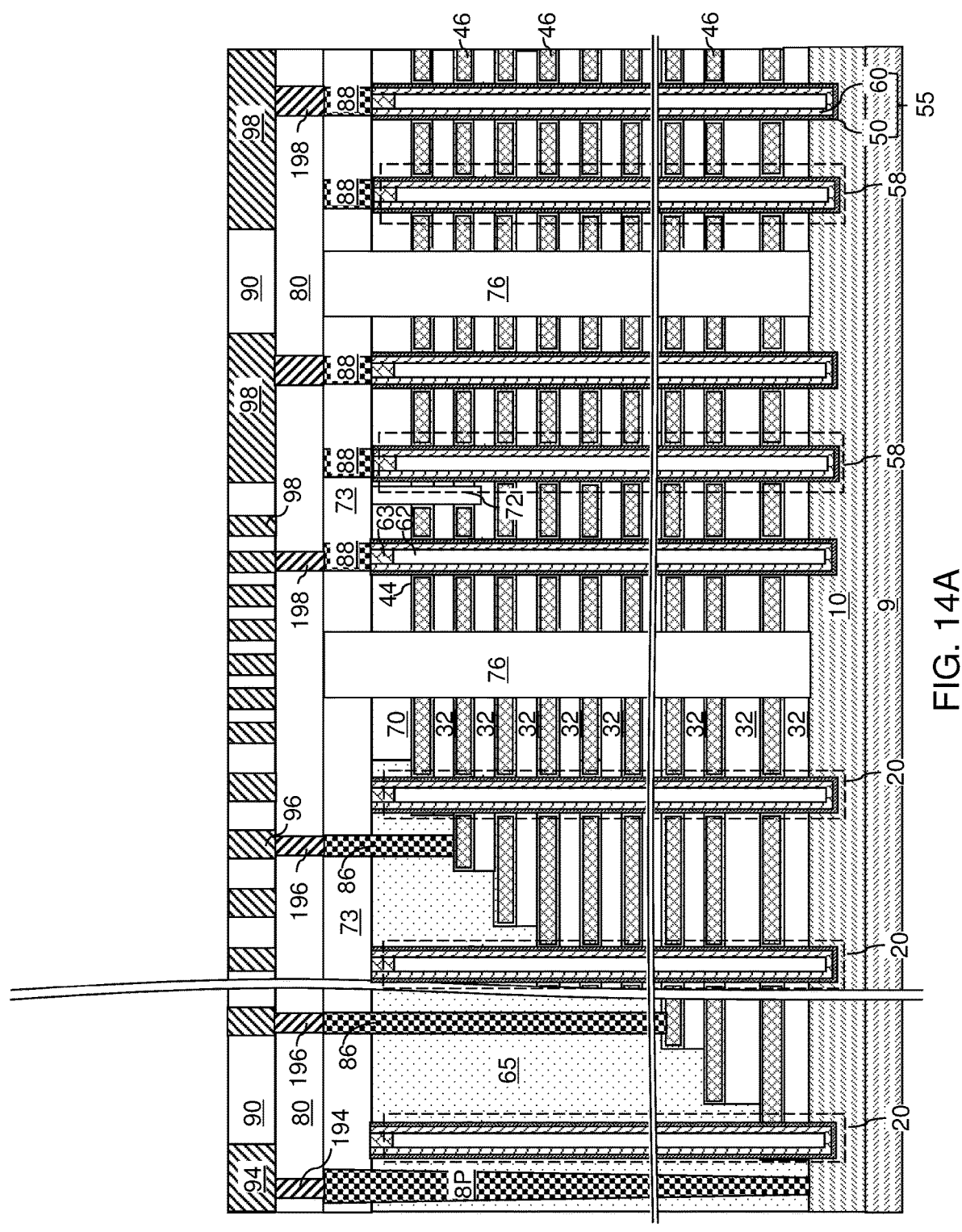
FIG. 14A is a schematic vertical cross-sectional view of the first exemplary structure after formation of first via level metal interconnect structures and first line level metal interconnect structures according to the first embodiment of the present disclosure.
Figure 14B:
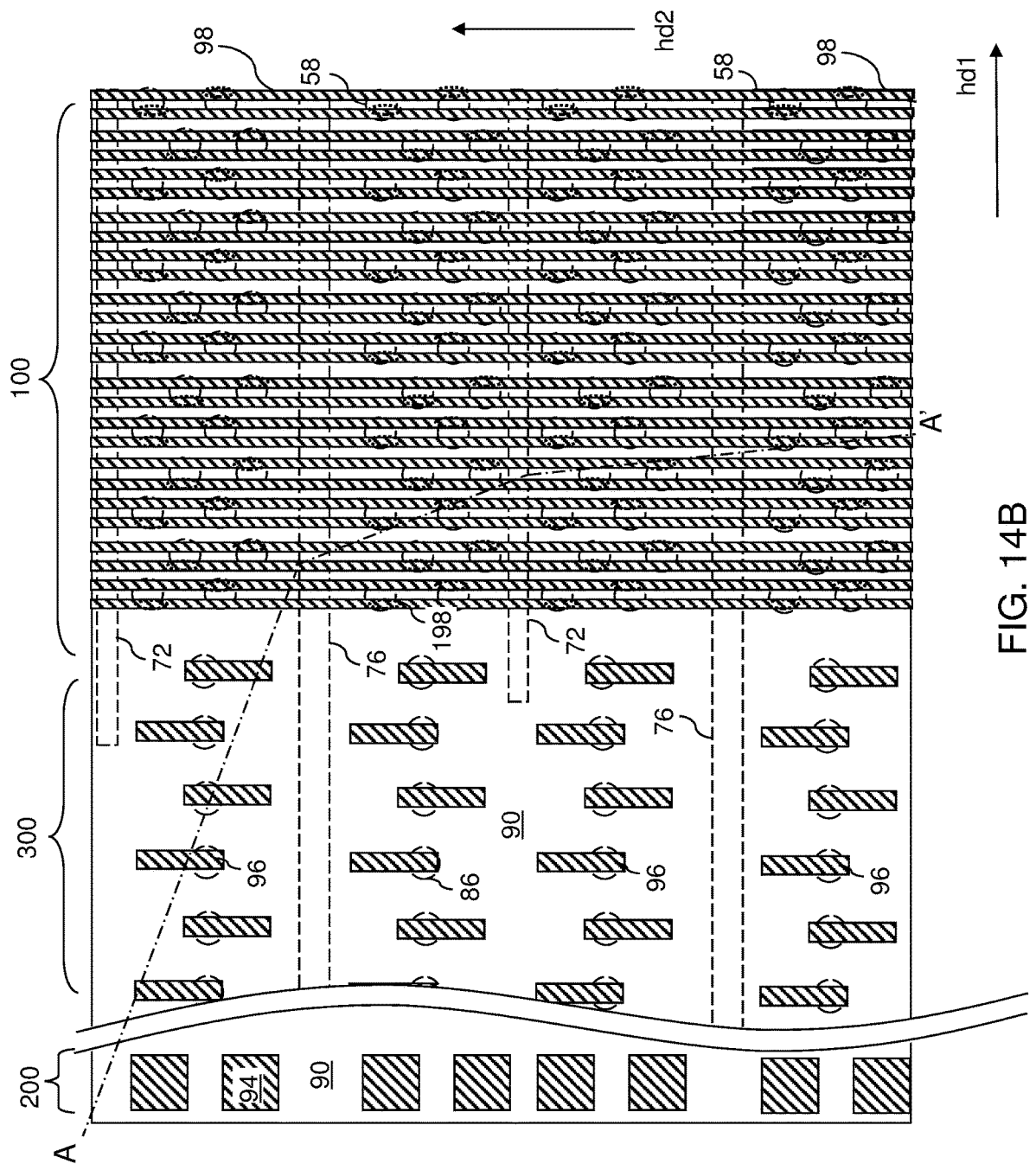
FIG. 14B is a partial see-through top-down view of the first exemplary structure of FIG. 14A. The vertical plane A-A' is the plane of the schematic vertical cross-sectional view of FIG. 14A.

Referring to FIGS. 14A and 14B, a via level dielectric layer 80 is formed over the contact level dielectric layer 73. Various contact via structures (198, 196, 194) can be formed through the via level dielectric layer 80. For example, bit line connection via structures 198 can be formed on the drain contact via structures 88, word line connection via structures 196 can be formed on the word line contact via structures 86, and peripheral extension via structures 194 can be formed on the pass-through via structures 8P.

A first line level dielectric layer 90 is deposited over the via level dielectric layer 80. Various metal line structures (98, 96, 94) are formed in the first line level dielectric layer 90. The metal line structures (98, 96, 94) are herein referred to as first line level metal interconnect structures. The various metal line structure (98, 96, 94) include bit lines 98 that are electrically connected to a respective plurality of the drain contact via structures 88 (for example, through the bit line connection via structures 198), a word-line-connection metal interconnect lines 98 that are electrically connected to a respective one of the word line contact via structures 86 (for example, through a bit line connection via structure 198), and peripheral metal interconnect lines 94 that are electrically connected to a respective one of the pass-through via structures 8P (for example, through a peripheral extension via structure 194).

The bit lines 98 are electrically connected to upper ends of a respective subset of the vertical channels 60 in the memory stack structures 55 in the memory array region 100. In one embodiment, the memory stack structures 55 are arranged in rows that extend along the first horizontal direction hd1, and the bit lines 98 laterally extend along the second horizontal direction hd2.

Figure 15:
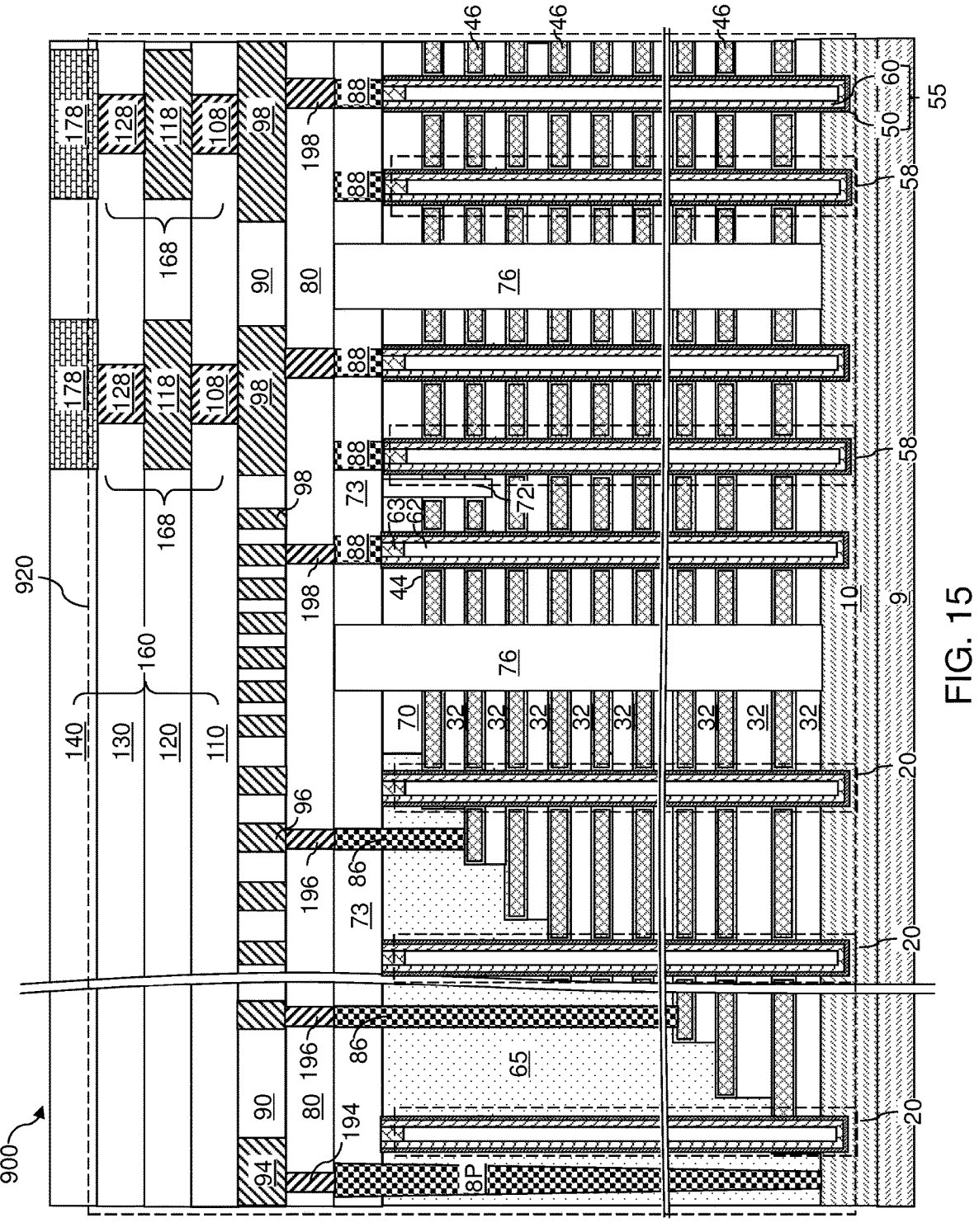
FIG. 15 is a schematic vertical cross-sectional view of the first exemplary structure that forms a memory die after formation of additional metal interconnect structures according to the first embodiment of the present disclosure.

Referring to FIG. 15, a memory die 900 is formed by optionally performing additional processing steps on the first exemplary structure of FIG. 14A. Specifically, additional metal interconnect structures 168 located in additional interconnect level dielectric layers 160 are formed. In an illustrative example, the additional interconnect level dielectric layers 160 can include a via level dielectric layer 110, a second line level dielectric layer 120, a second via level dielectric layer 130, and a metallic pad structure level dielectric layer 140. The metal interconnect structures 168 can include first metal via structures 108 included in the first via level dielectric layer 110, second metal line structures 118 included within the second line level dielectric layer 120, second metal via structures 128 included in the second via level dielectric layer 130, and memory-side bonding pads 178 (such as metallic pad structures) included in the metallic pad structure level dielectric layer 140. While an embodiment is described in which the additional interconnect level dielectric layers 160 include the first via level dielectric layer 110, the second line level dielectric layer 120, the second via level dielectric layer 130, and the metallic pad structure level dielectric layer 140, embodiments are expressly contemplated herein in which the additional interconnect level dielectric layers 160 include a different number and/or different combinations of dielectric material layers. The memory die 900 includes a three-dimensional array of memory elements. Electrical connection paths can be provided between each memory-side bonding pad 178 and a respective set of metal interconnect structures {(194, 94, 108, 118, 128), (196, 96, 108, 118, 128), or (198, 98, 108, 118, 128)}. The memory die 900 includes a memory device 920, which may include a three-dimensional memory array of memory-side metal interconnect structures (86, 88, 194, 94, 196, 96, 198, 98, 168). Generally, memory-side dielectric material layers 160 embedding memory-side metal interconnect structures (86, 88, 194, 94, 196, 96, 198, 98, 168) and memory-side bonding pads 178 can be formed over the alternating stack (32, 46) to provide a memory die 900.

Figure 16:
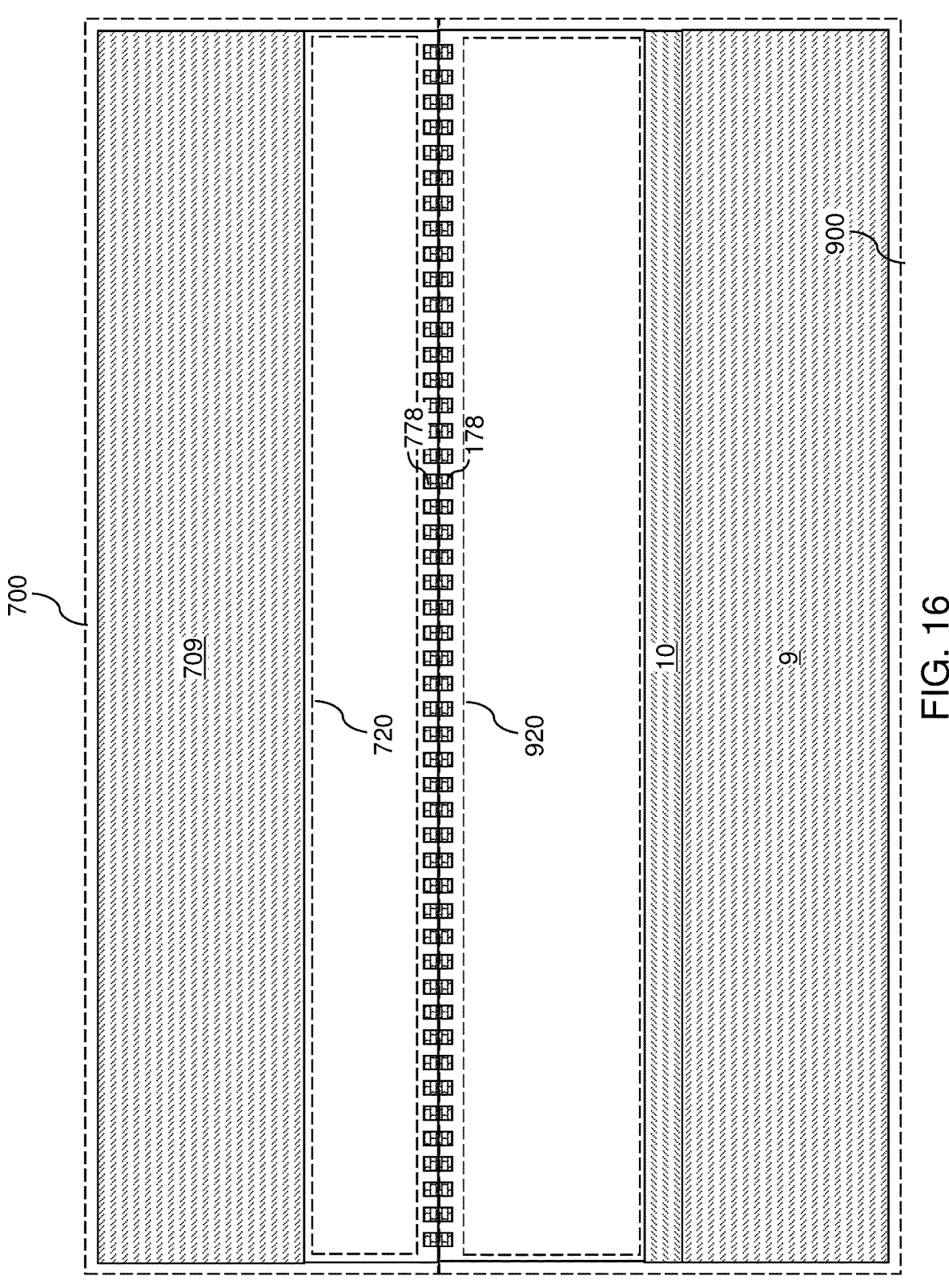
FIG. 16 is a schematic vertical cross-sectional view of the first exemplary structure after bonding a logic die to the memory die according to the first embodiment of the present disclosure.

Referring to FIG. 16, an optional logic die 700 can be provided, which includes a logic-side substrate 709, a peripheral circuit 720 located on the logic-side substrate 709 and comprising logic-side semiconductor devices (such as field effect transistors) and logic-side metal interconnect structures, and logic-side bonding pads 778. The peripheral circuit 720 can be configured to control operation of the memory device 920 within the memory die 900. Specifically, the peripheral circuit 720 can be configured to drive various electrical components within the memory device 920 including, but not limited to, the electrically conductive layers 46.

The logic die 700 can be attached to the memory die 900, for example, by bonding the logic-side bonding pads 778 to the memory-side bonding pads 178. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process.

Figure 17:
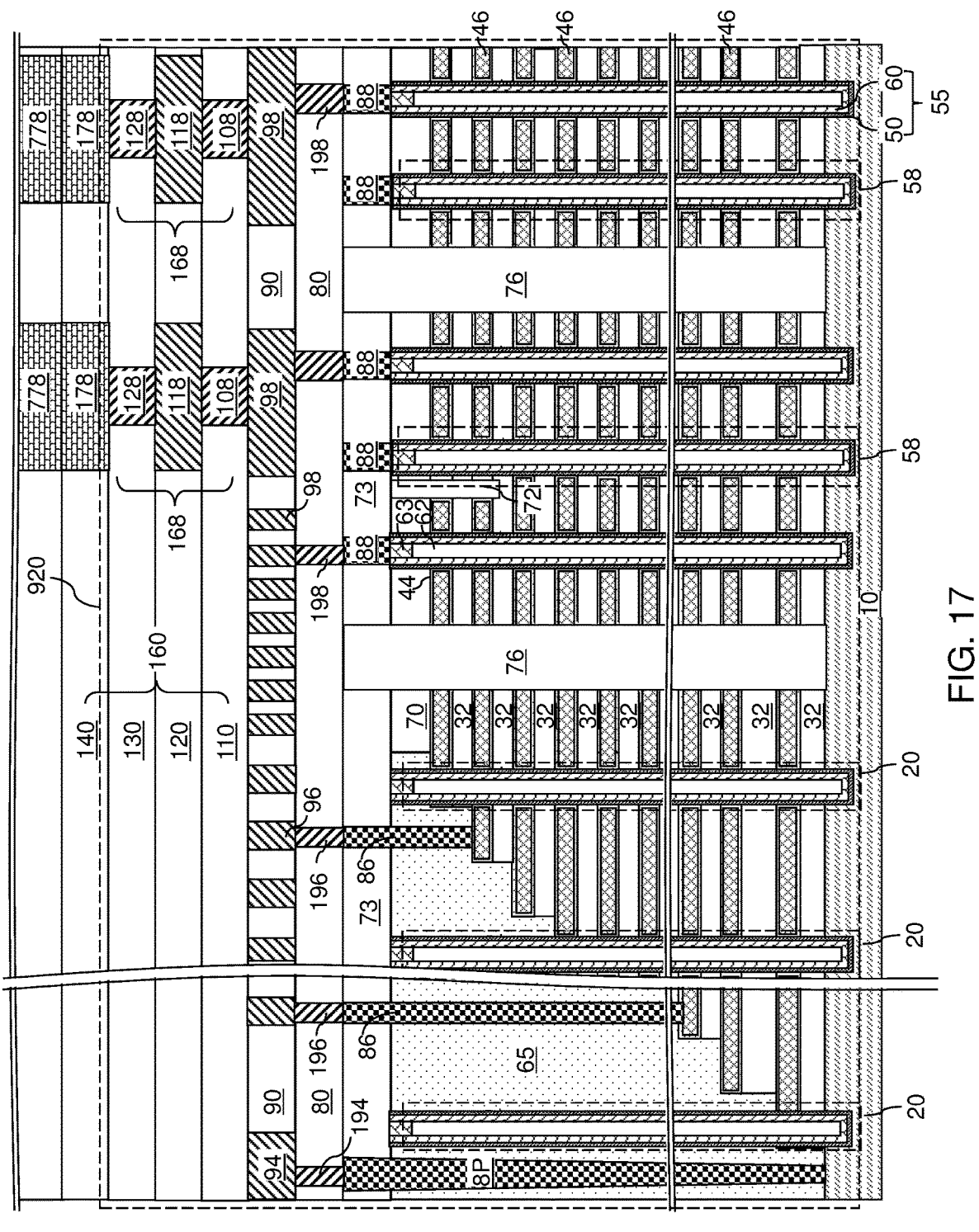
FIG. 17 is a schematic vertical cross-sectional view of a region of the first exemplary structure after removal of the substrate layer according to the first embodiment of the present disclosure.

Referring to FIG. 17, the carrier substrate 9 can be optionally removed, and bottom surface of the semiconductor material layer 10 can be physically exposed. For example, the carrier substrate 9 can be thinned by grinding, polishing, an isotropic etch process, and/or an anisotropic etch process.

Figure 18:
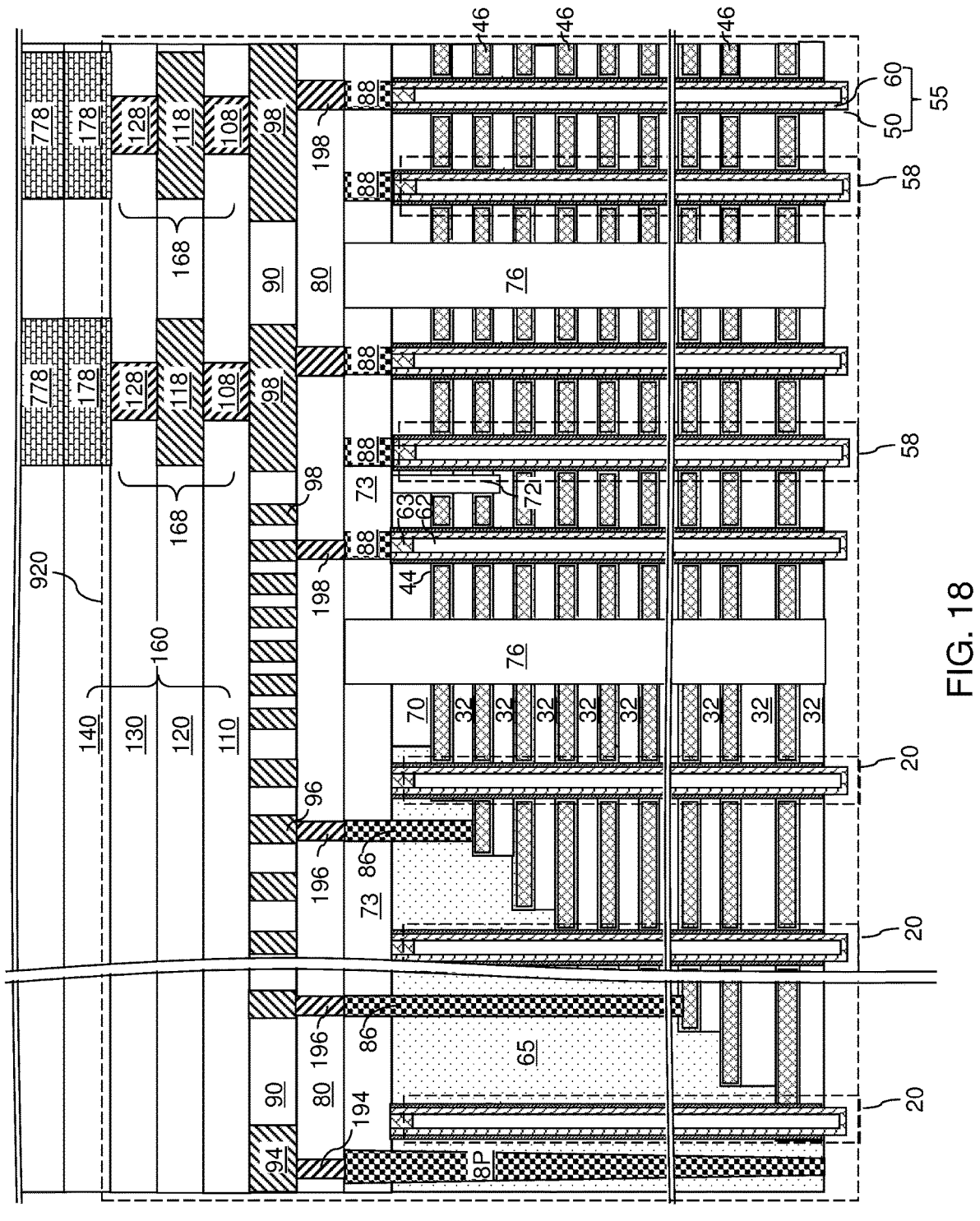
FIG. 18 is a schematic vertical cross-sectional view of a region of the first exemplary structure after physically exposing end portions of vertical channels according to the first embodiment of the present disclosure.

Referring to FIG. 18, the semiconductor material layer 10 can be subsequently removed selective to the memory films 50. In one embodiment, the semiconductor material layer 10 may be removed by a selective etch process that removes the semiconductor material of the semiconductor material layer 10 selective to the dielectric materials of the memory films 50, the insulating layers 32, and the dielectric wall structures 76. For example, a wet etch process employing potassium hydroxide or another suitable etchant may be performed to remove the semiconductor material layer 10.

Subsequently, a sequence of isotropic etch processes may be performed to sequentially etch the materials of the memory films 50. For example, a sequence of wet etch processes may be performed to etch physically exposed bottom portions of the blocking dielectric layers 52, the charge storage layers 54, and the tunneling dielectric layers 56. End portions of vertical channels 60 can be physically exposed. Generally, an end portion of each indium tin zinc oxide layer 601 can be physically exposed by removing a substrate (9, 10) and an end portion of each memory film 50.

Figure 19:
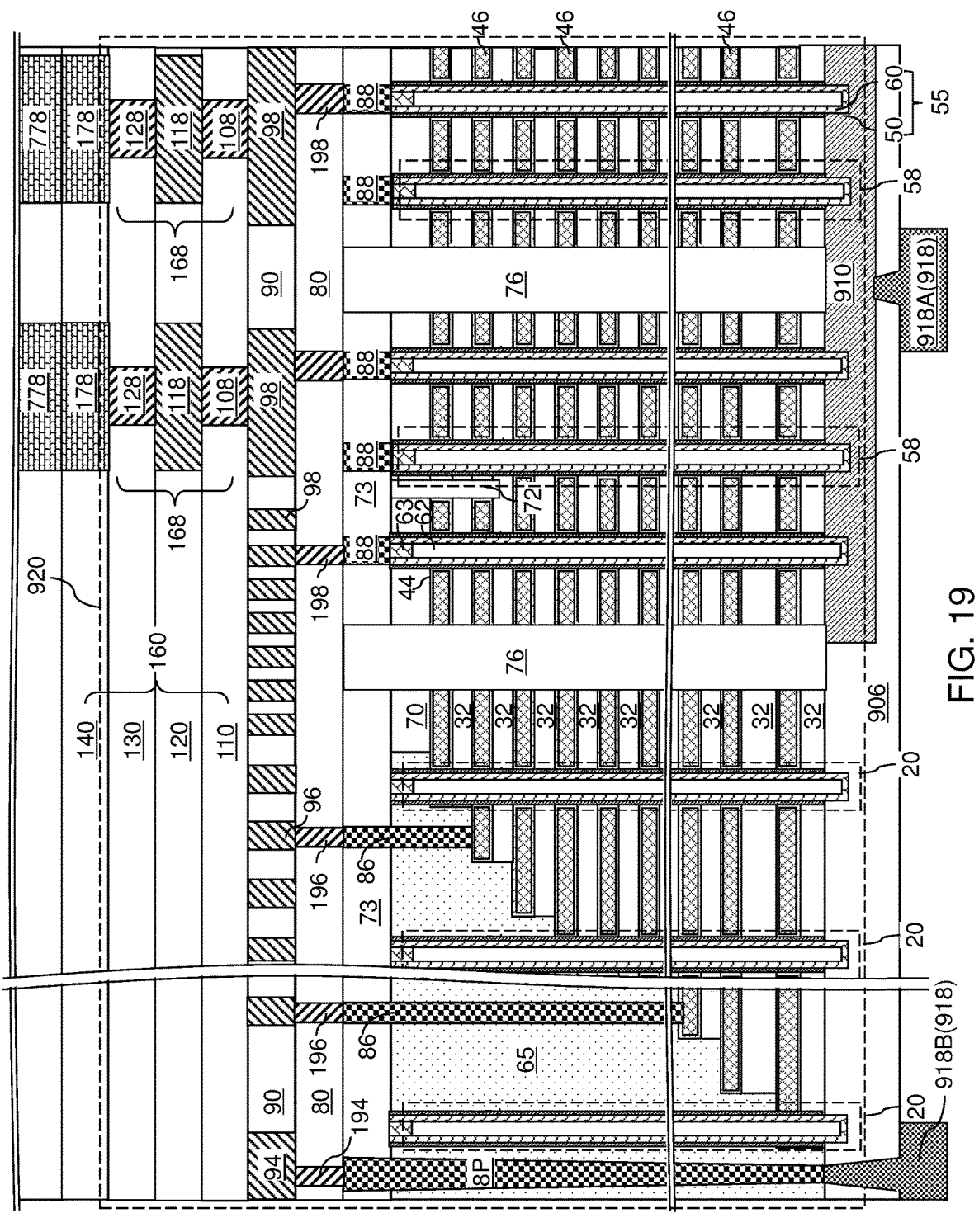
FIG. 19 is a schematic vertical cross-sectional view of a region of the first exemplary structure after formation of a source layer and backside bonding structures according to the first embodiment of the present disclosure.

Referring to FIG. 19, a semiconductor material layer (e.g., source layer) 910 can be deposited on the physically exposed surfaces of the vertical channels 60 in the memory opening fill structures 58. The semiconductor material layer 910 may comprise a silicon layer or a compound semiconductor layer, such as a metal oxide semiconductor (e.g., IGZO and/or ITZO) layer. The semiconductor material layer 910 may be patterned such that the semiconductor material layer 910 does not contact the vertical channels 60 within the support pillar structures 20. In one embodiment, the semiconductor material layer 910 may have a same type of doping as the drain regions 63, and may function as a source layer, which is a common source region, for the vertical field effect transistors including the vertical channels 60. Generally, a source region (comprising the semiconductor material layer 910) can be formed on an end portion of each of the indium tin zinc oxide layer 601. The semiconductor material layer 910 can be in contact with a horizontal surface of the alternating stack (32, 46), such as a horizontal bottom surface of a bottommost insulating layer 32 within the alternating stack (32, 46).

A backside insulating layer 906 can be formed on the semiconductor material layer 910 and on any physically exposed surface of the alternating stack (32, 46). Backside bonding structures 918 can be formed through backside insulating layer 906. The backside bonding structures 918 may include, for example, at least one source-connection backside bonding structure 918A and at least one additional backside bonding structure 918B that is electrically connected to a respective one of the memory-side metal interconnect structures (86, 88, 194, 94, 196, 96, 198, 98, 168) using the pass through via structure 8P.

Figure 20A:
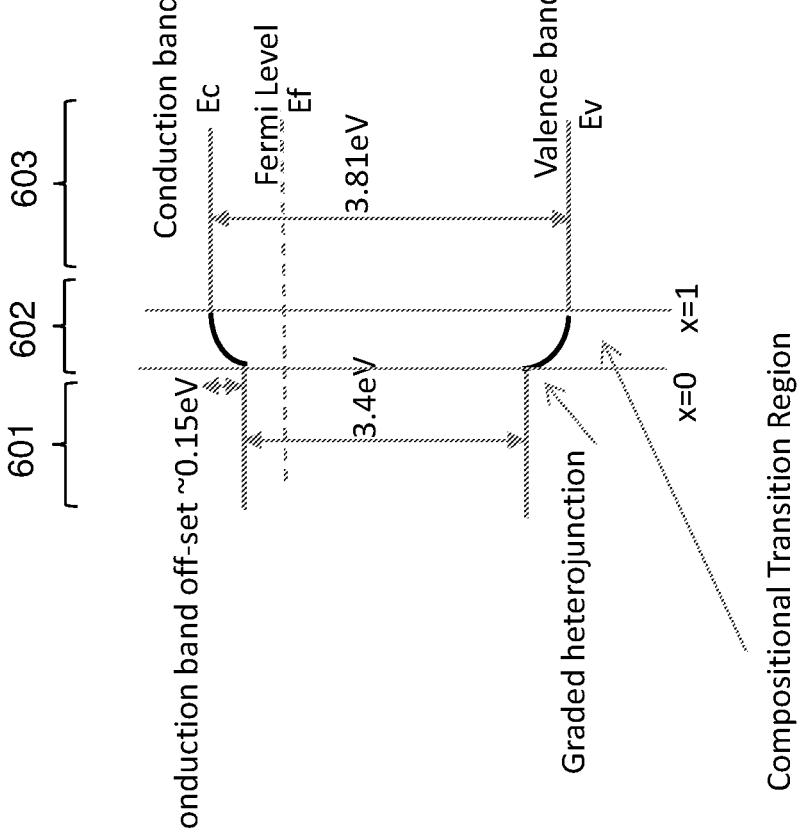
FIG. 20A is a band diagram of a vertical channel in the first exemplary memory opening fill structure according to the first embodiment of the present disclosure.

Referring to FIG. 20A, a band diagram of a vertical channel 60 in the first exemplary memory opening fill structure 58 shown in FIG. 5E according to the first embodiment of the present disclosure is illustrated. An indium gallium tin zinc oxide layer 602 provides a graded compositional transition region between the indium tin zinc oxide layer 601 and the indium gallium zinc oxide layer 603.

Figure 20B:
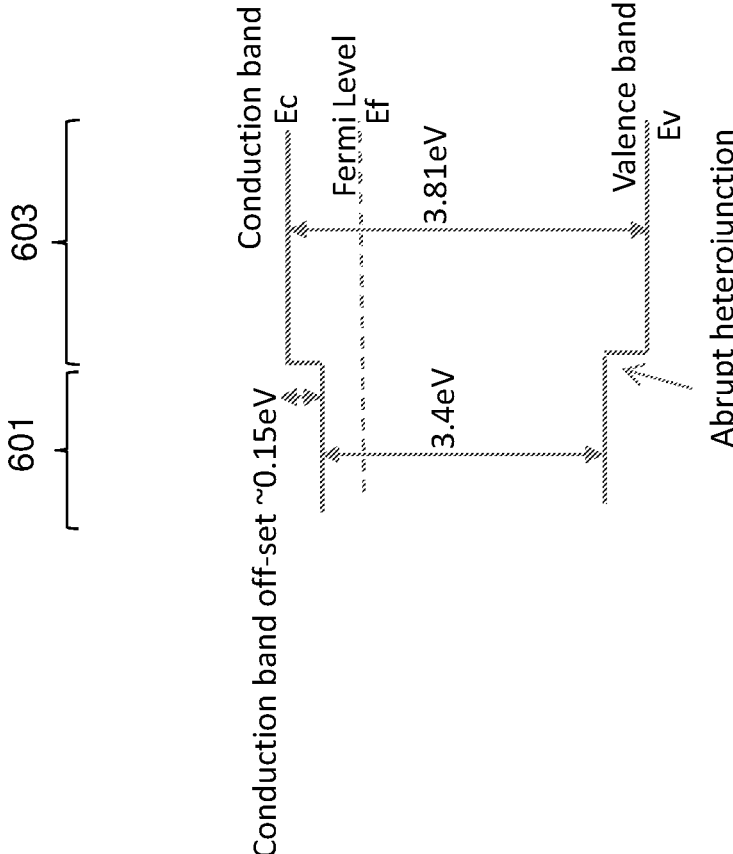
FIG. 20B is a band diagram of a vertical channel in the second exemplary memory opening fill structure according to the first embodiment of the present disclosure.

Referring to FIG. 20B, a band diagram of a vertical channel in the second exemplary memory opening fill structure 58 shown in FIG. 6C according to the first embodiment of the present disclosure is illustrated. An abrupt heterojunction is present between the indium tin zinc oxide layer 601 and the indium gallium zinc oxide layer 603.

The various embodiments of the present disclosure provide a composite metal oxide semiconductor channel for a three-dimensional memory device, such as a three-dimensional NAND memory device. A layer stack including a indium tin zinc oxide layer 601 and an indium gallium zinc oxide layer 603 provides superior performance and reliability over prior art single layer (i.e., uniform composition) metal oxide semiconductor channels. Specifically, the composite metal oxide semiconductor channel 60 simultaneously provides higher charge carrier mobility, lower leakage current, a smaller subthreshold slope, and thus, superior performance and reliability and reduced device variability compared to devices employing a single metal oxide layer semiconductor channel.

FIGS. 21A-21E are sequential schematic vertical cross-sectional views of a memory opening 49 within a second exemplary structure during formation of a memory opening fill structure 58 therein according to a second embodiment of the present disclosure.

Figures 21A, 21B:
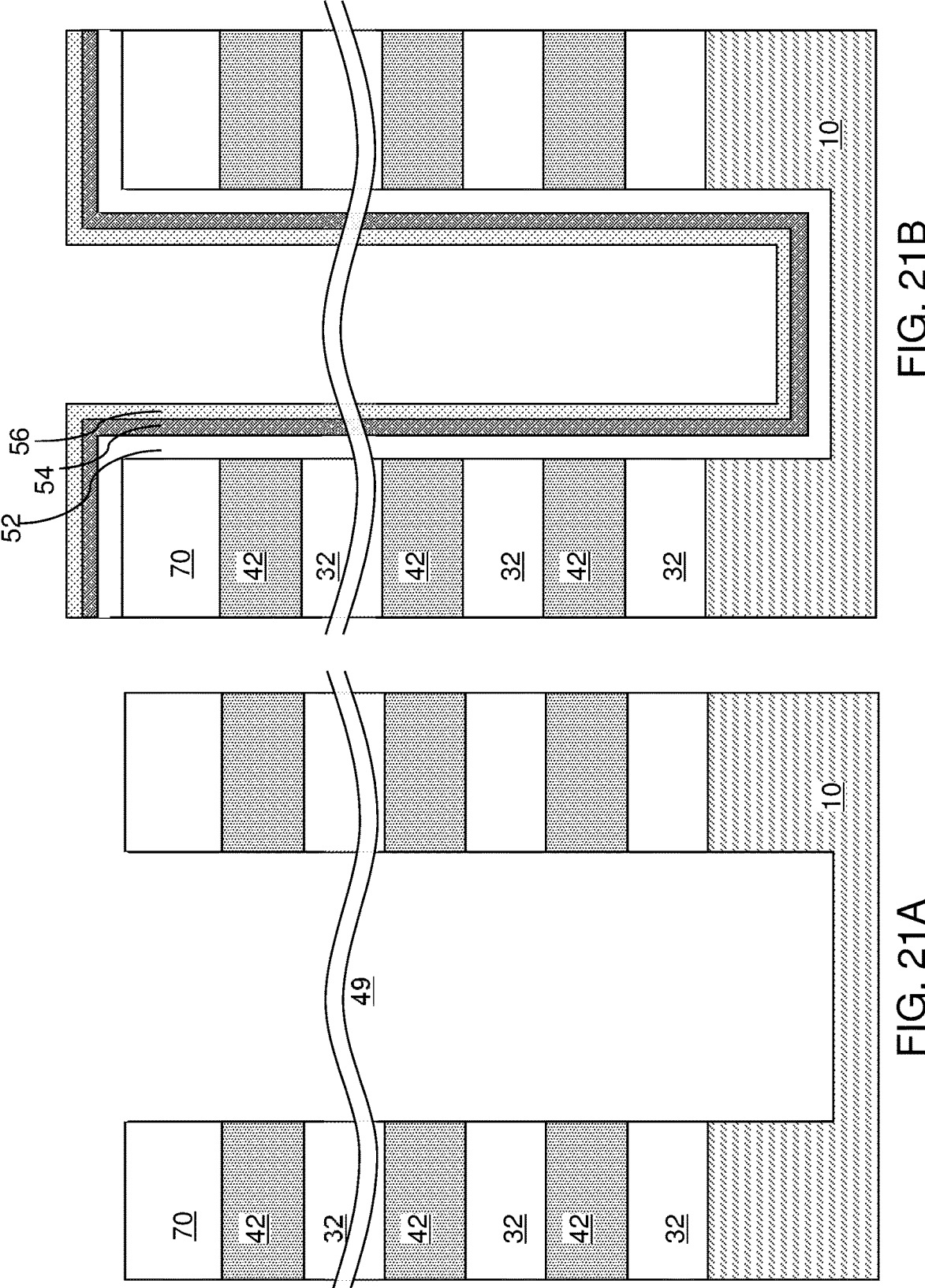
FIGS. 21A-21E are sequential schematic vertical cross-sectional views of a memory opening within a second exemplary structure during formation of a memory opening fill structure therein according to a second embodiment of the present disclosure.

Referring to FIG. 21A, a memory opening 49 in a second exemplary structure according to the second embodiment of the present disclosure is illustrated. The second exemplary structure at the processing steps of FIG. 21A may be the same as the first exemplary structure illustrated in FIG. 5A.

Referring to FIG. 21B, the processing steps described with reference to FIG. 5B can be performed to sequentially deposit a stack of layers including a blocking dielectric layer 52, a charge storage layer 54, and a tunneling dielectric layer 56.

Figures 21C, 21D:
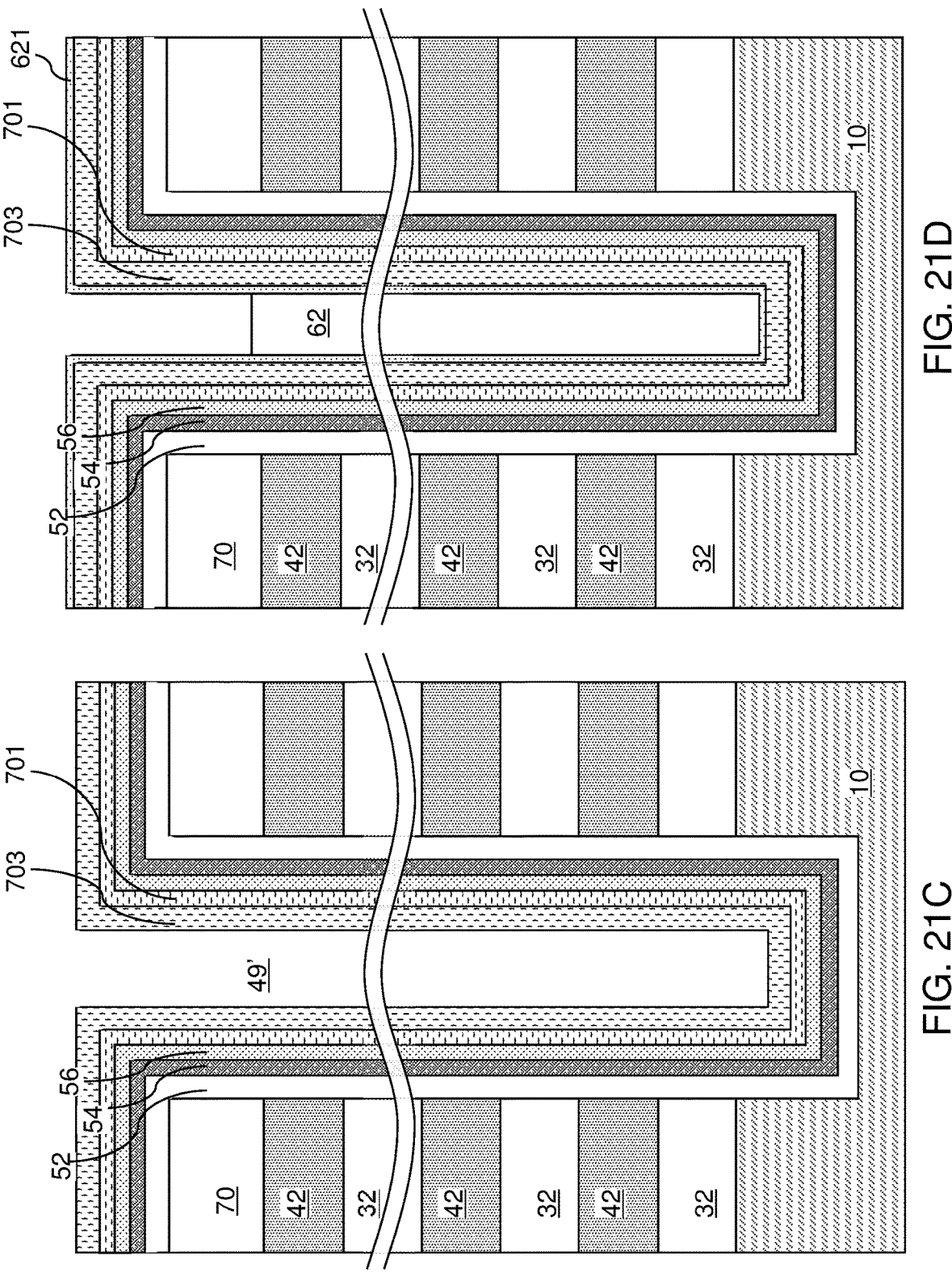

Referring to FIG. 21C, an outer semiconducting metal oxide channel layer 701 can be deposited on the physically exposed surfaces of the tunneling dielectric layer 56. In one embodiment, the outer semiconducting metal oxide channel layer 701 comprises a first semiconducting metal oxide material having a first band gap. The first semiconducting metal oxide material may be stoichiometric or non-stoichiometric. In one embodiment, the first semiconducting metal oxide material may comprise and/or may consist essentially of zinc oxynitride (ZnON). The composition of zinc oxynitride may range from $ZnO_{1-x}N_x$ to $Zn_3(O_yN_{1-y})_2$ where $x{\geq}0.05$ (e.g., $0.05{\leq}x{\leq}0.5$) and where $y{\geq}0.05$ (e.g., $0.05{\leq}y{\leq}0.5$). In this case, the outer semiconducting metal oxide channel layer 701 can be formed by depositing zinc oxynitride. In one embodiment, the first semiconducting metal oxide material may be doped with at least one dopant species such that a total atomic concentration of the at least one dopant species is at least $1{\times}10^{18}/cm^3$, such as at least $3{\times}10^{18}/cm^3$. In one embodiment, the first semiconducting metal oxide material of the outer semiconducting metal oxide channel layer 701 may comprise and/or may consist essentially of zinc oxynitride including n-type dopants at an atomic concentration in a range from $3{\times}10^{18}/cm^3$ to $5{\times}10^{18}/cm^3$.

The outer semiconducting metal oxide channel layer 701 may be formed by radio frequency (RF) physical vapor deposition (PVD) (e.g., RF sputtering) and/or by direct current (DC) physical vapor deposition (PVD) (e.g., DC sputtering) employing a sintered sputtering target including zinc, oxygen, and nitrogen. Alternatively, separate zinc oxide and zinc nitride sputtering targets may be used. The deposition temperature during the RFPVD process and/or the DCPVD process may be in a range from 250 degrees Celsius to 350 degrees Celsius. The plasma power may be in a range from 150 watts to 250 watts, although lesser and greater plasma powers may be employed depending on the size of the substrate. The deposition pressure may be in a range from 0.2 Pa to 0.6 Pa, although lesser and greater deposition pressures may also be employed.

Generally, any alternative deposition process may be employed in lieu of the RFPVD and/or DCPVD processes to form the outer semiconducting metal oxide channel layer 701. For example, chemical vapor deposition (CVD), atomic layer deposition (ALD), and/or pulsed laser deposition (PLD) may be employed. The thickness of the outer semiconducting metal oxide channel layer 701 may be in a range from 1 nm to 4 nm, such as from 1.5 nm to 3 nm, although lesser and greater thicknesses may also be employed. The outer semiconducting metal oxide channel layer 701 may be conformal or non-conformal.

An inner semiconducting metal oxide channel layer 703 can be deposited on the outer semiconducting metal oxide channel layer 701. The inner semiconducting metal oxide channel layer 703 may comprise a second semiconducting metal oxide material having a second band gap that is greater than the first band gap. The second semiconducting metal oxide material may be stoichiometric or non-stoichiometric.

In one embodiment, the second semiconducting metal oxide material may comprise and/or may consist essentially of indium gallium zinc oxide, indium zinc tin oxide, and/or indium gallium zinc tin oxide, as in the previous embodiment. In this case, the inner semiconducting metal oxide channel layer 703 can be formed by depositing at least one semiconducting metal oxide material such as indium gallium zinc oxide, indium zinc tin oxide, and/or indium gallium zinc tin oxide. In one embodiment, the second semiconducting metal oxide material may be doped with at least one dopant species such that a total atomic concentration of the at least one dopant species is not greater than $1{\times}10^{18}/cm^3$, and/or not greater than $5{\times}10^{17}/cm^3$. In one embodiment, the second semiconducting metal oxide material of the inner semiconducting metal oxide channel layer 703 may comprise and/or may consist essentially of indium gallium zinc oxide, indium zinc tin oxide, and/or indium gallium zinc tin oxide including n-type dopants at an atomic concentration in a range from $1{\times}10^{16}/cm^3$ to $2{\times}10^{17}/cm^3$.

The inner semiconducting metal oxide channel layer 703 may be formed by radio frequency (RF) physical vapor deposition (PVD) and/or by direct current (DC) physical vapor deposition (PVD) as described in the previous embodiment. The deposition temperature during the RFPVD process and/or the DCPVD process may be in a range from 250 degrees Celsius to 350 degrees Celsius. The plasma power may be in a range from 150 watts to 250 watts, although lesser and greater plasma powers may be employed depending on the size of the substrate. The deposition pressure may be in a range from 0.2 Pa to 0.6 Pa, although lesser and greater deposition pressures may also be employed. The sputtering may be reactive sputtering in an oxygen ambient or non-reactive sputtering without an oxygen ambient if sufficient oxygen is provided in the targets. The composition of the gas ambient during deposition may be, for example, 50% argon and 50% oxygen.

Generally, any alternative deposition process may be employed in lieu of the RFPVD and/or DCPVD processes to form the inner semiconducting metal oxide channel layer 703. For example, chemical vapor deposition (CVD), atomic layer deposition (ALD), and/or pulsed laser deposition (PLD) may be employed. The thickness of the inner semiconducting metal oxide channel layer 703 may be in a range from 3 nm to 10 nm, such as from 4 nm to 8 nm, although lesser and greater thicknesses may also be employed. In one embodiment, the outer semiconducting metal oxide channel layer 701 has a first thickness, and the inner semiconducting metal oxide channel layer 703 has a second thickness that is greater than the first thickness, such as in a range from 1.5 times the first thickness to 4 times the first thickness. The inner semiconducting metal oxide channel layer 703 may be conformal or non-conformal.

Referring to FIG. 21D, an optional interfacial dielectric liner 621 may be optionally formed on the inner semiconducting metal oxide channel layer 703. The interfacial dielectric liner 621 includes a dielectric material that can improve charge carrier mobility within the inner semiconducting metal oxide channel layer 703 by reducing the density of surface defects in the inner semiconducting metal oxide channel layer 703. For example, the interfacial dielectric liner 621 may include a dielectric metal oxide, such as aluminum oxide. The thickness of the interfacial dielectric liner 621 may be in a range from 2 nm to 4 nm, although lesser and greater thicknesses may also be employed.

A dielectric core layer can be deposited in the memory cavity 49'. The dielectric core layer includes a dielectric material, such as silicon oxide or organosilicate glass. The dielectric core layer can be deposited by a conformal deposition method such as low pressure chemical vapor deposition (LPCVD), or by a self-planarizing deposition process such as spin coating. Subsequently, the dielectric core layer can be recessed selective to the material of the inner semiconducting metal oxide channel layer 703, for example, by a recess etch. The material of the dielectric core layer can be vertically recessed below the horizontal plane including the top surface of the insulating cap layer 70. Each remaining portion of the dielectric core layer constitutes a dielectric core 62.

Figures 21E, 21F:
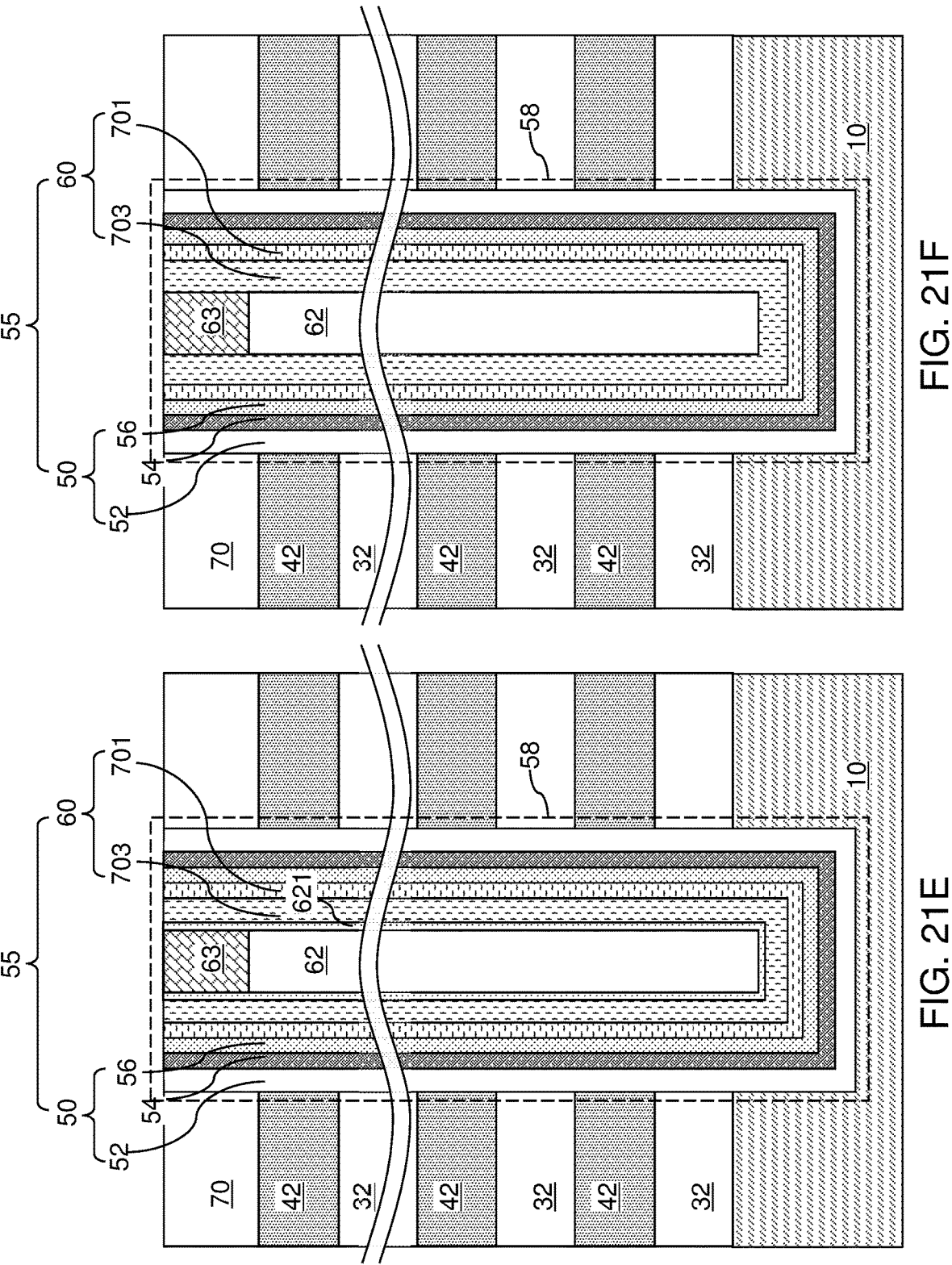
FIGS. 21F-21H are vertical cross-sectional views of alternative configurations of the memory opening fill structure according to the second embodiment of the present disclosure.

Referring to FIG. 21E, a doped semiconductor material can be deposited within each recessed region above the dielectric cores 62. In one embodiment, the outer semiconducting metal oxide channel layer 701 and the inner semiconducting metal oxide channel layer 703 may have a doping of a first conductivity type (such as p-type or n-type), and the deposited doped semiconductor material may have a doping of a second conductivity type that is the opposite of the first conductivity type. For example, if the first conductivity type is n-type, the second conductivity type is p-type, and vice versa. In one embodiment, the doped semiconductor material may be deposited as an amorphous semiconductor material or as a polycrystalline semiconductor material. The doped semiconductor material may include at least one elemental semiconductor material (such as silicon and/or germanium), or may comprise a compound semiconductor material (such as indium arsenide or indium antimonide), or may comprise a heavily doped metal oxide semiconductor material that is conductive, i.e. having electrical conductivity greater than $1.0 \times 10^5$ S/cm. The dopant concentration in the doped semiconductor material having a doping of the second conductivity type can be in a range from $5 \times 10^{18}$/cm$^3$ to $2 \times 10^{21}$/cm$^3$, although lesser and greater dopant concentrations can also be used.

A planarization process can be performed to remove portions of the doped semiconductor material having a doping of the second conductivity type, the outer semiconducting metal oxide channel layer 701, the inner semiconducting metal oxide channel layer 703, the tunneling dielectric layer 56, the charge storage layer 54, and the blocking dielectric layer 52 from above the horizontal plane including the top surface of the insulating cap layer 70, for example, by chemical mechanical planarization (CMP) or a recess etch. Each remaining portion of the semiconductor material having a doping of the second conductivity type constitutes a drain region 63.

The outer semiconducting metal oxide channel layer 701, the inner semiconducting metal oxide channel layer 703, the tunneling dielectric layer 56, the charge storage layer 54, and the blocking dielectric layer 52 are divided into a respective set of discrete layers located within a respective one of the memory openings 49 or within a respective one of the support openings 19. The interfacial dielectric liner 621 as provided at the processing steps of FIG. 21D is divided into a plurality of interfacial dielectric liners 621.

Each contiguous combination of an outer semiconducting metal oxide channel layer 701, and an inner semiconducting metal oxide channel layer 703 located within a respective memory opening 49 constitutes a vertical composite metal oxide semiconductor channel 60. Electrical current can flow through each vertical composite metal oxide semiconductor channel 60 when a vertical NAND device including the vertical composite metal oxide semiconductor channel 60 is turned on. Each contiguous combination of a blocking dielectric layer 52, a charge storage layer 54, and a tunneling dielectric layer 56 located within a respective memory opening constitutes a memory film 50, which can store electrical charges with a macroscopic retention time. As used herein, a macroscopic retention time refers to a retention time suitable for operation of a memory device as a permanent memory device such as a retention time in excess of 24 hours.

Generally, the memory film 50 includes a vertical stack of memory elements that can store information at levels of the sacrificial material layers 42. For example, the vertical stack of memory elements may comprise portions of a charge storage layer 54 located at the levels of the sacrificial material layers 42. In one embodiment, the tunneling dielectric layer 56 laterally surrounds the vertical composite metal oxide semiconductor channel 60, the vertical stack of memory elements (which may comprise portions of the charge storage layer 54) laterally surrounds the tunneling dielectric layer 56, and the blocking dielectric layer 52 laterally surrounds the vertical stack of memory elements. In some embodiments, a blocking dielectric layer 52 may not be present in the memory film 50 at this step, and a blocking dielectric layer may be subsequently formed after formation of backside recesses. Each combination of a memory film 50 and a vertical composite metal oxide semiconductor channel 60 constitutes a memory stack structure 55. The set of all material portions located within a memory opening 49 constitutes a memory opening fill structure 58. The set of all material portions located within a support opening 19 constitutes a support pillar structure.

An anneal process can be performed to crystallize the semiconducting materials of the outer semiconducting metal oxide channel layer 701 and the inner semiconducting metal oxide channel layer 703 within each vertical composite metal oxide semiconductor channel 60, and optionally to crystallize the semiconductor material of the drain region 63 in case the drain region includes an amorphous semiconductor material. The anneal process may be performed, for example, at an elevated temperature in a range from 600 degrees Celsius to 700 degrees Celsius, such as from 620 degrees Celsius to 650 degrees Celsius, although higher and lower temperatures may also be employed. The duration of the anneal process may be, for example, in a range from 10 minutes to 120 minutes, such as from 20 minutes to 60 minutes, although a shorter or longer duration may also be employed.

Referring to FIG. 21F, a first alternative configuration of the memory opening fill structure 58 for the second exemplary structure is illustrated, which can be derived from the memory opening fill structure 58 illustrated in FIG. 21E by omitting formation of the interfacial dielectric liner 621.

Figures 21G, 21H:
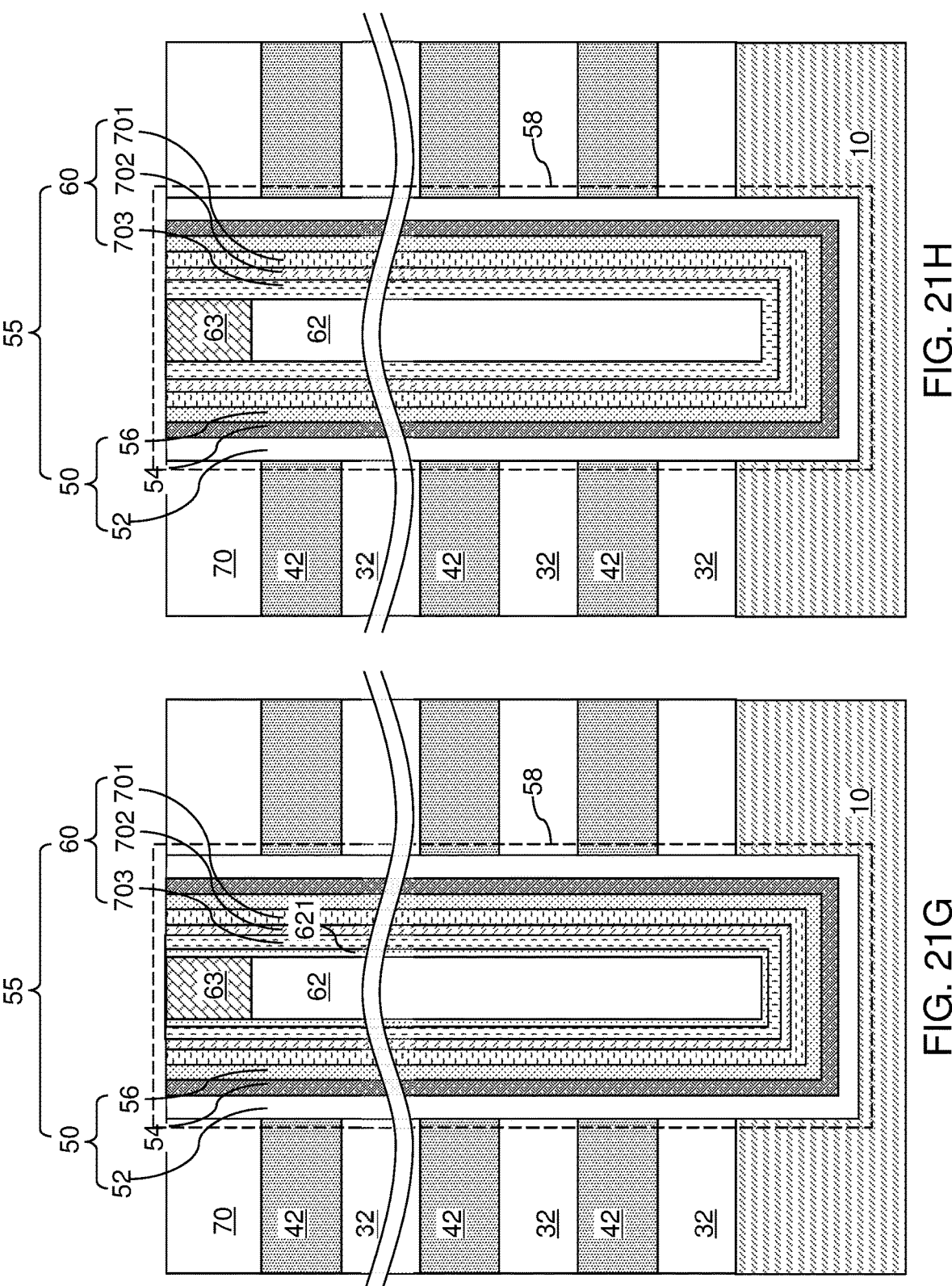

Referring to FIG. 21G, a second alternative configuration of the memory opening fill structure 58 for the second exemplary structure is illustrated, which can be derived from the memory opening fill structure 58 illustrated in FIG. 21E by forming an intermediate semiconducting metal oxide channel layer 702 having a graded band gap. As discussed above, the second band gap is greater than the first band gap. In one embodiment, the entire range of the graded band gap can be greater than the first band gap, and can be less than the second band gap. In other words, the minimum value of the graded band gap can be greater than the first band gap, and the maximum value of the graded band gap can be less than the second band gap. Subsequently, the inner semiconducting metal oxide channel layer 703 can be formed on the intermediate semiconducting metal oxide channel layer 702. Thus, the intermediate semiconducting metal oxide channel layer 702 can be formed between the outer semiconducting metal oxide channel layer 701 and the inner semiconducting metal oxide channel layer 703. The thickness of the intermediate semiconducting metal oxide channel layer 702 may be in a range from 1.5 nm to 3.0 nm, although lesser and greater thicknesses may also be employed.

In one embodiment, the value of the graded band gap increases with a distance from an interface between the intermediate semiconducting metal oxide channel layer 702 and the outer semiconducting metal oxide channel layer 701 toward an interface between the intermediate semiconducting metal oxide channel layer 702 and the inner semiconducting metal oxide channel layer 703. In an illustrative example, the outer semiconducting metal oxide channel layer 701 comprises zinc oxynitride, and the inner semiconducting metal oxide channel layer 703 comprises indium gallium zinc oxide. In this case, the intermediate semiconducting metal oxide channel layer 702 may comprise indium gallium zinc oxide or indium gallium zinc oxynitride in which an atomic percentage of gallium and indium increases with the distance from the outer semiconducting metal oxide channel layer 701. Optionally, an atomic percentage of zinc and/or nitrogen (if present in layer 702) decreases with a distance from the outer semiconducting metal oxide channel layer 701. Thus, within the intermediate semiconducting metal oxide channel layer 702, the magnitude of the band gap gradually increases with an increase in the distance from the interface with the outer semiconducting metal oxide channel layer 701.

Referring to FIG. 21H, a third alternative configuration of the memory opening fill structure 58 for the second exemplary structure is illustrated, which can be derived from the memory opening fill structure 58 illustrated in FIG. 21G by omitting formation of the interfacial dielectric liner 621.

Referring collectively to FIGS. 21E-21H, the doping of the outer semiconducting metal oxide channel layer 701 and the inner semiconducting metal oxide channel layer 703 can be controlled such that the atomic concentration of free charge carriers within the outer semiconducting metal oxide channel layer 701 is greater than, such as at least three times greater than the atomic concentration of free charge carriers within the inner semiconducting metal oxide channel layer 703. In this case, the valence band in the vertical composite metal oxide semiconductor channel 60 can be raised above the energy level generated by point defects within the inner semiconducting metal oxide channel layer 703, and thus, provide improved electrical performance of the vertical composite metal oxide semiconductor channel 60. Specifically, the vertical composite metal oxide semiconductor channel 60 of the embodiments of the present disclosure can provide higher cell current, low subthreshold slope, low leakage, and therefore superior performance, reliability and variability relative to prior art structures including a semiconductor channel having a homogeneous semiconducting metal oxide material.

In one embodiment, the memory film 50 has a cylindrical inner sidewall that vertically extends through each of the sacrificial material layers 42 within the alternating stack (32, 42), and is in contact with the outer semiconducting metal oxide channel layer 701. In one embodiment, a drain region 63 can contact an upper end of the vertical composite metal oxide semiconductor channel 60 within each memory opening fill structure.

Figure 22A:
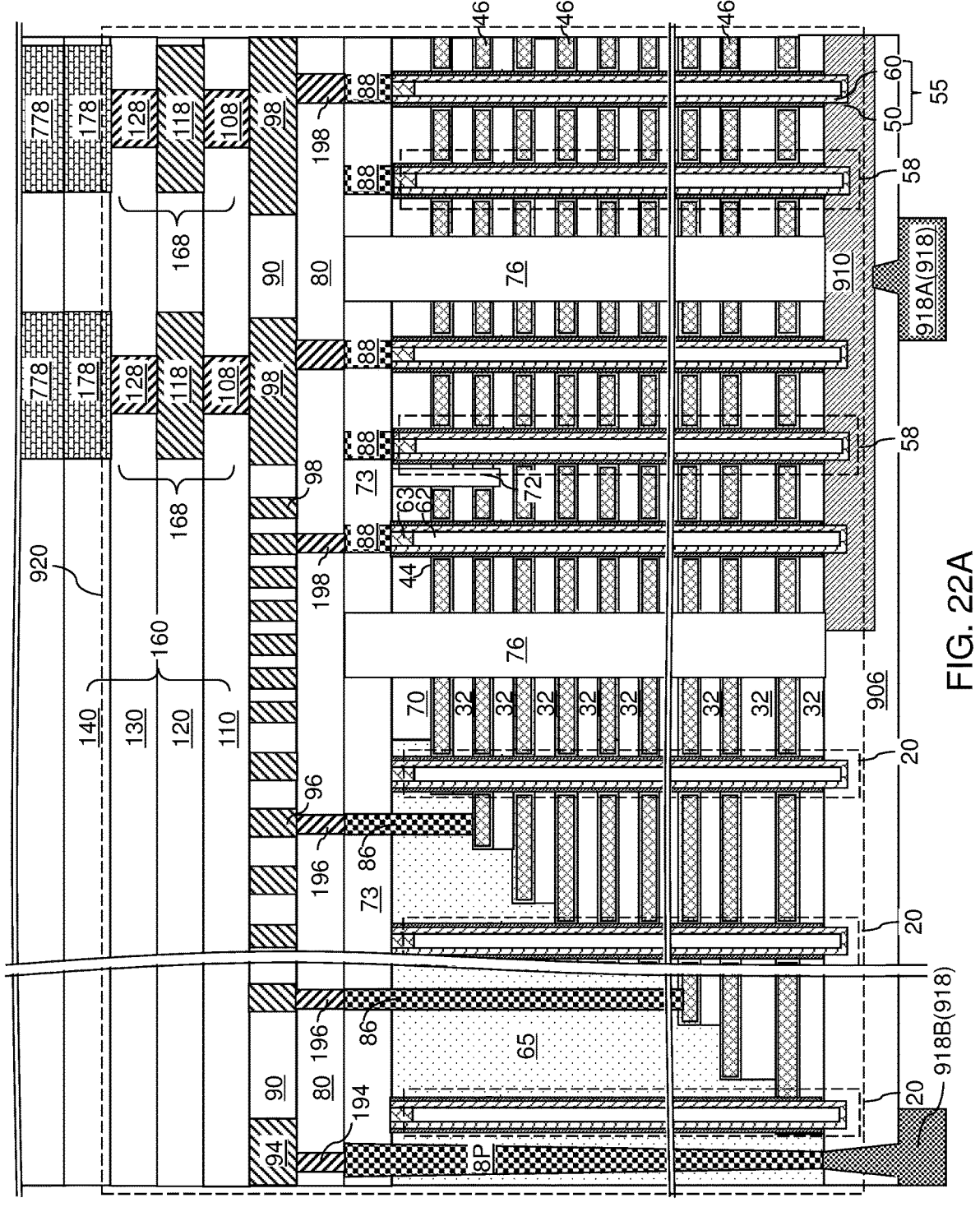
FIG. 22A is a schematic vertical cross-sectional view of the second exemplary structure after formation of a source layer and backside bonding structures according to the second embodiment of the present disclosure.
Figure 22B:
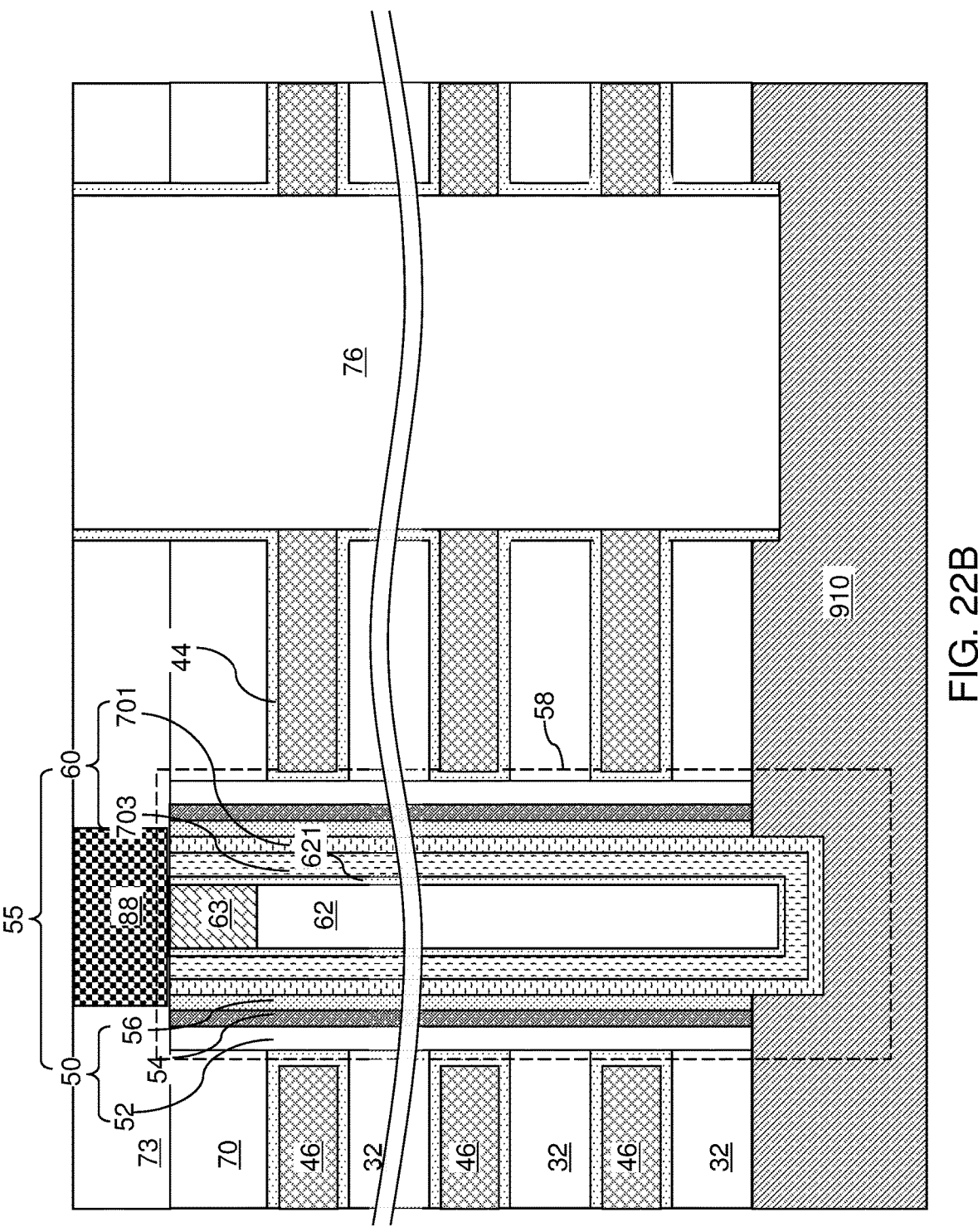
FIG. 22B is a magnified view of a region of the second exemplary structure of FIG. 22A.

Referring to FIGS. 22A and 22B, the processing steps described with respect to FIGS. 8A and 8B, 9, 10, 11A and 11B, 12A-12C, 13A and 13B, 14A and 14B, 15, 16, 17, 18, and 19 can be performed. In one embodiment, a source region (which may be comprise a semiconductor material layer 910) having a doping of a same conductivity type as the drain region 63 may be formed such that the source region contacts a lower end of each vertical composite metal oxide semiconductor channel 60.

Figure 22C:
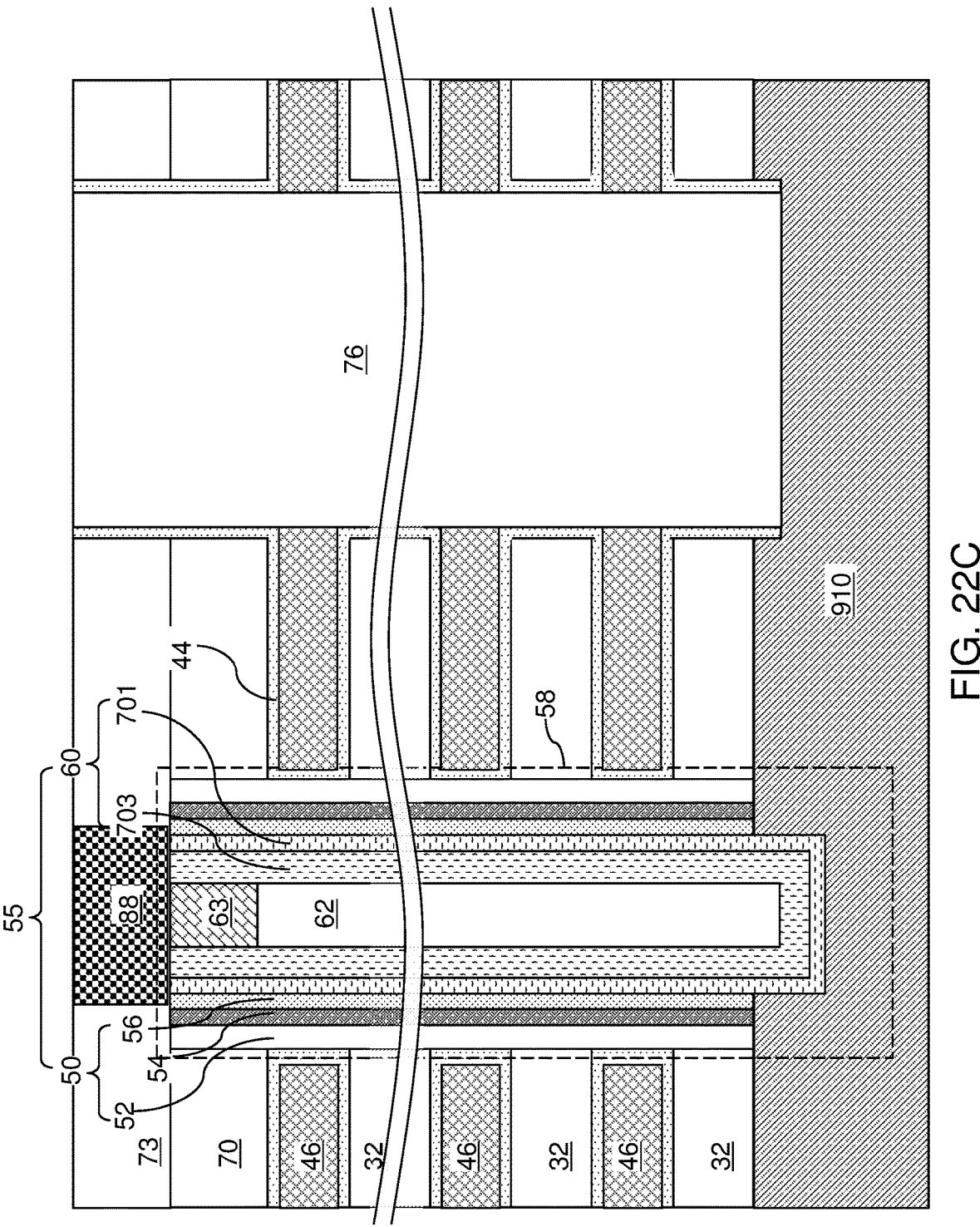
FIGS. 22C-22E are magnified views of alternative configurations of the second exemplary structure at the processing steps of FIG. 22A.

Referring to FIG. 22C, a first alternative configuration of the second exemplary structure can be derived from the second exemplary structure illustrated in FIGS. 22A and 22B by employing the first alternative configuration of the memory opening fill structure 58 illustrated in FIG. 21F for each of the memory opening fill structures 58 illustrated in FIG. 22A.

Figure 22D:
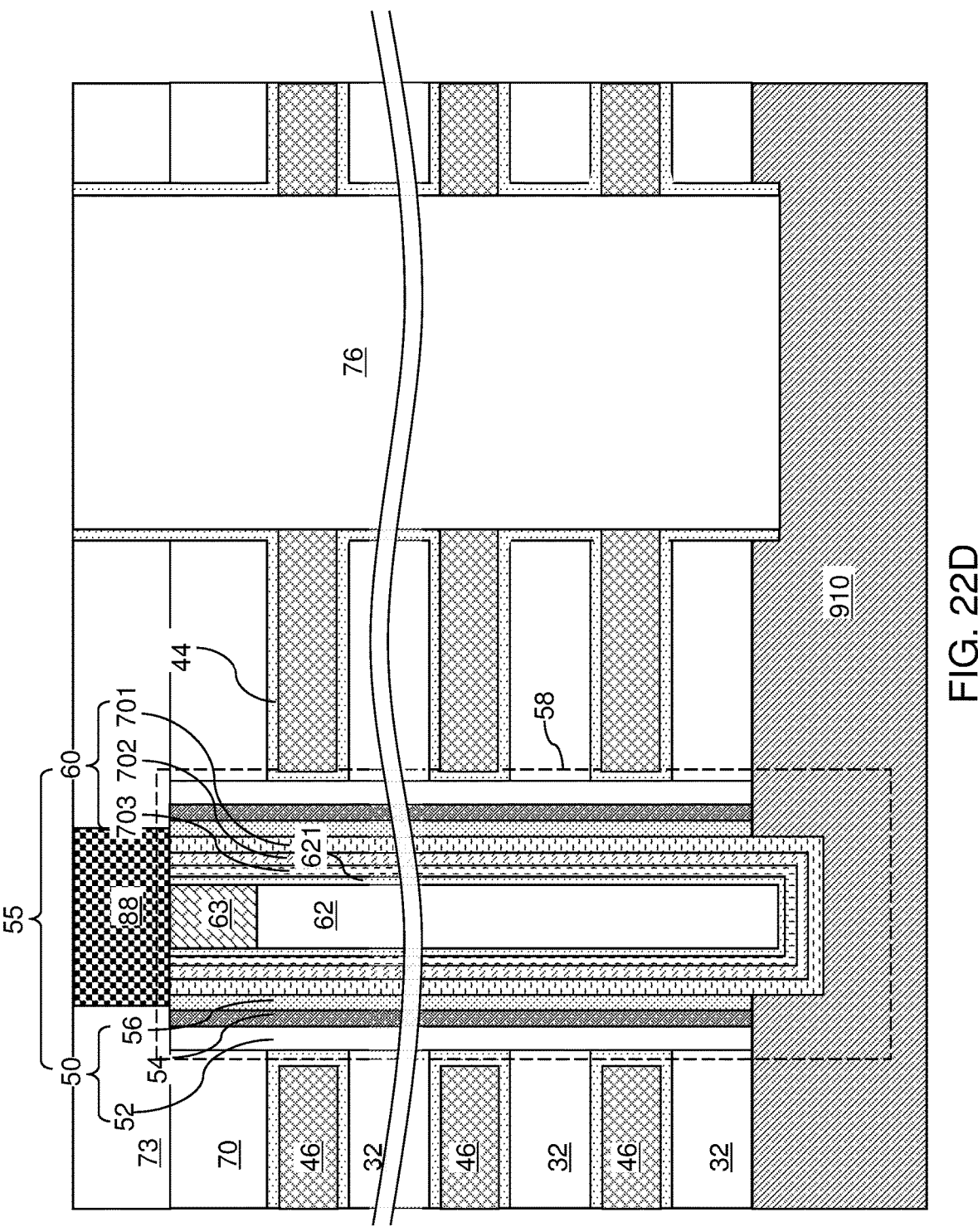

Referring to FIG. 22D, a second alternative configuration of the second exemplary structure can be derived from the second exemplary structure illustrated in FIGS. 22A and 22B by employing the second alternative configuration of the memory opening fill structure 58 illustrated in FIG. 21G for each of the memory opening fill structures 58 illustrated in FIG. 22A.

Figure 22E:
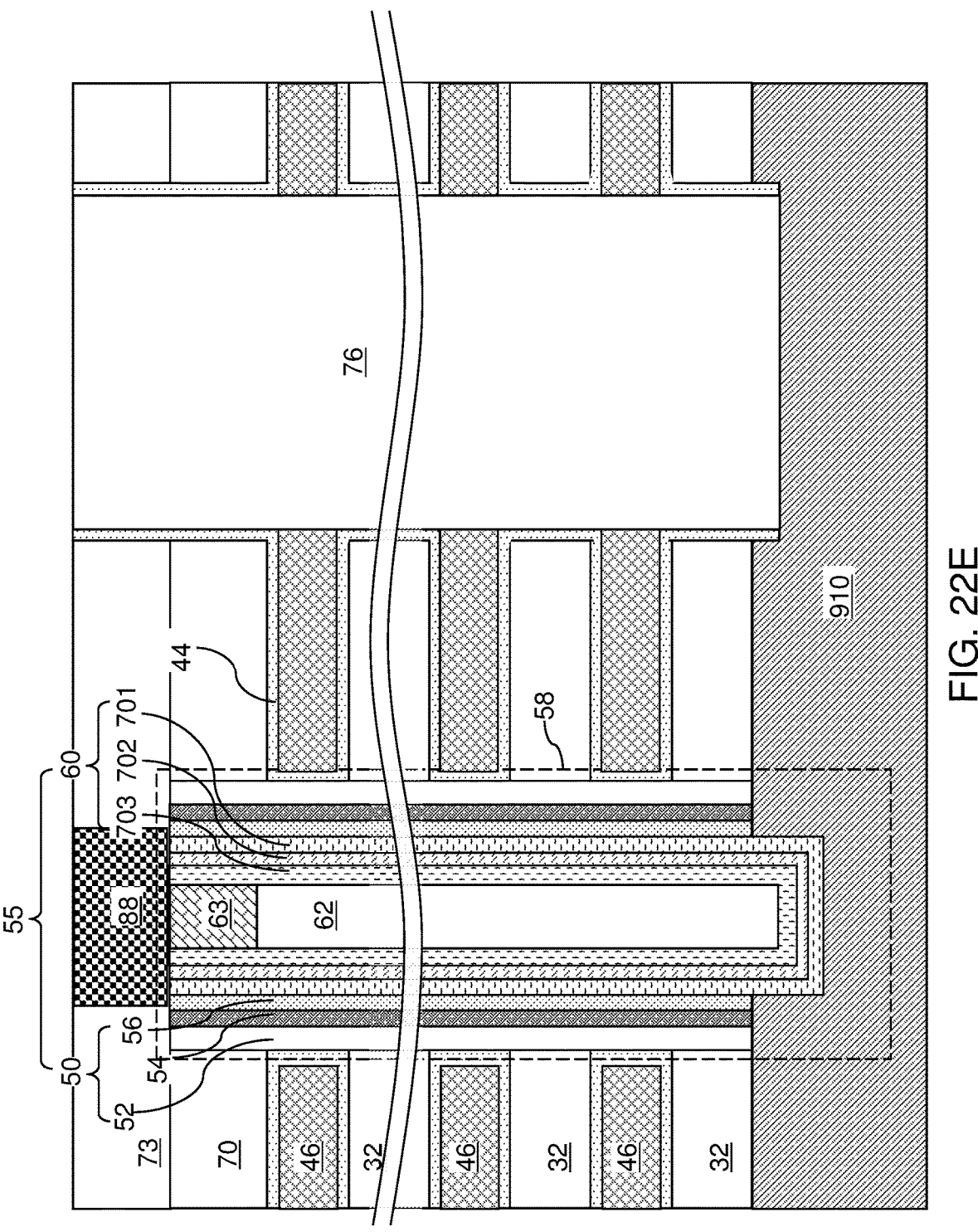

Referring to FIG. 22E, a third alternative configuration of the second exemplary structure can be derived from the second exemplary structure illustrated in FIGS. 22A and 22B by employing the third alternative configuration of the memory opening fill structure 58 illustrated in FIG. 21H for each of the memory opening fill structures 58 illustrated in FIG. 22A.

Figure 23A:
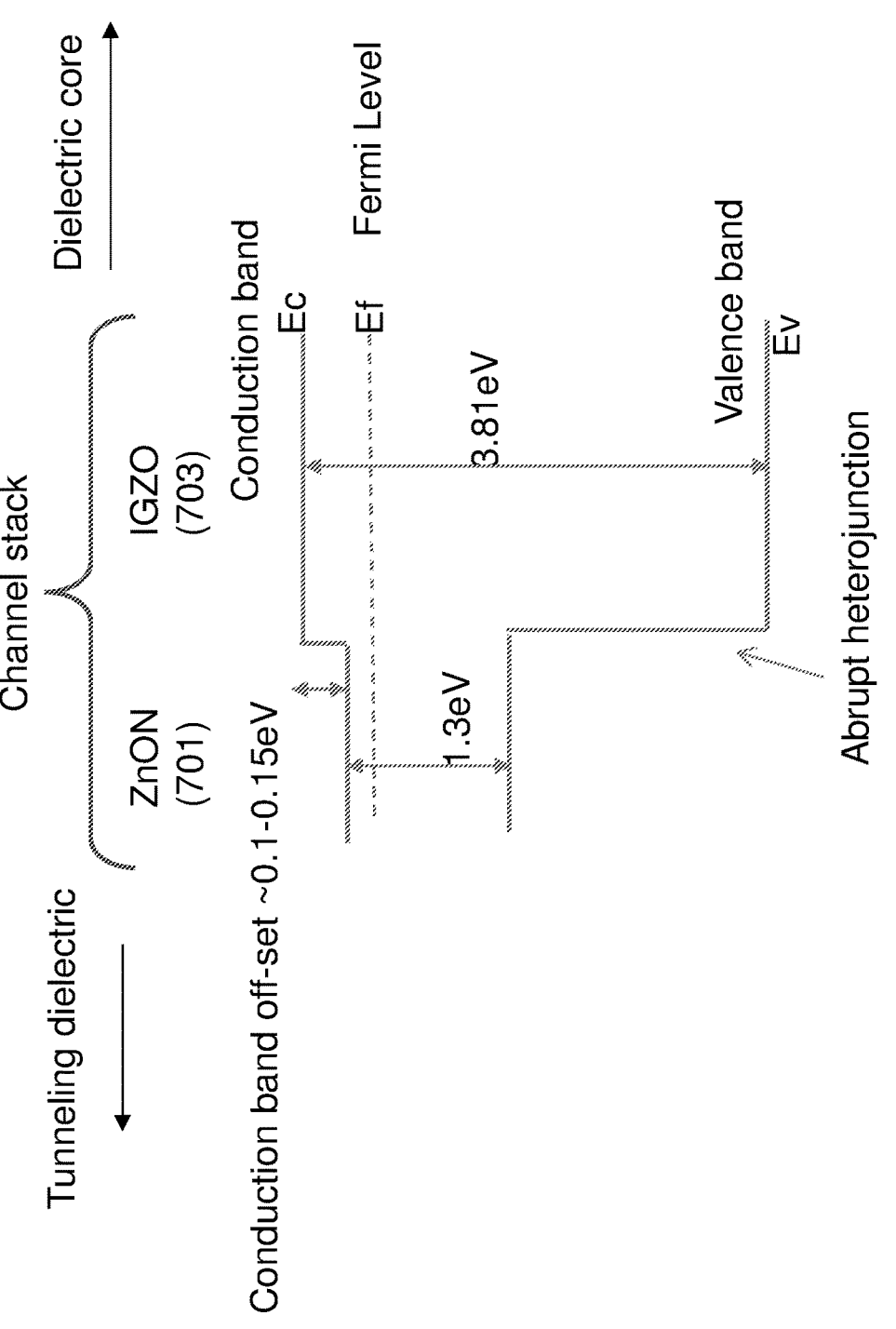
FIG. 23A is a band diagram of a vertical channel in the second exemplary structure according to the second embodiment of the present disclosure.

Referring to FIG. 23A, a band diagram of a vertical channel in the second exemplary structure according to the second embodiment of the present disclosure is illustrated. The band diagram illustrated in FIG. 23A corresponds to the vertical composite metal oxide semiconductor channel 60 illustrated in FIGS. 22B and 22C. In the illustrated example, the outer semiconducting metal oxide channel layer 701 comprises zinc oxynitride, the inner semiconducting metal oxide channel layer 703 comprises indium gallium zinc oxide, and a conduction band offset in a range from 0.10 V to 0.15 V is provided between the outer semiconducting metal oxide channel layer 701 and the inner semiconducting metal oxide channel layer 703. The conduction band offset significantly reduces the effect of point defects within the inner semiconducting metal oxide channel layer 703, and causes a predominant portion of the electrical current to follow through the outer semiconducting metal oxide channel layer 701, thereby reducing the sub-threshold slope of the semiconductor channel.

Figure 23B:
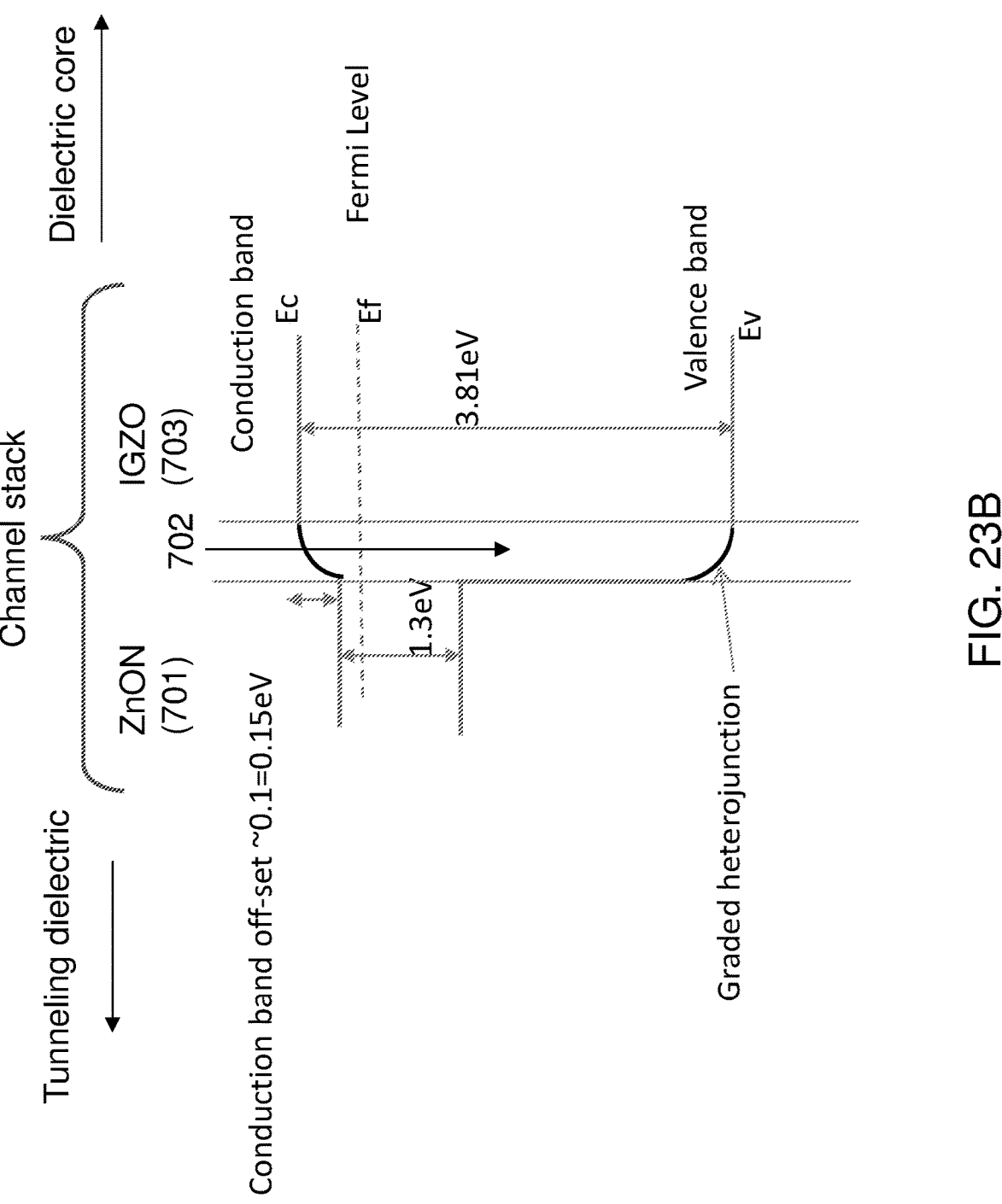
FIG. 23B is a band diagram of an alternative configuration of a vertical channel in the second exemplary structure according to the second embodiment of the present disclosure.

Referring to FIG. 23B, a band diagram of an alternative configuration of a vertical channel in the second exemplary structure according to the second embodiment of the present disclosure is illustrated. The band diagram illustrated in FIG. 23B corresponds to the vertical composite metal oxide semiconductor channel 60 illustrated in FIGS. 22D and 22E. In this case, the band gap comprises a transition region that corresponds to the volume of the intermediate semiconducting metal oxide channel layer 702. The composition of the intermediate semiconducting metal oxide channel layer 702 can change gradually in the transition region, and thus, the band structure changes gradually within the transition region.

Referring to all drawings that are related to the second exemplary structure, a three-dimensional memory device comprises: an alternating stack (32, 46) of insulating layers 32 and electrically conductive layers 46; a memory opening 49 vertically extending through the alternating stack (32, 46); and a memory opening fill structure 58 located in the memory opening 49 and comprising a memory film 50 and a vertical composite metal oxide semiconductor channel 60 comprising an outer semiconducting metal oxide channel layer 701 having a first band gap and an inner semiconducting metal oxide channel layer 703 having a second band gap that is different from the first band gap.

In one embodiment, the first band gap is smaller than the second band gap. In one embodiment, the outer semiconducting metal oxide channel layer 701 comprises zinc oxynitride. In one embodiment, the outer semiconducting metal oxide channel layer 701 has a thickness in a range from 1 nm to 4 nm.

In one embodiment, the inner semiconducting metal oxide channel layer 703 comprises indium gallium zinc oxide, indium zinc tin oxide, or indium gallium zinc tin oxide. In one embodiment, the outer semiconducting metal oxide channel layer 701 has a first thickness; and the inner semiconducting metal oxide channel layer 703 has a second thickness that greater than the first thickness, such as is in a range from 1.5 times the first thickness to 4 times the first thickness.

In one embodiment, the vertical composite metal oxide semiconductor channel 60 comprises an intermediate semiconducting channel layer 702 having a graded band gap and interposed between the outer semiconducting metal oxide channel layer 701 and the inner semiconducting metal oxide channel layer 703. In one embodiment, the second band gap is greater than the first band gap; and an entire range of the graded band gap is greater than the first band gap, and is less than the second band gap.

In one embodiment, a value of the graded band gap increases with a distance from an interface between the intermediate semiconducting channel layer 702 and the outer semiconducting metal oxide channel layer 701 toward an interface between the intermediate semiconducting channel layer 702 and the inner semiconducting metal oxide channel layer 703.

In one embodiment, the outer semiconducting metal oxide channel layer 701 comprises zinc oxynitride; and the inner semiconducting metal oxide channel layer 703 comprises indium gallium zinc oxide. In one embodiment, the intermediate semiconducting channel layer 702 comprises indium gallium zinc oxide or indium gallium zinc oxynitride in which an atomic percentage of gallium and indium increases with the distance from the outer semiconducting metal oxide channel layer 701.

In one embodiment, the memory film 50 has a cylindrical inner sidewall that vertically extends through each of the electrically conductive layers 46 within the alternating stack (32, 46) and is in contact with the outer semiconducting metal oxide channel layer 701.

In one embodiment, an atomic concentration of free charge carriers within the outer semiconducting metal oxide channel layer 701 is greater than, such as at least three times an atomic concentration of free charge carriers within the inner semiconducting metal oxide channel layer 703.

In one embodiment, the semiconductor structure further comprises a drain region 63 contacting an upper end of the vertical composite metal oxide semiconductor channel 60. In one embodiment, the semiconductor structure further comprises a source region (such as the semiconductor material layer 910) having a doping of a same conductivity type as the drain region 63 and contacting a lower end of the vertical composite metal oxide semiconductor channel 60.

Figure 24:
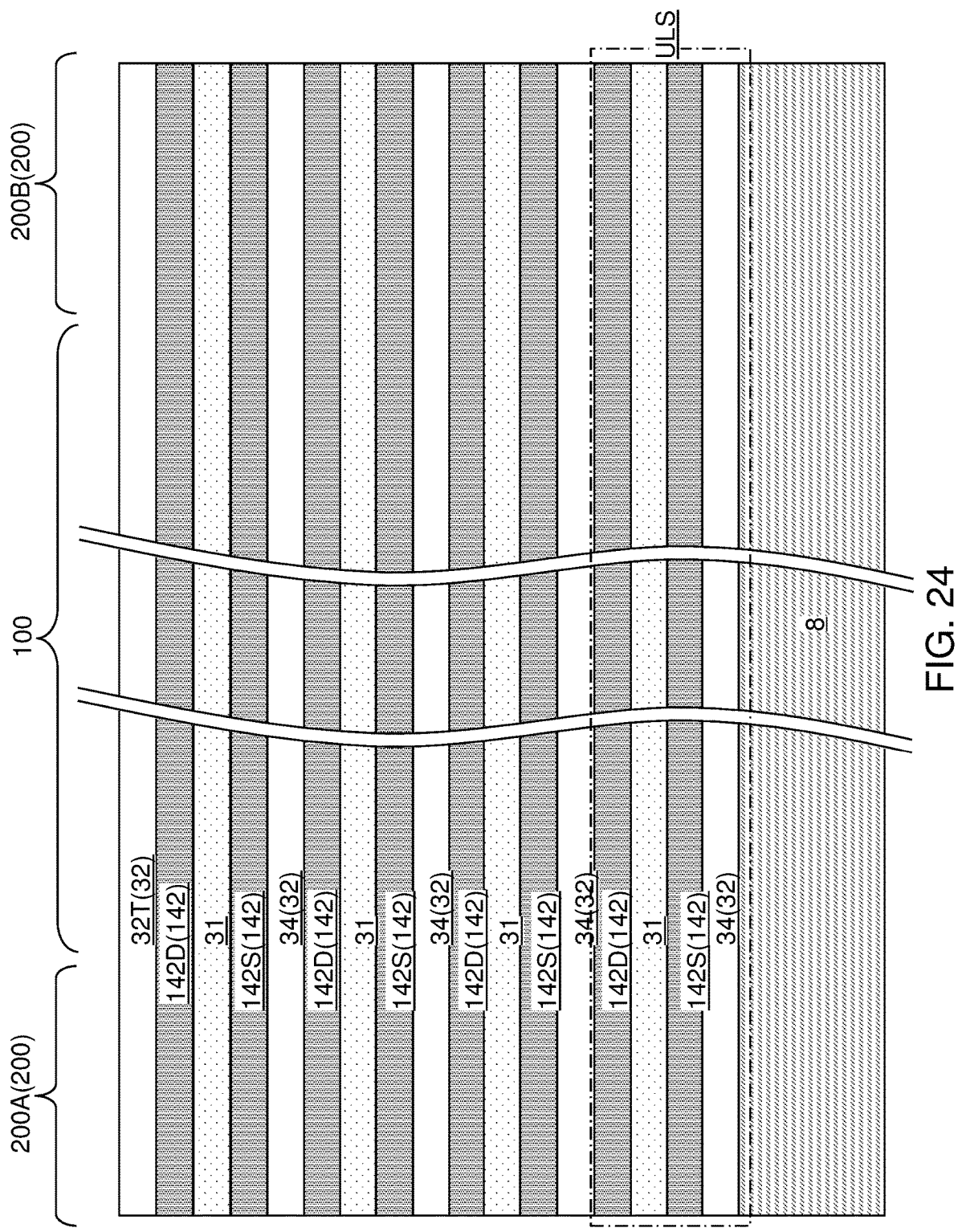
FIG. 24 is a vertical cross-sectional view of a third exemplary structure after formation of a plurality of a unit layer stack including a vertical-isolation insulating layer, a source-level material layer, a channel-level sacrificial layer, and a drain-level material layer according to a third embodiment of the present disclosure.

Referring to FIG. 24, a third exemplary structure according to a third embodiment of the present disclosure comprise a substrate 8, or may be a semiconductor substrate including a substrate semiconductor layer. One or more instances of a unit layer stack ULS can be formed over the top surface of the substrate 8. In one embodiment, the one or more instances of the unit layer stack ULS comprise a plurality of instances of the unit layer stack ULS that are vertically stacked. As used herein, a "unit layer stack" refers to a layer stack of multiple layers that functions as a unit of repetition within a structure in which multiple instances of the layer stack is repeated.

The unit layer stack ULS can include a vertical-isolation insulating layer 34, a source-level material layer, a channel-level sacrificial layer 31, and a drain-level material layer. Within each unit layer stack ULS, the drain-level material layer is vertically spaced from the source-level material layer by the channel-level sacrificial layer 31. Within each unit layer stack ULS, the drain-level material layer and the source-level material layer may contact the channel-level sacrificial layer 31. The vertical-isolation insulating layer 34 may be the bottommost layer or the topmost layer within each unit layer stack ULS.

Generally, one or more instances of a unit layer stack ULS can be formed over a substrate 8. The unit layer stack comprises a vertical-isolation insulating layer 34, a source-level material layer, a channel-level sacrificial layer 31, and a drain-level material layer. Each source-level material layer is formed as or is subsequently replaced with a source layer, and each drain-level material layer is formed as or is subsequently replaced with a drain layer. In one embodiment, the one or more instances of the unit layer stack ULS may comprise a plurality of instances of the unit layer stack ULS that are stacked along a vertical direction and located over a horizontal top surface of a substrate 8.

In case each source-level material layer is subsequently replaced with a source layer and each drain-level material layer is subsequently replaced with a drain layer, each source-level material layer may be formed as a source-level sacrificial material layer 142S and each drain-level material layer may be formed as a drain-level sacrificial material layer 142D. In this case, the unit layer stack ULS can include a vertical-isolation insulating layer 34, a source-level sacrificial material layer 142S, a channel-level sacrificial layer 31, and a drain-level sacrificial material layer 142D. The source-level sacrificial material layers 142S and the drain-level sacrificial material layers 142D are collectively referred to as sacrificial material layers 142. A topmost insulating layer 32T may be formed in lieu of the vertical-isolation insulating layer 34 for the topmost unit layer stack ULS. The topmost insulating layer 32T may have a same material composition and a same thickness range as the vertical-isolation insulating layers 34.

While an embodiment is described in which each source-level material layer is formed as a source-level sacrificial material layer 142S and each drain-level material layer is formed as a drain-level sacrificial material layer 142D, alternatively embodiments are expressly contemplated herein in which the each source-level material layer is formed as a source layer (comprising a conductive material, such as heavily doped semiconductor, metal, metal alloy and/or conductive metal nitride layer) and each drain-level material layer is formed as a drain layer (comprising a conductive material such as heavily doped semiconductor, metal, metal alloy and/or conductive metal nitride layer). Generally, the drain-level material layer may overlie or underlie the source-level material layer within each unit layer stack ULS. While an embodiment is described in which the drain-level material layer overlies the source-level material layer within each unit layer stack ULS, alternative embodiments are expressly contemplated herein in which the source-level material layer overlies the drain-level material layer within each unit layer stack ULS.

The number of repetitions of the unit layer stack ULS in the multiple instances of the unit layer stack ULS may be in a range from 2 to 1,024, such as from 8 to 128, although lesser and greater numbers of repetitions can also be employed. The total number of repetitions of the unit layer stack ULS can be the same as the total number of levels of vertical charge storage field effect transistors to be subsequently formed, which can be the same as the total number of levels of memory elements to be subsequently formed. As used herein, a "level" refers to a volume of a device located between a horizontal plane including a top surface of an element of the device and a horizontal plane including a bottom surface of the element of the device.

A vertical-isolation insulating layer 34 is an insulating layer that is located between two vertically separated charge storage field effect transistors (e.g., NOR memory transistors). Each of the vertical-isolation insulating layer 34 includes a respective insulating material, such as a doped silicate glass, undoped silicate glass (e.g., silicon oxide), a metal oxide (e.g., aluminum oxide) or organosilicate glass. The thickness of each vertical-isolation insulating layers 34 can be in a range from 10 nm to 60 nm, although lesser and greater thicknesses can also be employed.

Each channel-level sacrificial layer 31 is subsequently replaced by a semiconductor channel and is located between a horizontal plane including a top surface of a semiconductor channel to be subsequently formed and a horizontal plane including a bottom surface of the semiconductor channel is to be subsequently formed. The thickness of each channel-level sacrificial layer 31 can be in a range from 20 nm to 80 nm. The channel-level sacrificial layers 31 comprise a sacrificial material, which is herein referred to as a first to sacrificial material, or as a channel-level sacrificial material. The channel-level sacrificial layers 31 comprise a material that may be subsequently removed selective to the material of the vertical-isolation insulating layers 34 and the topmost insulating layer 32T, and a selective to the material of the source-level material layers and the drain-level material layers.

For example, if the vertical-isolation insulating layers 34 and the topmost insulating layer 32T comprise undoped silicate glass, then the channel-level sacrificial layers 31 may comprise a doped silicate glass (such as borosilicate glass), organosilicate glass, amorphous silicon, a silicon-germanium alloy, amorphous carbon, a polymer material, etc. If the vertical-isolation insulating layers 34 and the topmost insulating layer 32T comprise undoped silicate glass and the channel-level sacrificial layers 31 comprise a doped silicate glass (such as borosilicate glass) or organosilicate glass, the etch rate of the material of the channel-level sacrificial layers 31 in 100:1 diluted hydrofluoric acid can be at least 10 times, such as 100 or more times, greater than the etch rate of the material of the vertical-isolation insulating layers 34 in 100:1 diluted hydrofluoric acid. In another embodiment, the vertical-isolation insulating layers 34 can comprise silicon oxide, and the channel-level sacrificial layers 31 can comprise a semiconductor material, such as amorphous silicon or a silicon-germanium alloy.

In case the source-level material layers are formed as source-level sacrificial materials 142S and the drain-level material layers are formed as drain-level sacrificial material layers 142D, then the source-level sacrificial material layers 142S and the drain-level sacrificial material layers 142D include a sacrificial material that can be removed selective to the materials of the channel-level sacrificial layer 31, the vertical-isolation insulating layers 34 and the topmost insulating layer 32T. The sacrificial material of the source-level sacrificial material layers 142S and the drain-level sacrificial material layers 142D is herein referred to as the second sacrificial material, or as a source/drain-level sacrificial material. The second sacrificial material is different from the second sacrificial material in composition.

For example, if the vertical-isolation insulating layers 34 and the topmost insulating layer 32T include undoped silicate glass (i.e., silicon oxide) and the channel-level sacrificial layer 31 includes doped silicate glass or a semiconductor material, then the source-level sacrificial material layers 142S and the drain-level sacrificial material layers 142D can include silicon nitride. The thickness of each source-level sacrificial material layer 142S can be in a range from 10 nm to 50 nm, such as from 20 nm to 30 nm, and the thickness of each and the thickness of each drain-level sacrificial material layer 142D can be in a range from 10 nm to 50 nm, such as from 20 nm to 30 nm, although lesser and greater thicknesses can also be employed. Alternatively, the source-level sacrificial material layers 142S and the drain-level sacrificial material layers 142D can include a semiconductor material, such as amorphous silicon, if the channel-level sacrificial layer 31 includes silicon nitride.

The third exemplary structure can include at least one memory array region 100 in which a three-dimensional array of memory elements is to be subsequently formed, and staircase regions (200A, 200B) in which stepped surfaces of the multiple instances of the unit layer stack ULS (34, 142S, 31, 142D) are to be subsequently formed. The staircase regions may include a source side staircase region 200A and a drain side staircase region 200B.

Figure 25:
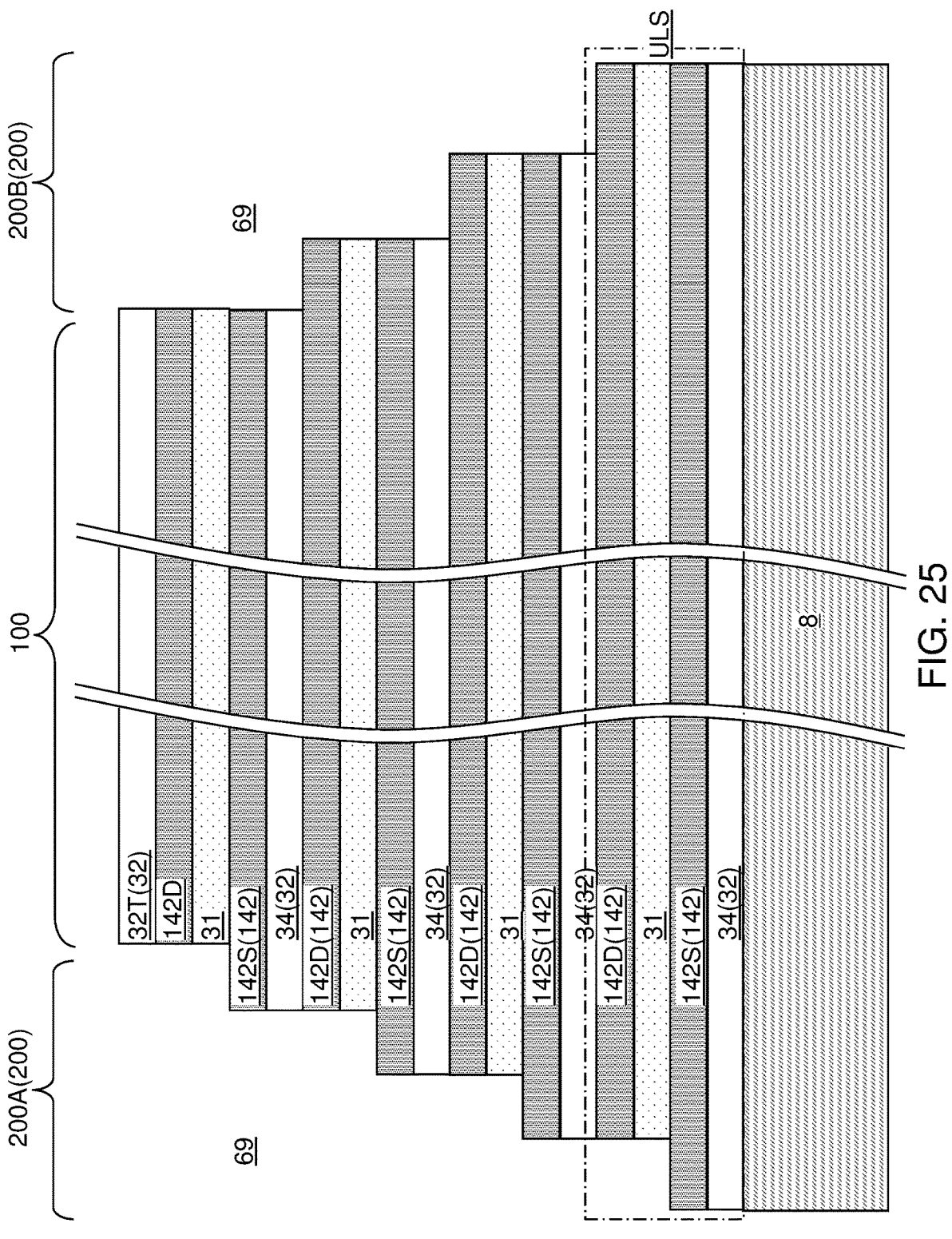
FIG. 25 is a vertical cross-sectional view of the third exemplary structure after formation of stepped surfaces according to a the third embodiment of the present disclosure.

Referring to FIG. 25, the multiple instances of the unit layer stack ULS can be patterned for form stepped surfaces in the staircase regions (200A, 200B). For example, a trimmable mask layer (not shown) can be formed over the third exemplary structure, and can be patterned to cover each memory array region 100 and proximal portions of the staircase regions (200A, 200B) such that the edges of the trimmable mask layer are formed at location at which outermost vertical steps of stepped surfaces are to be subsequently formed. An anisotropic etch process can be performed to etch through one unit layer stack ULS within areas that are not covered by the trimmable mask layer. The trimmable mask layer can be isotropically trimmed so that edges of the trimmable mask layer are formed at which second outermost vertical steps of the stepped surfaces are to be subsequently formed. An anisotropic etch process can be performed to etch through one unit layer stack ULS within areas that are not covered by the trimmable mask layer. The isotropic trimming process for the trimmable mask layer and the anisotropic etch process can be repeatedly performed to form stepped surfaces within each of the staircase regions (200A, 200B).

In one embodiment, stepped surfaces in a pair of staircase regions (200A, 200B) located on each side of a memory array region 100 can be vertically offset such that one type of surfaces are physically exposed in one of the staircase regions (200A, 200B) and another type of surfaces are physically exposed in another of the staircase regions (200A, 200B). For example, horizontal surfaces of source-level sacrificial material layers 142S can be physically exposed in the source side staircase region 200A adjacent to one side of the memory array region 100, and horizontal surfaces of drain-level sacrificial material layers 142D can be physically exposed in the drain side staircase region 200B adjacent to the opposite side of the memory array region 100.

Stepped cavities 69 having stepped bottom surfaces can be formed in the staircase regions (200A, 200B). The lateral extent of each type of layer within the multiple instances of the unit layer stack ULS can decrease with a vertical distance from the substrate 8 upon patterning the stepped surfaces on the multiple instances of the unit layer stack ULS. The trimmable mask layer can be removed after forming the topmost vertical steps.

Lateral extents of the source-level sacrificial material layers 142S within the multiple instances of the unit layer stack ULS decrease with a vertical distance from the horizontal top surface of the substrate 8. Lateral extents of the drain-level sacrificial material layers 142D within the multiple instances of the unit layer stack ULS decrease with a vertical distance from the horizontal top surface of the substrate 8. The multiple instances of the unit layer stack ULS comprises stepped surfaces including horizontal surface segments and vertical surface segments that are interconnected among one another.

Figure 26A:
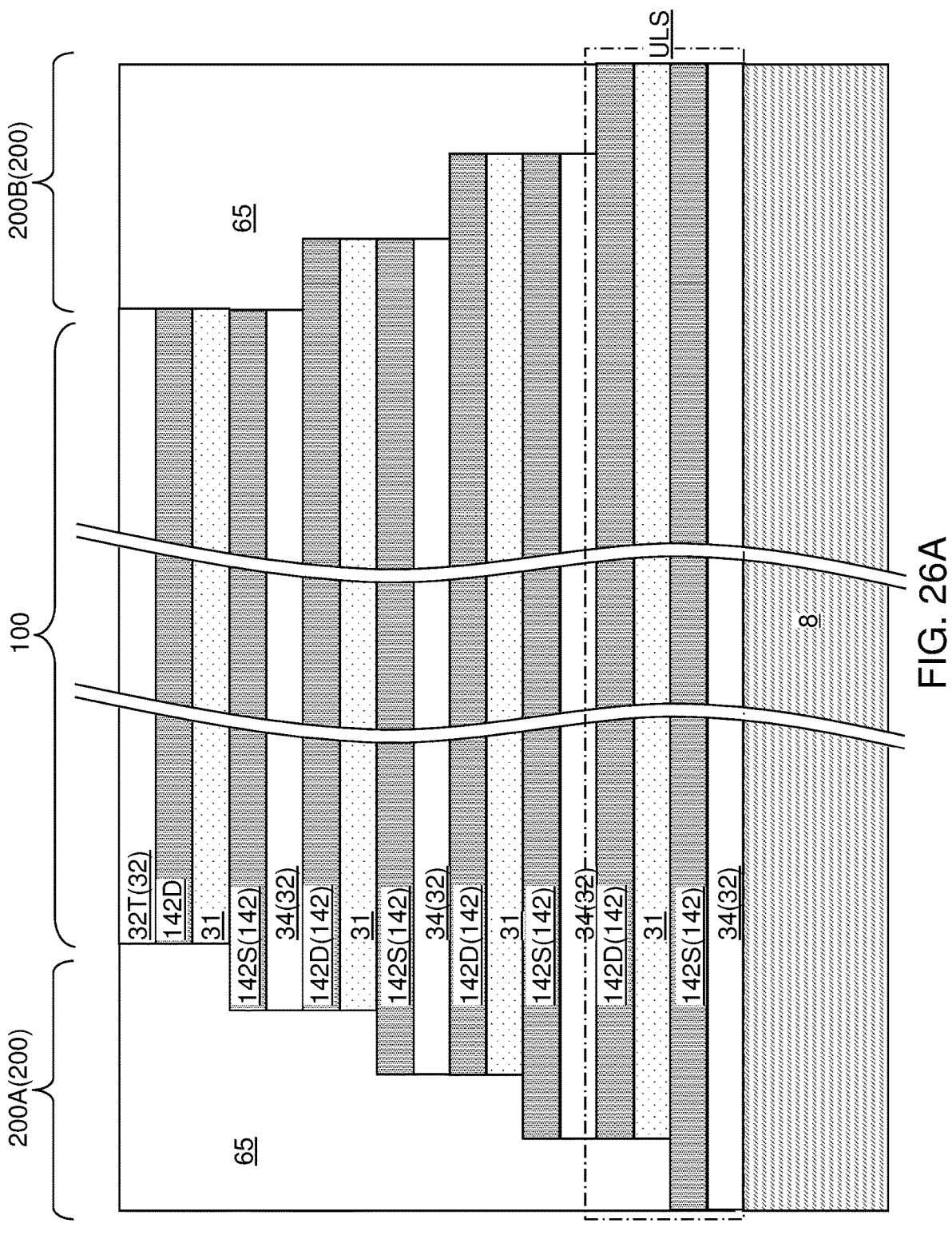
FIG. 26A is a vertical cross-sectional view of the third exemplary structure after formation of retro-stepped dielectric material portions according to the third embodiment of the present disclosure.
Figure 26B:
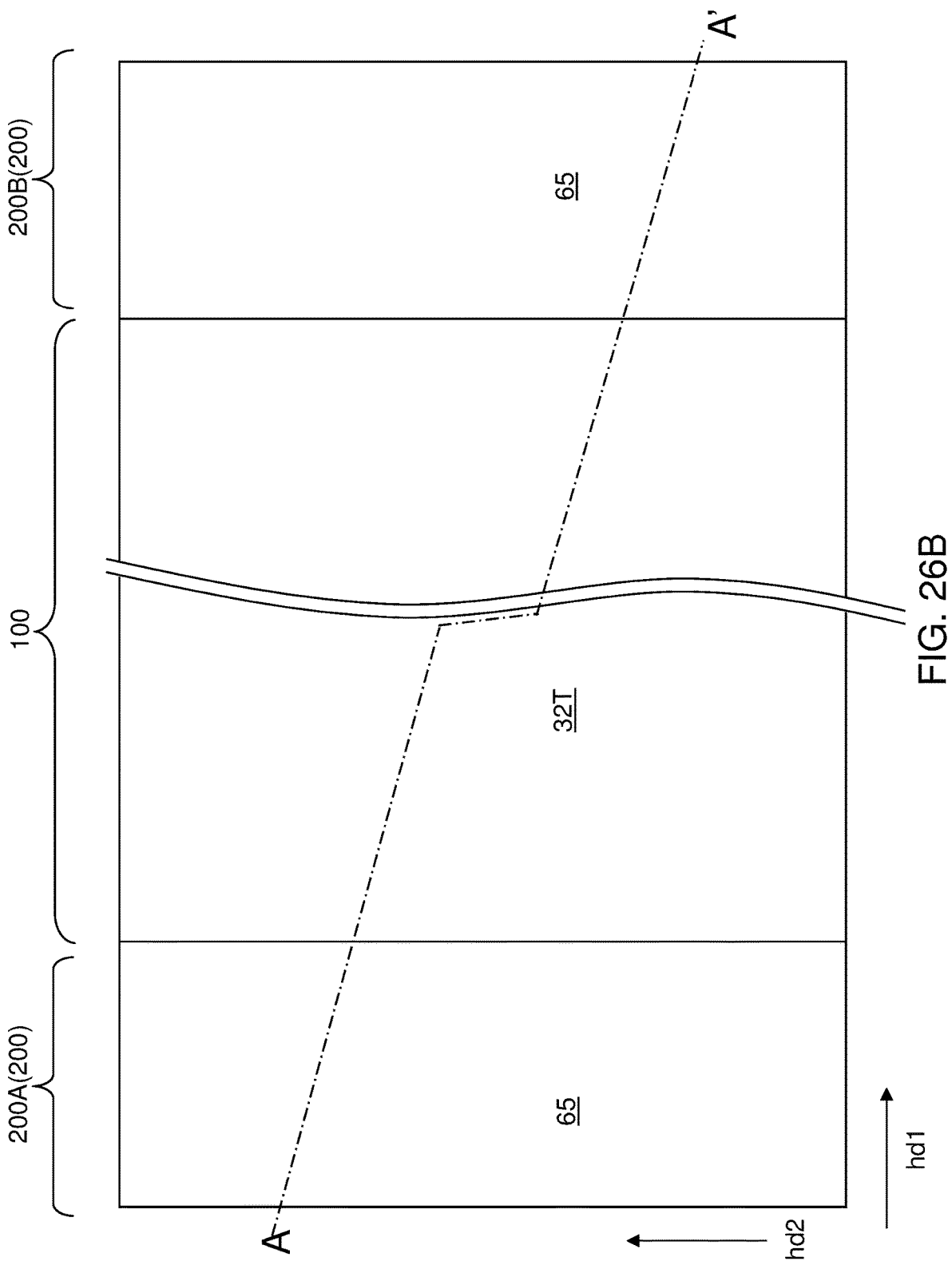
FIG. 26B is a top-down view of the third exemplary structure of FIG. 26A. The vertical plane A-A' is the plane of the vertical cross-sectional view of FIG. 26A.

Referring to FIGS. 26A and 26B, a retro-stepped dielectric material portion 65 (i.e., an insulating fill material portion) can be formed in each stepped cavity 69 by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). Each remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate 8 on which the element is present. If silicon oxide is employed for the retro-stepped dielectric material portion 65, the silicon oxide of the retro-stepped dielectric material portion 65 may, or may not, be doped with dopants such as B, P, and/or F.

Figure 27A:
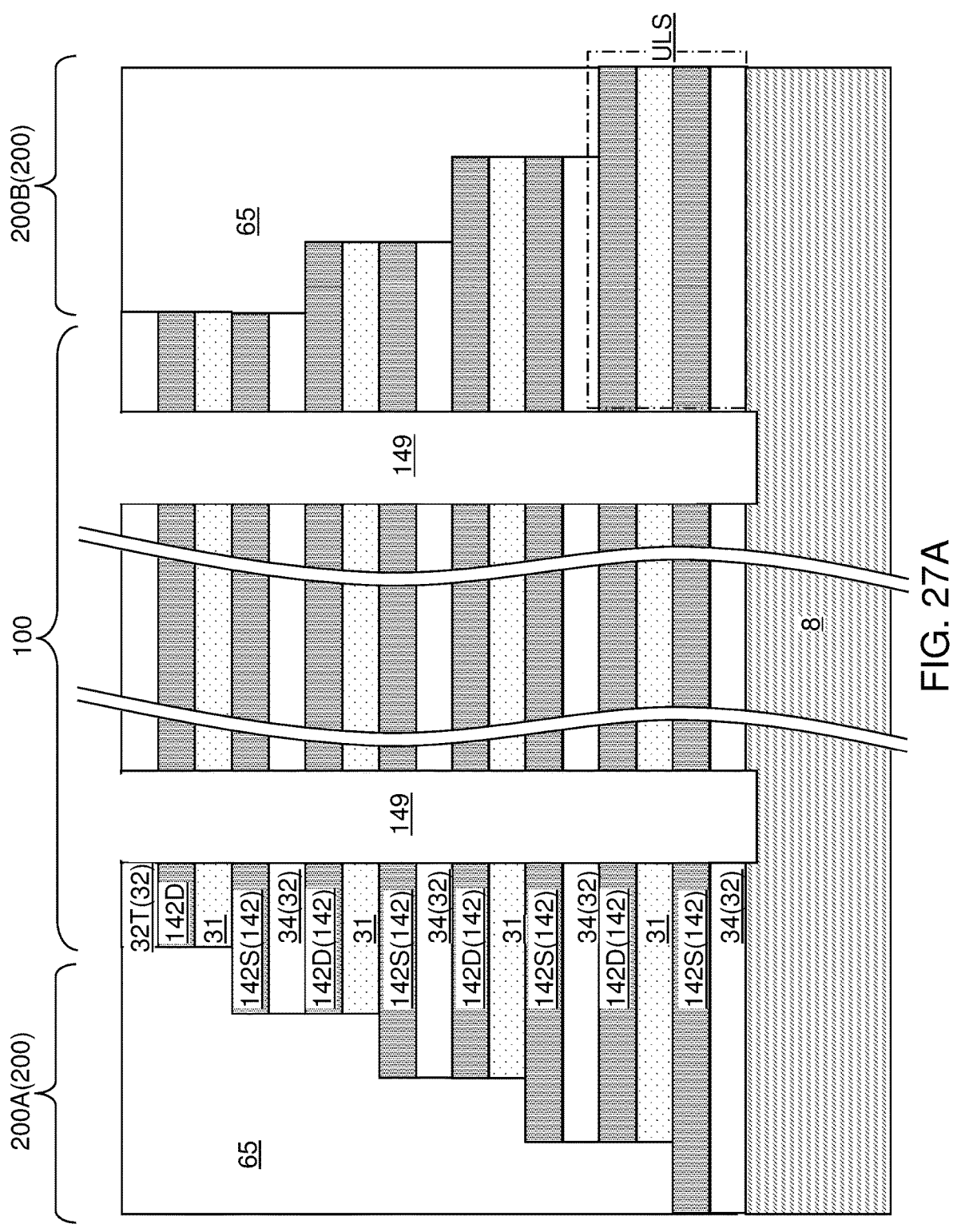
FIG. 27A is a vertical cross-sectional view of the third exemplary structure after formation of memory openings according to the third embodiment of the present disclosure.
Figure 27B:
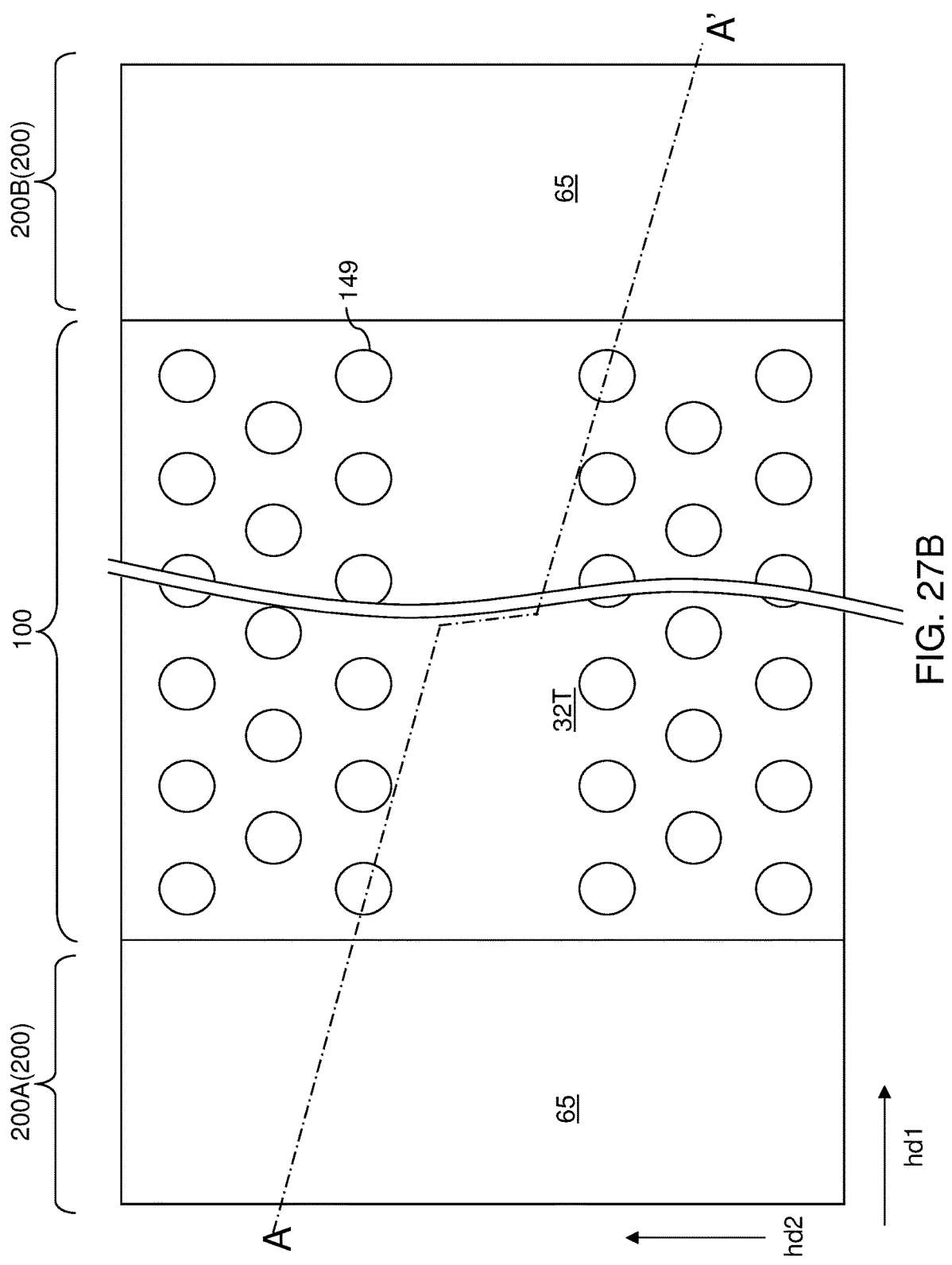
FIG. 27B is a top-down view of the third exemplary structure of FIG. 27A. The vertical plane A-A' is the plane of the vertical cross-sectional view of FIG. 27A.

Referring to FIGS. 27A and 27B, a lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and an optional second set of openings formed over the staircase regions (200A, 200B). The pattern in the lithographic material stack can be transferred through the topmost insulating layer 32T and the multiple instances of the unit layer stack ULS by at least one anisotropic etch that employs the patterned lithographic material stack as an etch mask. Portions of the multiple instances of the unit layer stack ULS located in the memory array region 100 and underlying the first set of openings in the patterned lithographic material stack are etched to form memory openings 149. The memory openings 149 are formed through the topmost insulating layer 32T and the entirety of the multiple instances of the unit layer stack ULS in the memory array region 100. Unmasked regions of the multiple instances of the unit layer stack ULS and the retro-stepped dielectric material portions 65 located in the staircase regions (200A, 200B) that underlie the second set of openings in the patterned lithographic material stack can be etched to form optional support openings (not shown). The maximum lateral dimension (such as a diameter of a major axis) of each memory opening 149 may be in a range from 60 nm to 600 nm, such as from 120 nm to 300 nm, although lesser and greater maximum lateral dimensions may also be employed.

The memory openings 149 extend through the entirety of the multiple instances of the unit layer stack ULS. The chemistry of the anisotropic etch process employed to etch through the materials of the multiple instances of the unit layer stack ULS can alternate to optimize etching of the respective materials in the multiple instances of the unit layer stack ULS. The anisotropic etch can be, for example, a series of reactive ion etches. The sidewalls of the memory openings 149 can be substantially vertical, or can be tapered. The patterned lithographic material stack can be subsequently removed, for example, by ashing.

The memory openings 149 can extend from the top surface of the multiple instances of the unit layer stack ULS to at least the horizontal plane including the topmost surface of the substrate 8. Each of the memory openings 149 may include a sidewall (or a plurality of sidewalls) that extends substantially perpendicular to the topmost surface of the substrate 8. A two-dimensional array of memory openings 149 can be formed in the memory array region 100 through the multiple instances of the unit layer stack ULS. Thus, the two-dimensional array of memory openings 149 can be formed through the alternating stack of the source-level sacrificial material layers 142S and the drain-level sacrificial material layers 142D. In one embodiment, the two-dimensional array of memory openings 149 can be formed as clusters of periodic two-dimensional arrays such as hexagonal arrays. Generally, at least one memory opening 149 can be formed through the one or more instances of the unit layer stack ULS.

Figure 28:
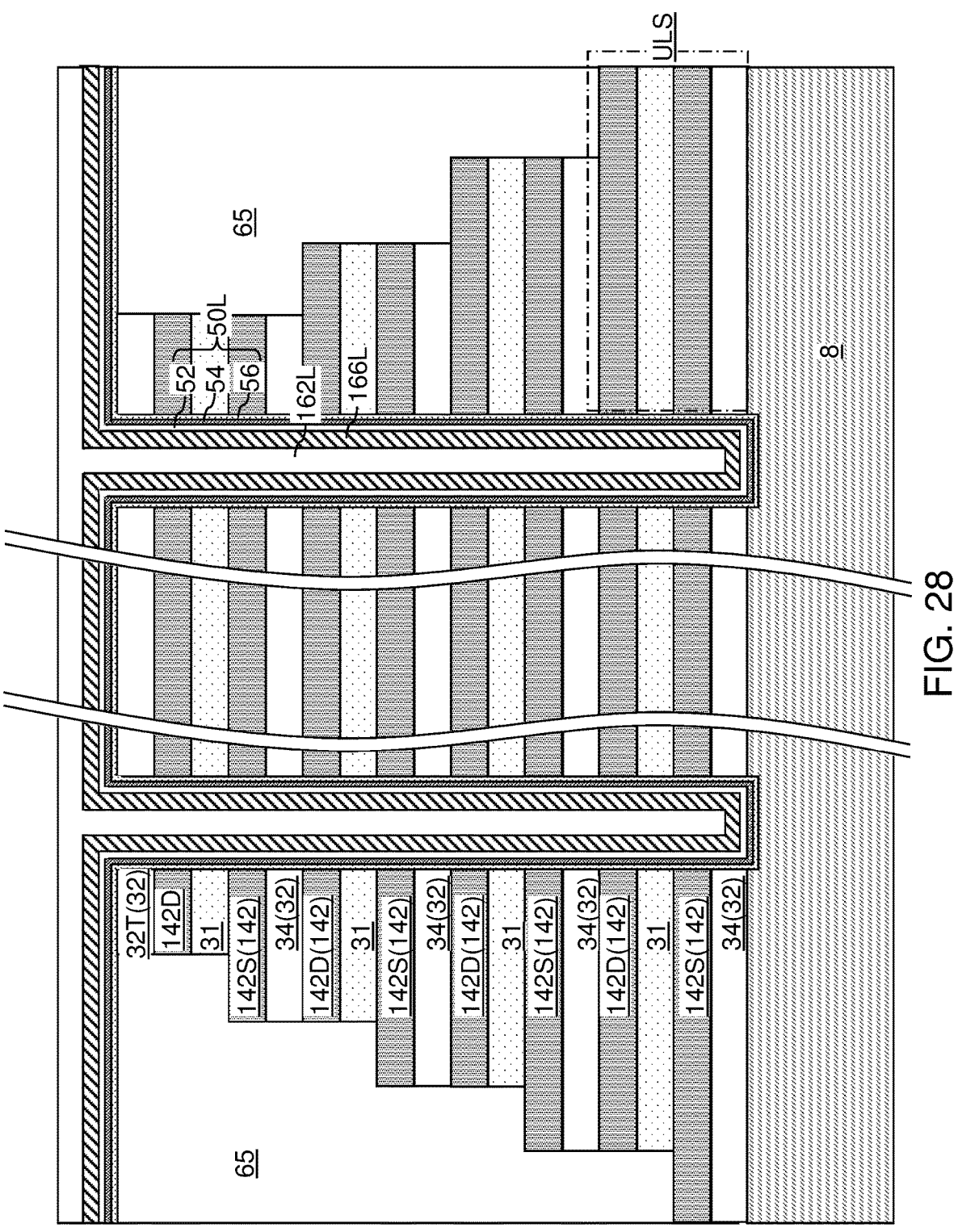
FIG. 28 is a vertical cross-sectional view of the third exemplary structure after formation of memory opening fill material layers according to the third embodiment of the present disclosure.

Referring to FIG. 28, a continuous memory film 50L can be deposited in the memory openings 149 and over the topmost insulating layer 32T and the retro-stepped dielectric material portions 65. Generally, the continuous memory film 50L comprises at least one memory material, which may be any memory material such as a charge storage material, a ferroelectric material, a phase change material, or any other material that can store data bits in the form of presence or absence of electrical charges, a direction of ferroelectric polarization, electrical resistivity, or another measurable physical parameter. In one embodiment, the memory material within the continuous memory film 50L may comprise a charge storage material. In this case, the continuous memory film 50L may be formed by sequential deposition of a tunneling dielectric layer 56, a charge storage layer 54, and a blocking dielectric layer 52. Each of the tunneling dielectric layer 56, the charge storage layer 54, and the blocking dielectric layer 52 may have a respective material composition and a respective thickness range as described above with reference to FIG. 5B. Each of the tunneling dielectric layer 56, the charge storage layer 54, and the blocking dielectric layer 52 may be formed by a respective conformal deposition process. While an embodiment is described in which the continuous memory film 50L comprises a charge storage layer 54, alternative embodiments are expressly contemplated herein in which the continuous memory film 50L comprises different types of a memory materials. The present disclosure is not limited by the types of memory materials employed within the continuous memory film 50L.

At least one gate electrode material can be subsequently conformally deposited on the continuous memory film 50L to form a gate electrode material layer 166L. For example, a layer stack of a metallic nitride liner (e.g., barrier layer) including a conductive metallic nitride (such as TiN, TaN, or WN) and a metal fill layer including a metal (such as W, Co, Mo, Ru, Cu, Al or an alloy thereof) can be sequentially deposited as the at least one gate electrode material. Additionally or alternatively, a heavily doped semiconductor material may be employed as one of the at least one gate electrode material. The lateral thickness of the gate electrode material layer 166L within each memory opening 149 (as measured between an outer sidewall and an inner sidewall) may be in a range from 15 nm to 200 nm, such as from 30 nm to 100 nm, although lesser and greater maximum lateral dimensions may also be employed.

A dielectric core layer 162L may be deposited in remaining volumes of the memory openings 149. The dielectric core layer 162L includes a dielectric material such as silicon oxide or organosilicate glass. The dielectric core layer 162L may be deposited by a conformal deposition method such as low pressure chemical vapor deposition (LPCVD), or by a self-planarizing deposition process such as spin coating.

Figure 29A:
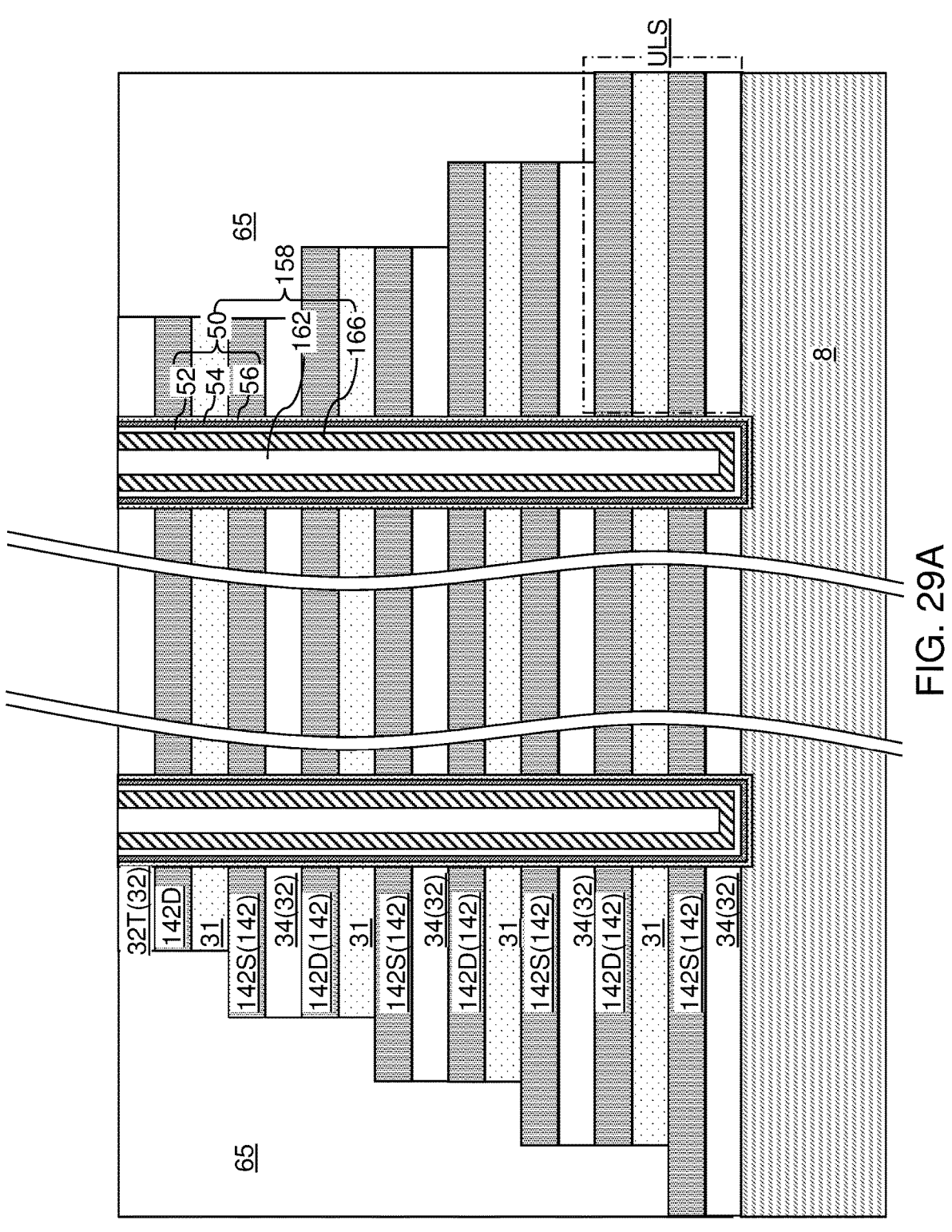
FIG. 29A is a vertical cross-sectional view of the third exemplary structure after formation of memory opening fill structures according to the third embodiment of the present disclosure.
Figure 29B:
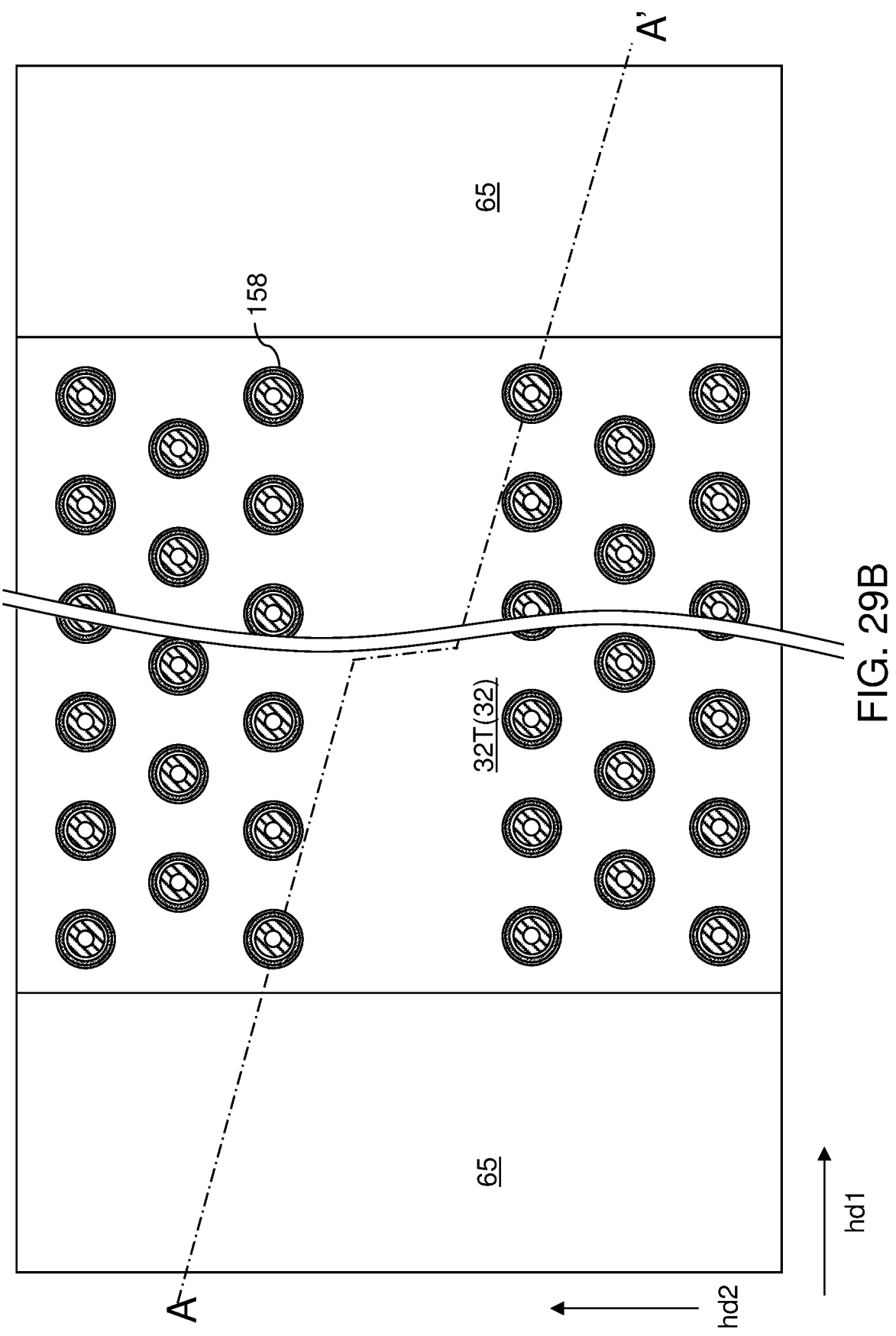
FIG. 29B is a top-down view of the third exemplary structure of FIG. 29A. The vertical plane A-A' is the plane of the vertical cross-sectional view of FIG. 29A.

Referring to FIGS. 29A and 29B, portions of the dielectric core layer 162L, the gate electrode material layer 166L, and the continuous memory film 50L can be removed from above the horizontal plane including the top surface of the topmost insulating layer 32T by a planarization process, which may employ a chemical mechanical polishing (CMP) process and/or a recess etch process. Each remaining portion of the continuous memory film 50L constitutes a memory film 50. Each remaining portion of the gate electrode material layer 166L constitutes a gate electrode 166, which functions as a vertically-extending word line. Each remaining portion of the dielectric core layer 162L constitutes a dielectric core 162. Each contiguous combination of material portions that fills a memory opening 149 constitutes a memory opening fill structure 158. Thus, each memory opening fill structure 158 may comprises a dielectric core 162, a gate electrode 166, and a memory film 50. In one embodiment, a two-dimensional array of memory opening fill structures 158 may be formed through a plurality of instances of the unit layer stack ULS overlying the substrate 8. In one embodiment, each of the memory opening fill structures 158 may comprise a respective cylindrical sidewall that extends straight along the vertical direction from the top surface of the insulating cap layer 32T to a surface of the substrate 8.

Figure 30A:
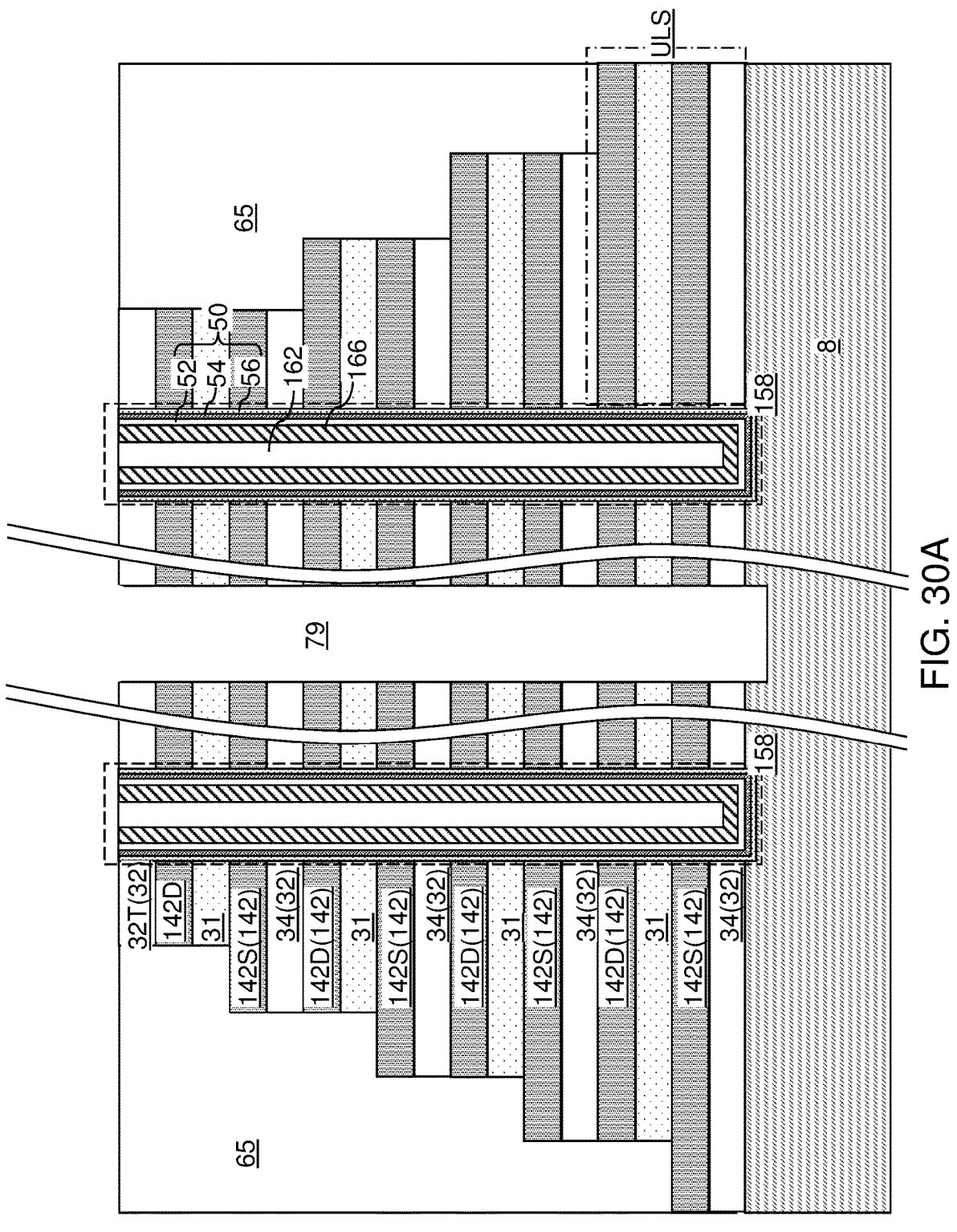
FIG. 30A is a vertical cross-sectional view of the third exemplary structure after formation of a backside trench according to the third embodiment of the present disclosure.
Figure 30B:
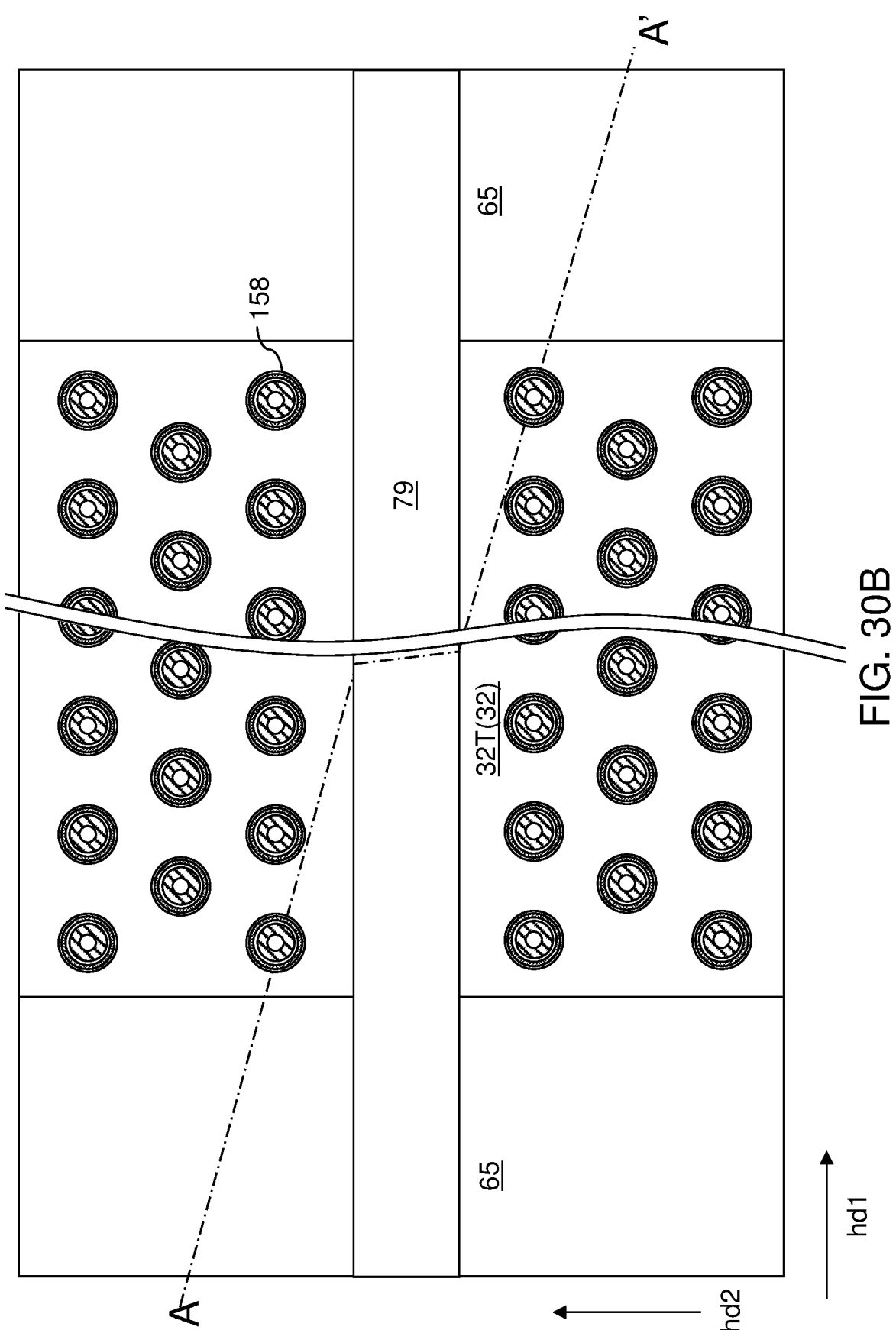
FIG. 30B is a top-down view of the third exemplary structure of FIG. 30A. The vertical plane A-A' is the plane of the vertical cross-sectional view of FIG. 30A.

Referring to FIGS. 30A and 30B, a photoresist layer (not shown) can be applied over the topmost insulating layer 32T, and can be lithographically patterned to form openings in areas between clusters of memory opening fill structures 158. The pattern in the photoresist layer can be transferred through the topmost insulating layer 32T and each underlying instance of the unit layer stack ULS employing an anisotropic etch to form backside trenches 79, which can vertically extend from the top surface of the topmost insulating layer 32T to the top surface of the substrate 8, and can laterally extend through the memory array region 100 and the staircase regions (200A, 200B).

In one embodiment, the backside trenches 79 can laterally extend along a first horizontal direction hd1 and can be laterally spaced apart from each other along a second horizontal direction hd2 that is perpendicular to the first horizontal direction hd1. The memory opening fill structures 158 can be arranged in rows that extend along the first horizontal direction hd1. Each backside trench 79 can have a uniform width that is invariant along the lengthwise direction (i.e., along the first horizontal direction hd1). Multiple rows of memory opening fill structures 158 can be located between a neighboring pair of backside trenches 79. The photoresist layer can be removed, for example, by ashing. While only one backside trench 79 is illustrated in FIGS. 30A and 30B, it is understood that the pattern of the backside trenches 79 may be periodically repeated along the second horizontal direction hd2.

The channel-level sacrificial layers 31 and the sacrificial material layers (142S, 142D) are then sequentially removed through the backside trenches 79 selective to the vertical-isolation insulating layers 34, the topmost insulating layer 32T, the retro-stepped dielectric material portions 65, and the memory opening fill structures 158. While an embodiment is described below in which the channel-level sacrificial layers 31 are removed prior to removing the sacrificial material layers (142S, 142D), it should be noted that in alternative embodiments, the channel-level sacrificial layers 31 may be removed after removing the sacrificial material layers (142S, 142D).

Figure 31:
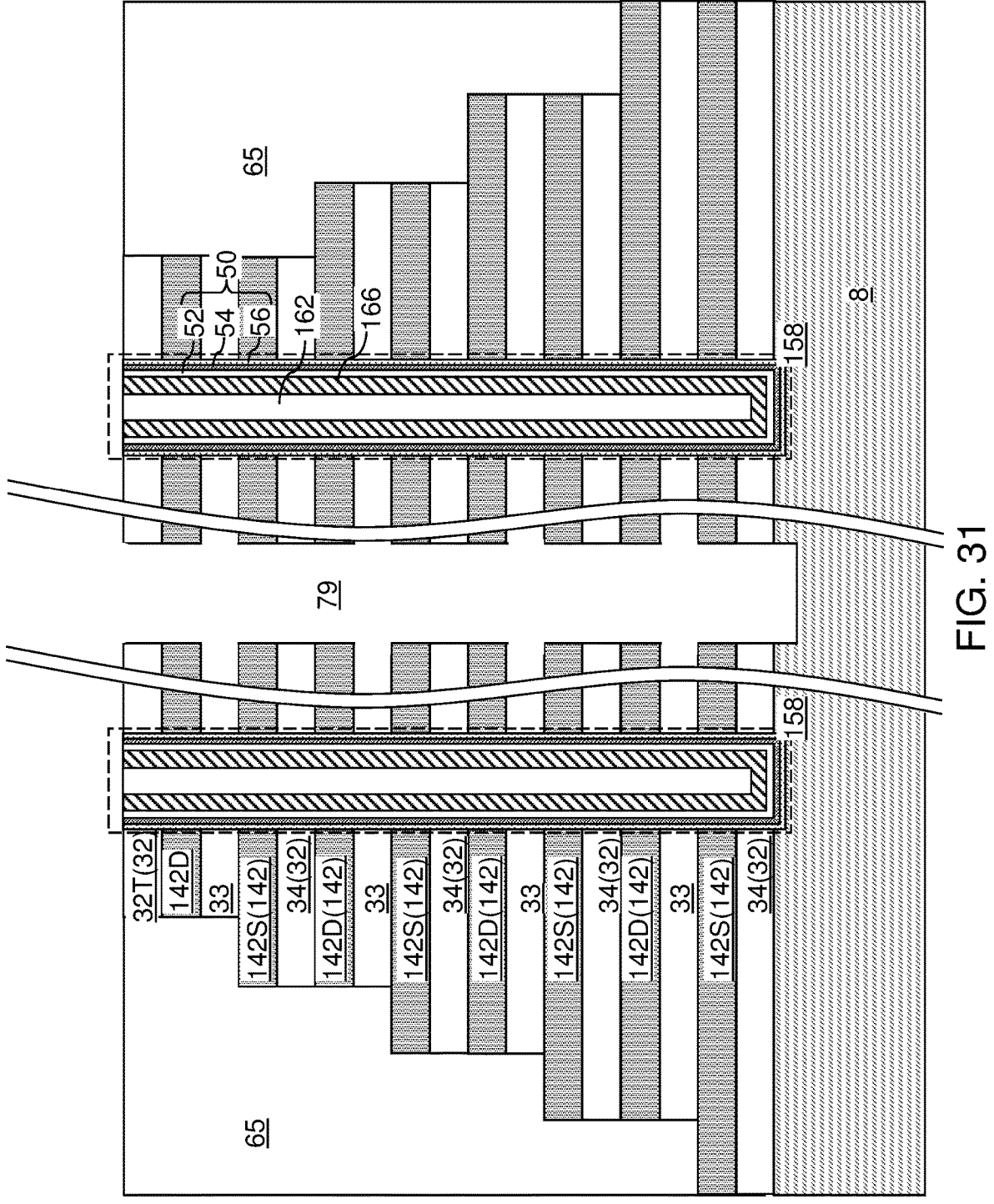
FIG. 31 is a vertical cross-sectional view of the third exemplary structure after formation of channel-level backside recesses according to the third embodiment of the present disclosure.

Referring to FIG. 31, a first isotropic etch process can be performed to remove the channel-level sacrificial layers 31 selective to the sacrificial material layers (142S, 142D), the vertical-isolation insulating layers 34, the topmost insulating layer 32T, the retro-stepped dielectric material portions 65, and the memory opening fill structures 158. A channel-level backside recess 33 can be formed in in each volume from which a channel-level sacrificial layer 31 is removed. Generally, at least one channel-level backside recess 33 can be formed by removing each channel-level sacrificial layer 31 without removing the memory film 50, and without removing the vertical-isolation insulating layer 34, the source-level material layer 142S, or the drain-level material layer 142D within each instance of the unit layer stack ULS.

Generally, the first isotropic etch process may provide a first isotropic etchant that removes the first sacrificial material of the channel-level sacrificial layers 31 selective to materials of the vertical-isolation insulating layers 34, the source-level material layers, the drain-level material layers, and the outmost layer of each memory film 50 (such as a tunneling dielectric layer 56). In a non-limiting illustrative example, the vertical-isolation insulating layers 34 may comprise undoped silicate glass, the source-level sacrificial material layers 142S and the drain-level sacrificial material layers 142D may comprise silicon nitride, the outmost layer of each memory film 50 may comprise an ONO stack, and the channel-level sacrificial layers 31 may comprise organosilicate glass or borosilicate glass. In this case, the first isotropic etch process may comprise a wet etch process employing dilute hydrofluoric acid. In another illustrative example, the vertical-isolation insulating layers 34 may comprise undoped silicate glass, the source-level sacrificial material layers, 142S and the drain-level sacrificial material layers 142D may comprise silicon nitride, and the outmost layer of each memory film 50 may comprise an ONO stack, an upper portion of the substrate 8 comprises a dielectric material such as silicon oxide or a conductive material such as a metallic material, and the channel-level sacrificial layers 31 may comprise amorphous silicon. In this case, the first isotropic etch process may comprise a wet etch process employing hot trimethyl-2 hydroxyethyl ammonium hydroxide ("hot TMY") or tetramethyl ammonium hydroxide (TMAH). In yet another example, the channel-level sacrificial layers 31 may comprise amorphous carbon, and the first isotropic etch process may comprise an ashing process. A cylindrical outer surface segment of each memory opening fill structure 158 can be physically exposed to each channel-level backside recess 33. Each channel-level backside recess 33 may be laterally bounded by a combination of the at least one backside trench 79 and at least one retro-stepped dielectric material portion 65.

Figure 32A:
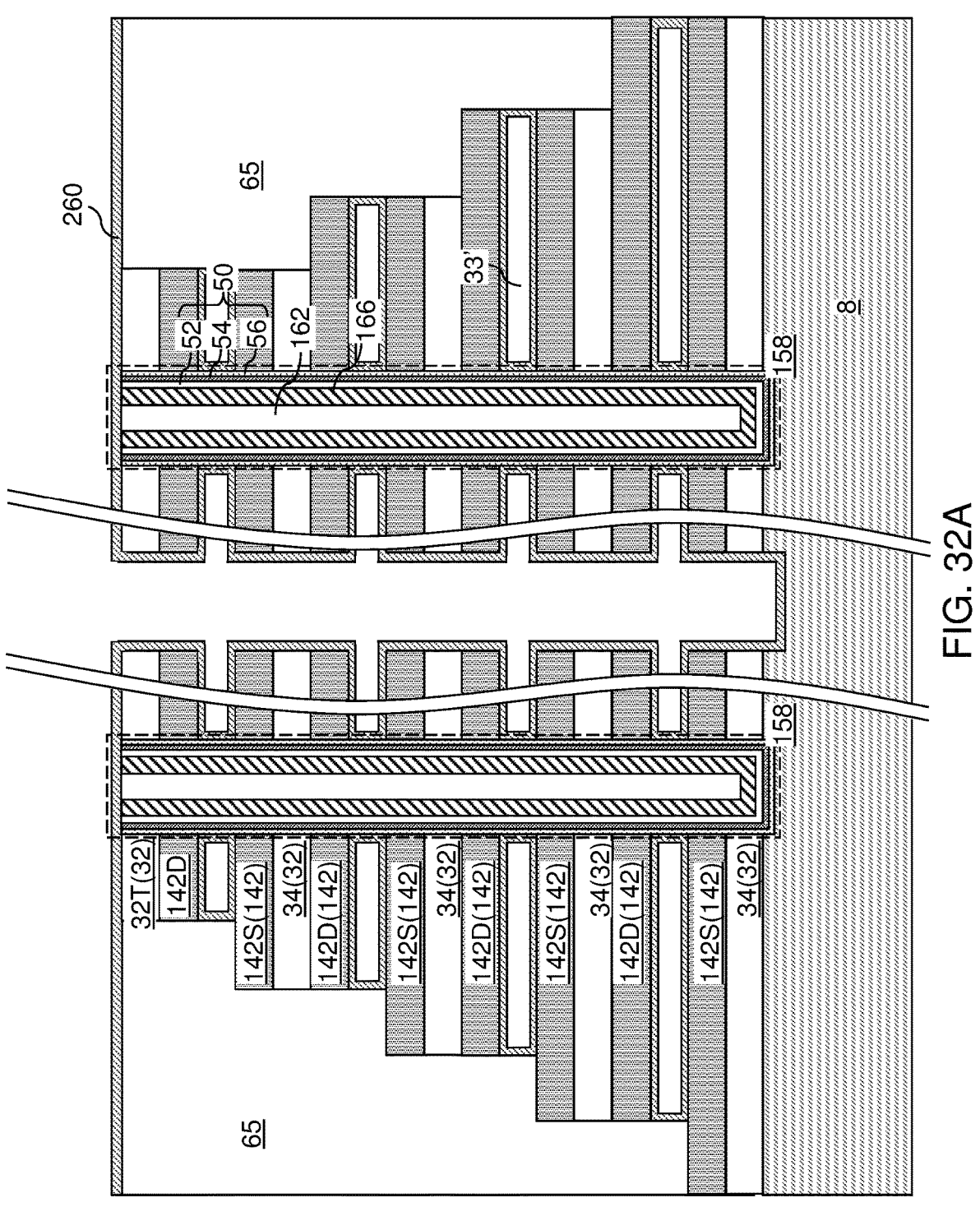
FIG. 32A is a vertical cross-sectional view of the third exemplary structure after formation of a continuous composite metal oxide semiconductor channel layer according to the third embodiment of the present disclosure.
Figure 32B:
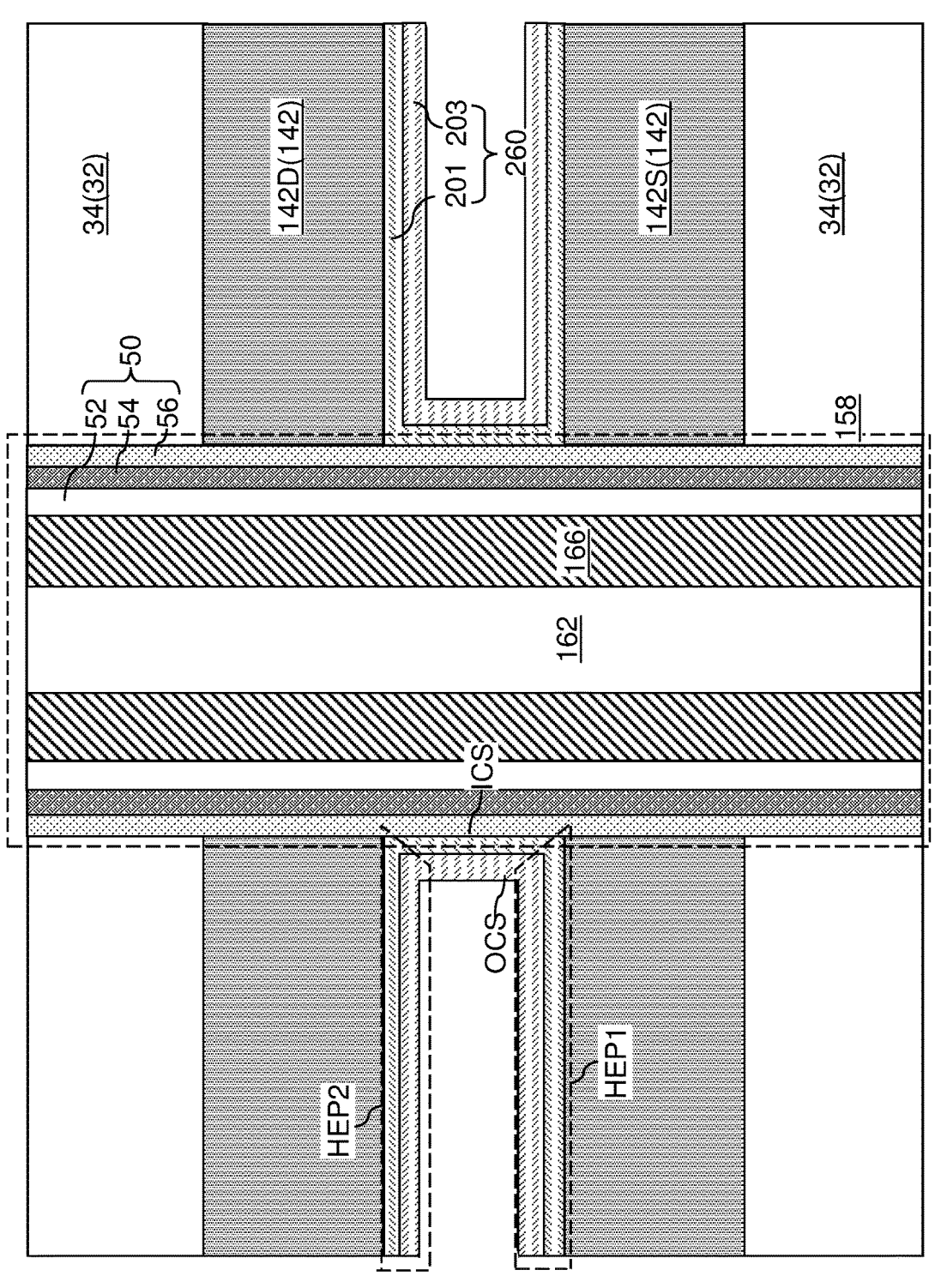
FIG. 32B is a vertical cross-sectional view of a portion of the third exemplary structure of FIG. 32A in a first configuration according to the third embodiment of the present disclosure.
Figure 32C:
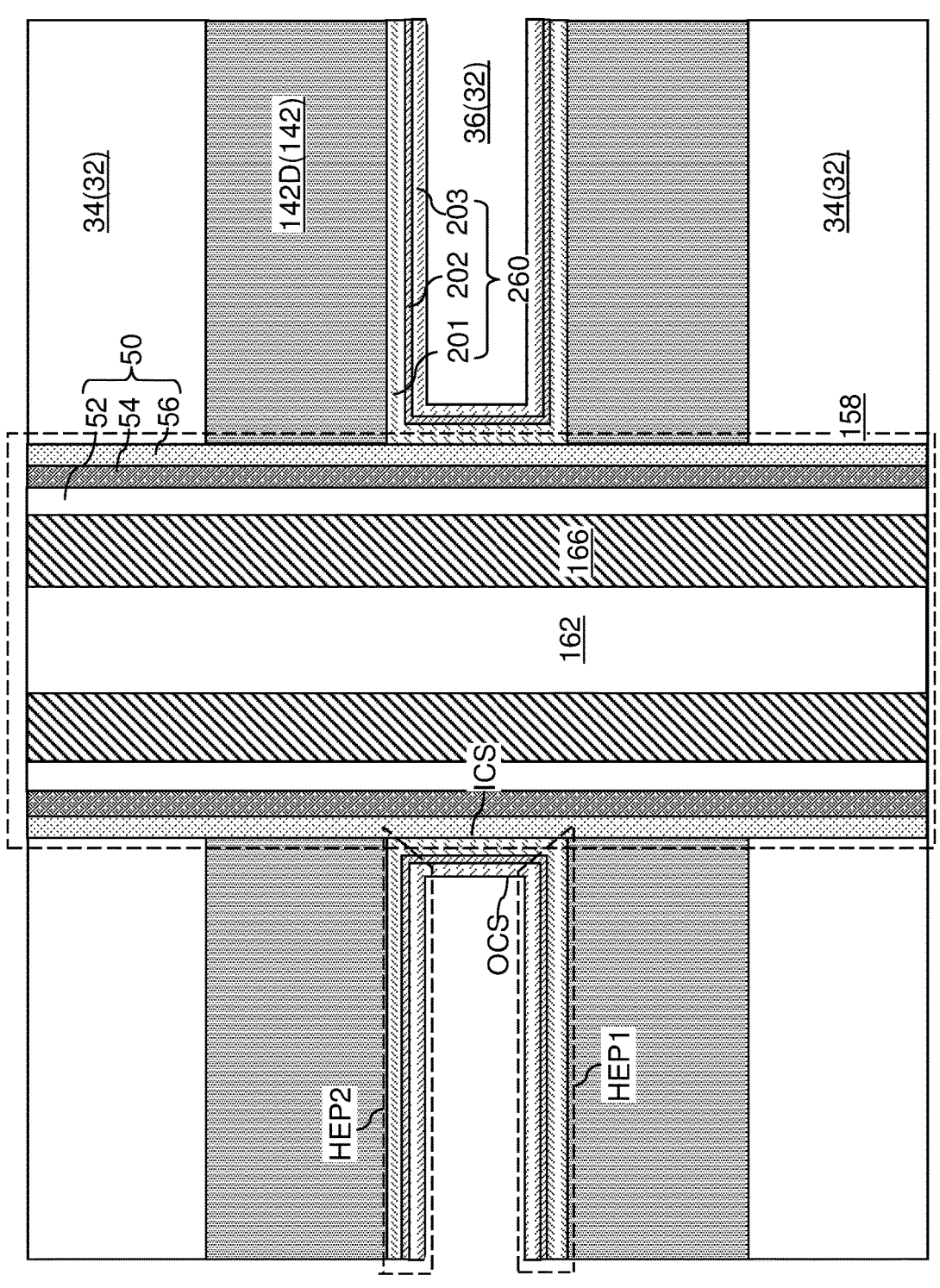
FIG. 32C is a vertical cross-sectional view of a portion of the third exemplary structure of FIG. 32A in a second configuration according to the third embodiment of the present disclosure.

Referring to FIGS. 32A-32C, a continuous composite metal oxide semiconductor channel layer 260 can be conformally deposited in peripheral portions of each channel-level backside recess 33, in peripheral portions of each backside trench 79, and the above the top surface of the topmost insulating layer 32T. FIG. 32B illustrates a first configuration of the third exemplary structure around a memory opening fill structure 158. FIG. 32C illustrates a second configuration of the third exemplary structure around the memory opening fill structure 158.

In one embodiment, the composite metal oxide semiconductor channel layer 260 comprises a first semiconducting metal oxide channel layer 201 having a first band gap and a second semiconducting metal oxide channel layer 203 having a second band gap, and optionally, as shown in FIG. 32C, comprises a third semiconducting metal oxide channel layer 202 having a graded band gap. In one embodiment, the first semiconducting metal oxide channel layer 201 may have the same material composition and the same thickness range as the first metal oxide semiconductor 601 described with reference to FIGS. 5C and 6A, the second semiconducting metal oxide channel layer 203 may have the same material composition and the same thickness range as the third metal oxide semiconductor layer 603 described with reference to FIGS. 5C and 6A, and the optional third semiconducting metal oxide channel layer 202, if employed, may have the same material composition and the same thickness range as the second metal oxide semiconductor layer 602 described with reference to FIG. 5C. In another embodiment, the first semiconducting metal oxide channel layer 201 may have the same material composition and the same thickness range as the outer semiconducting metal oxide channel layer 701 described with reference to FIGS. 21C and 21G, the second semiconducting metal oxide channel layer 203 may have the same material composition and the same thickness range as the inner semiconducting metal oxide channel layer 703 described with reference to FIGS. 21C and 21G, and the optional third semiconducting metal oxide channel layer 202, if employed, may have the same material composition and the same thickness range as the intermediate semiconducting metal oxide channel layer 702 described with reference to FIG. 21G.

Generally, the thicknesses of the various component layers within the composite metal oxide semiconductor channel layer 260, and the magnitudes of the first band gap and the second band gap, and the profile of the graded band gap (if present) can be selected to increase the on-current, and to reduce the off-current (i.e., the leakage current in the off state), of the portions of the composite metal oxide semiconductor channel layer 260 that are subsequently employed as channels.

In one embodiment, the first semiconducting metal oxide channel layer 201 contacts the source-level material layers and the drain-level material layers. In one embodiment, the second band gap is greater than the first band gap. For example, the first semiconducting metal oxide channel layer 201 comprises and/or consists essentially of indium tin zinc oxide; and the second semiconducting metal oxide channel layer 203 comprises, and/or consists essentially of, indium gallium zinc oxide or zinc oxynitride (i.e., zinc nitride oxide).

In another embodiment, the second band gap is smaller than the first band gap. For example, the first semiconducting metal oxide channel layer 201 comprises and/or consists essentially of indium gallium zinc oxide; and the second semiconducting metal oxide channel layer 203 comprises, and/or consists essentially of, zinc oxynitride.

In one embodiment, the first semiconducting metal oxide channel layer 201 has a first homogeneous material composition throughout; the second semiconducting metal oxide channel layer 203 has a second homogeneous material composition throughout; and the second semiconducting metal oxide channel layer 203 is in direct contact with the first semiconducting metal oxide channel layer 201, as illustrated in FIG. 32B.

In another embodiment, the composite metal oxide semiconductor channel layer 260 further comprises a third semiconducting metal oxide channel layer 202 located between the first semiconducting metal oxide channel layer 201 and the second semiconducting metal oxide channel layer 203; and the third semiconducting metal oxide channel layer 202 has a graded band gap that changes from the first band gap at an interface with the first semiconducting metal oxide channel layer 201 to the second band gap at an interface with the second semiconducting metal oxide channel layer 203, as illustrated in FIG. 32C. The first semiconducting metal oxide channel layer 201 has a first homogeneous material composition throughout; and the second semiconducting metal oxide channel layer 203 has a second homogeneous material composition throughout.

Generally, the composite metal oxide semiconductor channel layer 260 can be formed by performing at least two conformal deposition processes that provides a respective reactant into the backside trench and into each of the at least one channel-level backside recess 33.

Around each cylindrical interface between the composite metal oxide semiconductor channel layer 260 and a respective memory opening fill structures 158, the composite metal oxide semiconductor channel layer 260 comprises an inner cylindrical sidewall ICS, an outer cylindrical sidewall OCS, a first horizontally-extending portion HEP1 adjoined to first closed peripheries of the inner cylindrical sidewall ICS and the outer cylindrical sidewall OCS, and a second horizontally-extending portion HEP2 adjoined to second closed peripheries of the inner cylindrical sidewall ICS and the outer cylindrical sidewall OCS. In one embodiment, the entirety of the inner cylindrical sidewall ICS is in direct contact with the memory film 50. A gate electrode 166 is located within a volume that is laterally surrounded by the inner cylindrical sidewall ICS and the memory film 50, i.e., within the memory opening fill structures 158. Thus, the memory film 50 is located between the gate electrode 166 and the inner cylindrical sidewall ICS.

Figure 33A:
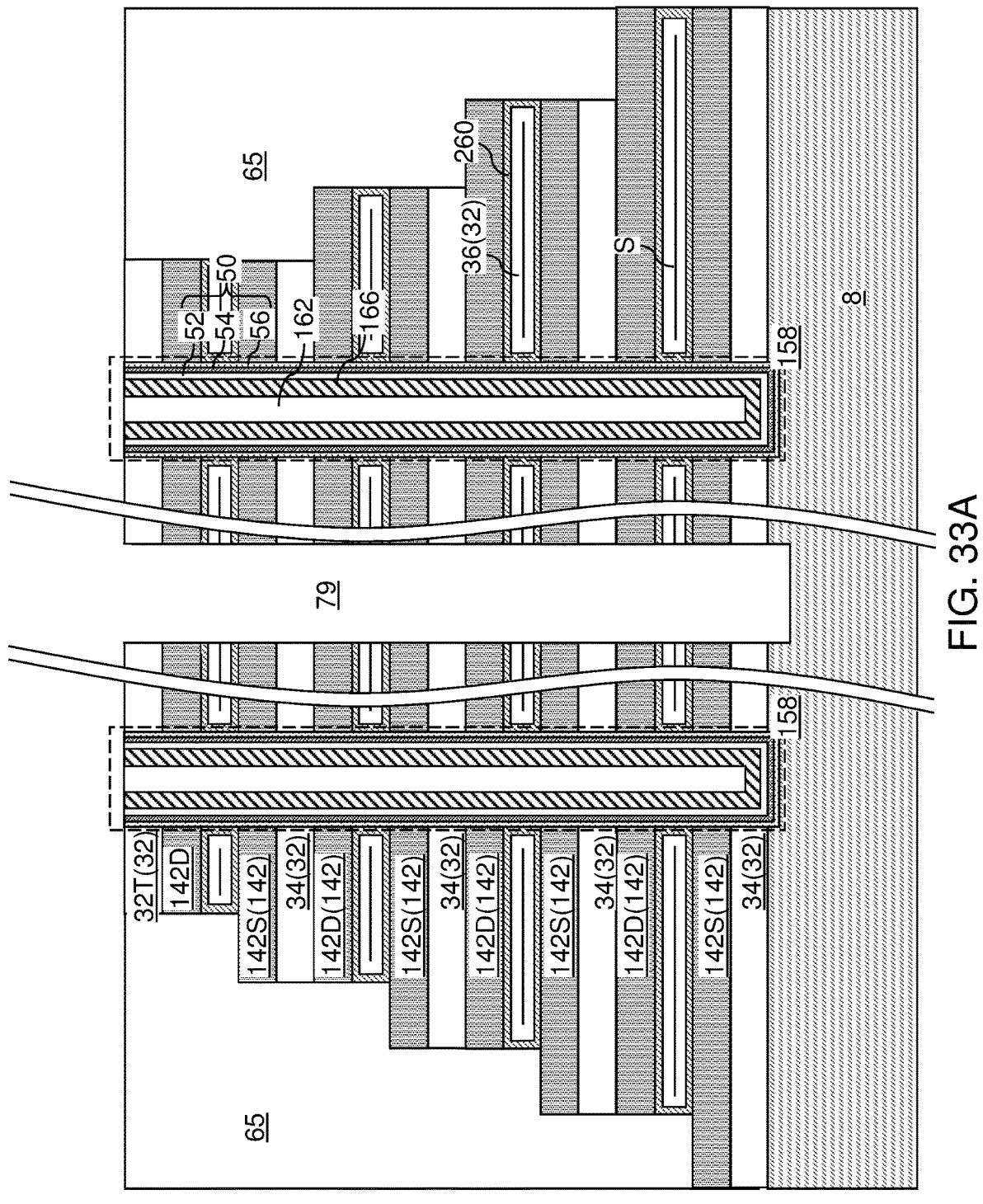
FIG. 33A is a vertical cross-sectional view of the third exemplary structure after deposition of a dielectric fill material layer and removal of portions of the dielectric fill material layer and the continuous composite metal oxide semiconductor channel layer from inside the backside trench and from above the alternating stack according to the third embodiment of the present disclosure.
Figure 33B:
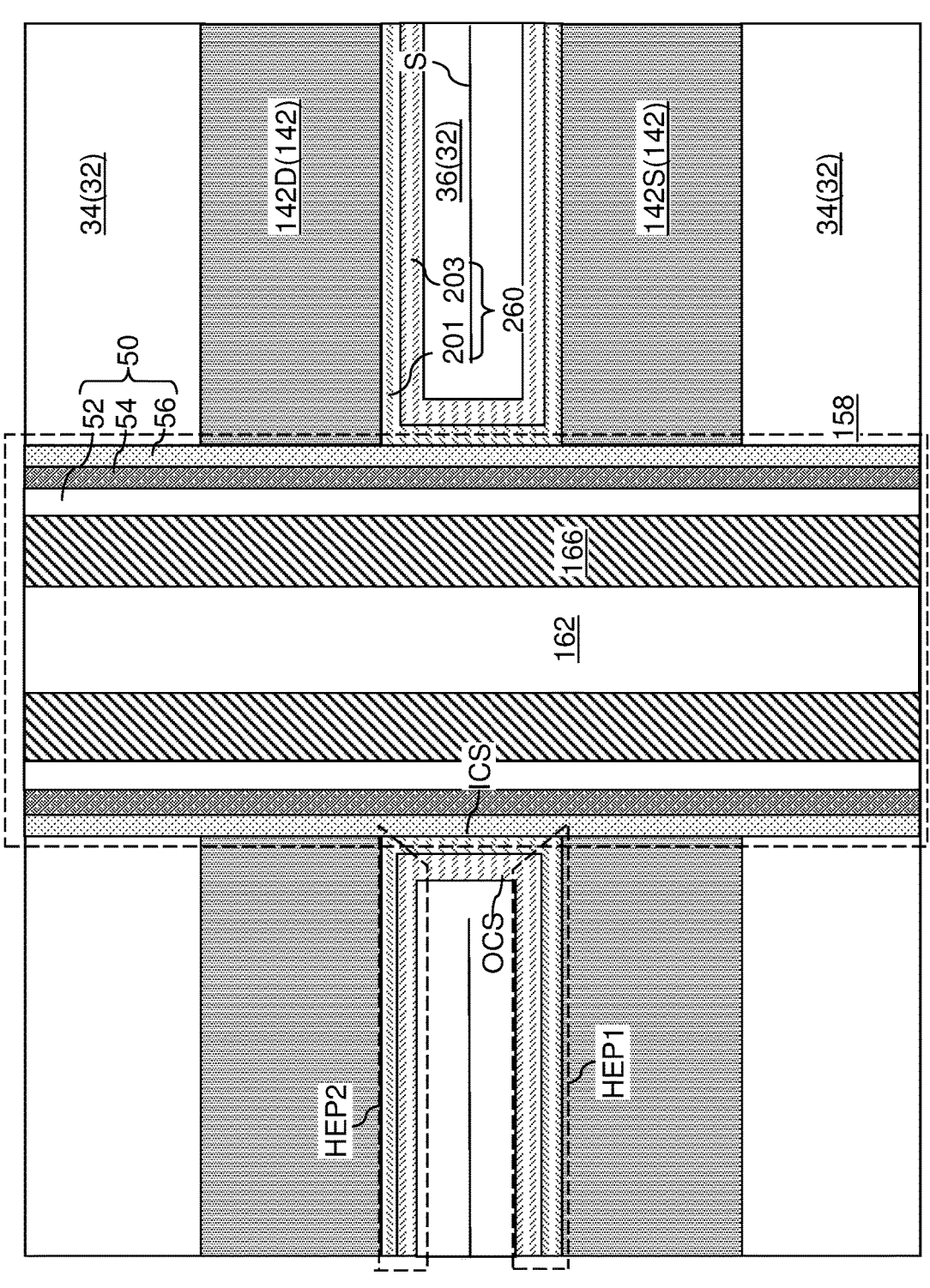
FIG. 33B is a vertical cross-sectional view of a portion of the third exemplary structure of FIG. 33A in the first configuration according to the third embodiment of the present disclosure.
Figure 33C:
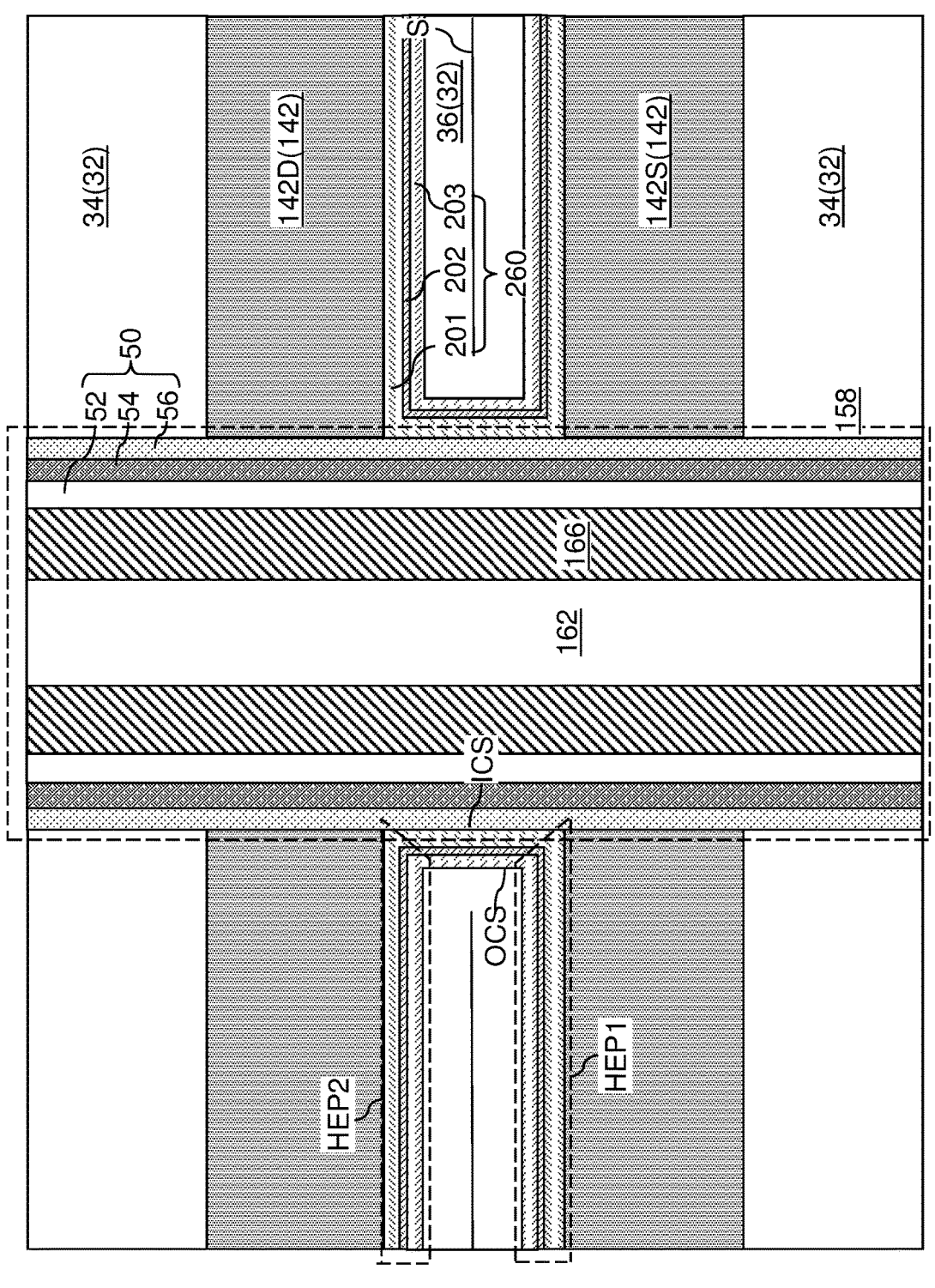
FIG. 33C is a vertical cross-sectional view of a portion of the third exemplary structure of FIG. 33A in the second configuration according to the third embodiment of the present disclosure.

Referring to FIGS. 33A-33C, a dielectric fill material can be conformally deposited in remaining unfilled volumes of the channel-level backside recesses 33. The dielectric fill material is different from the second sacrificial material of the sacrificial material layers (142S, 142D). For example, if the sacrificial material layers (142S, 142D) comprise silicon nitride, then the dielectric fill material may comprise undoped silicate glass, a doped silicate glass, organosilicate glass, silicon carbide nitride, or a combination thereof. FIG. 32B illustrates a first configuration of the third exemplary structure around a memory opening fill structure 158. FIG. 32C illustrates a second configuration of the third exemplary structure around the memory opening fill structure 158.

A first etch back process can be performed to remove portions of the dielectric fill material from above the horizontal plane including the top surface of the topmost insulating layer 32T and from inside volumes of the backside trenches 79. The first etch back process may comprise an anisotropic etch process, and may etch the dielectric fill material selective to the composite metal oxide semiconductor channel layer 260. Subsequently, a second etch back process can be performed to remove portions of the composite metal oxide semiconductor channel layer 260 from above the horizontal plane including the top surface of the topmost insulating layer 32T and from inside volumes of the backside trenches 79. The second etch back process may comprise an anisotropic etch process, and may etch the semiconducting metal oxide materials of the composite metal oxide semiconductor channel layer 260 selective to materials of the topmost insulating layer 32T, vertical-isolation insulating layers 34, the dielectric fill material, and the retro-stepped dielectric material portions 65.

Each remaining portion of the composite metal oxide semiconductor channel layer 260 is located entirely within the volume of a respective one of the channel-level backside recess 33. Thus, the composite metal oxide semiconductor channel layer 260 as formed at the processing steps of FIGS. 32A-32C is a divided into a plurality of composite metal oxide semiconductor channel layers 260 that are located within a respective one of the channel-level backside recesses 33. Each remaining portion of the dielectric fill material is located within the volume of a respective one of the channel-level backside recesses 33, and is herein referred to as a channel-level insulating layer 36. A channel-level insulating layer 36 can be formed in each unfilled volume of the channel-level backside recesses 33 on a respective composite metal oxide semiconductor channel layer 260. In one embodiment, the channel-level insulating layers 36 may comprise a respective horizontally-extending seam S located midway between a horizontal top surface thereof and a horizontal bottom surface thereof. The horizontally-extending seams S of the channel-level insulating layers 36 may be laterally spaced apart from each of the retro-stepped dielectric material portions 65 by vertically extending portions of the composite metal oxide semiconductor channel layer 260. In one embodiment, one, a plurality and/or each of the channel-level insulating layers 36 may comprise a respective horizontally-extending seam S located midway between a horizontal top surface of the respective channel-level insulating layer 36 and a horizontal bottom surface of the respective channel-level insulating layer 36. The vertical-isolation insulating layers 34 may be free of any seam therein.

Around each memory opening fill structure 158, each composite metal oxide semiconductor channel layer 260 may comprise an inner cylindrical sidewall ICS, an outer cylindrical sidewall OCS, a first horizontally-extending portion HEP1 adjoined to first closed peripheries of the inner cylindrical sidewall ICS and the outer cylindrical sidewall OCS, and a second horizontally-extending portion HEP2 adjoined to second closed peripheries of the inner cylindrical sidewall ICS and the outer cylindrical sidewall OCS. Each composite metal oxide semiconductor channel layer 260 can be formed directly on a respective source-level material layer, directly on a respective drain-level material layer, and directly on cylindrical surface segments of a respective plurality of memory films 50.

Each channel-level insulating layer 36 can laterally surround and can contact a plurality of outer cylindrical sidewalls OCS of a respective composite metal oxide semiconductor channel layer 260. Each channel-level insulating layer 36 comprises a first horizontal surface that contacts a horizontal surface of a first horizontally-extending portion HEP1 of a respective composite metal oxide semiconductor channel layer 260, and comprises a second horizontal surface that contacts a horizontal surface of a second horizontally-extending portion HEP2 of the respective composite metal oxide semiconductor channel layer 260.

As discussed above, the vertical-isolation insulating layers 34 comprise the insulating layers 32 described with respect to the prior embodiments. The channel-level insulating layers 36 may comprise additional insulating layers 32. Thus, the vertical-isolation insulating layers 34 and the channel-level insulating layers 36 are herein collectively referred to as insulating layers 32. In case the source-level material layers are formed as source-level sacrificial material layers 142S and the drain-level material layers are formed as drain-level sacrificial material layers 142D, the third exemplary structure comprises a vertically alternating sequence of insulating layers 32 and sacrificial material layers (142S, 142D) at this processing step.

Figure 34:
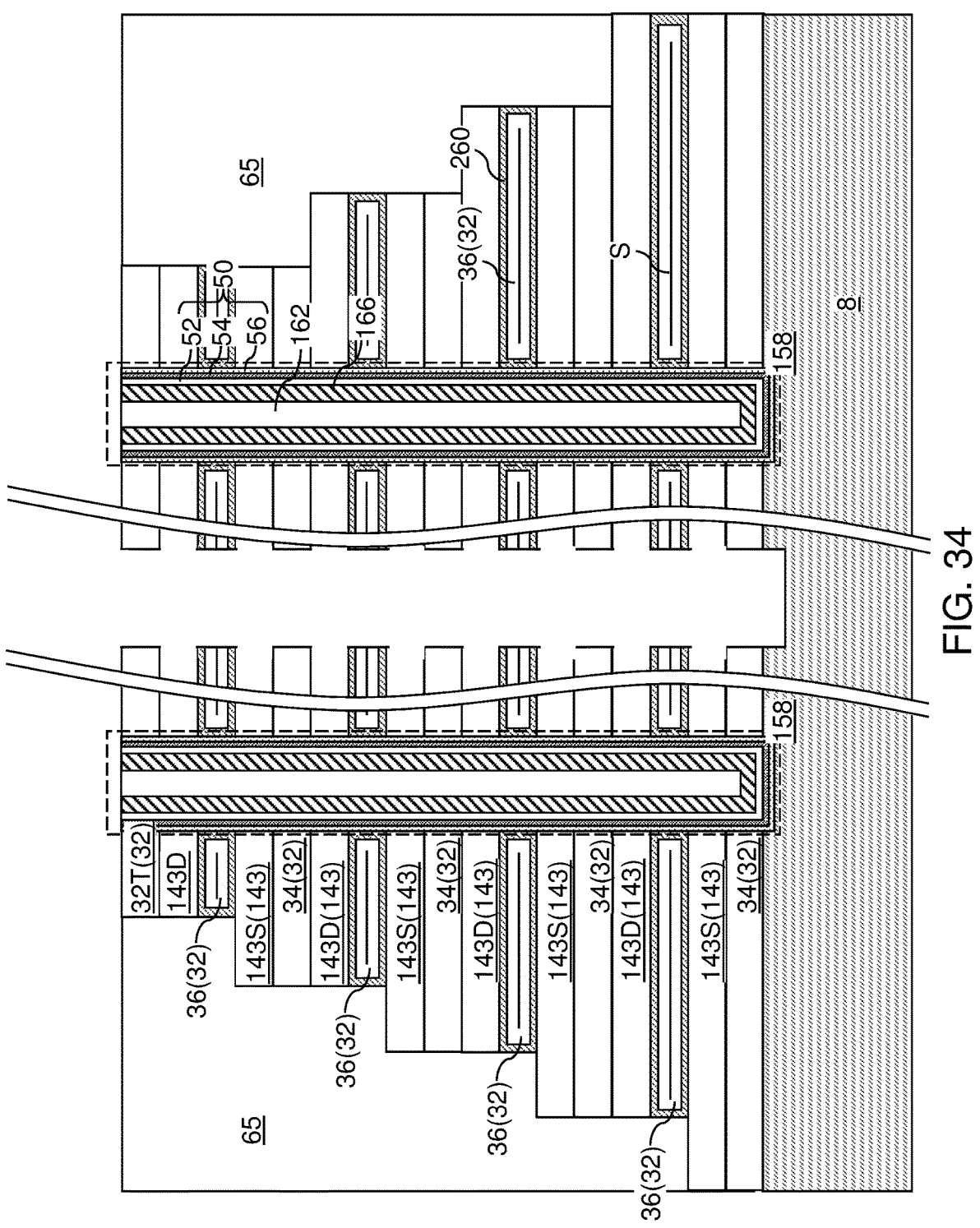
FIG. 34 is a vertical cross-sectional view of the third exemplary structure after formation of source/drain-level backside recesses by removal of the sacrificial material layers according to the third embodiment of the present disclosure.

Referring to FIG. 34, an etchant that selectively etches the materials of the source-level sacrificial material layer 142S and drain-level sacrificial material layers 142D with respect to the materials of the insulating layers 32, the retro-stepped dielectric material portions 65, and the memory films 50 can be introduced into the backside trenches 79. Source-level backside recesses 143S and drain-level backside recesses 143D are formed in volumes from which the source-level sacrificial material layer 142S and drain-level sacrificial material layers 142D are removed, respectively. The source-level backside recesses 143S and the drain-level backside recesses 143D are collectively referred to as backside recesses 143.

The etch process can be a wet etch process employing a wet etch solution, or can be a gas phase (dry) etch process in which the etchant is introduced in a vapor phase into the backside trenches 79. For example, if the source-level sacrificial material layer 142S and the drain-level sacrificial material layers 142D include silicon nitride, and if the materials of the insulating layers 32 and the retro-stepped dielectric material portion 65 can include silicon oxide and/or metal oxide, then the etch process can be a wet etch process in which the exemplary structure is immersed within a wet etch tank including phosphoric acid, which etches silicon nitride selective to silicon oxide, silicon, and various other materials.

Each backside recess 143 can be a laterally extending cavity having a lateral dimension that is greater than the vertical extent of the cavity. In other words, the lateral dimension of each backside recess 143 can be greater than the height of the backside recess 143. In one embodiment, a plurality of source-level backside recesses 143S and the drain-level backside recesses 143D can be formed in the volumes from which the materials of the source-level sacrificial material layer 142S and drain-level sacrificial material layers 142D are removed. The memory openings 149 filled in by the memory opening fill structures 158 are herein referred to as front side openings or front side cavities in contrast with the source-level backside recesses 143S and the drain-level backside recesses 143D. Each of the plurality of source-level backside recesses 143S and the drain-level backside recesses 143D can extend substantially parallel to the top surface of the substrate 8. In one embodiment, each backside recess 143 can have a uniform height throughout.

Figure 35A:
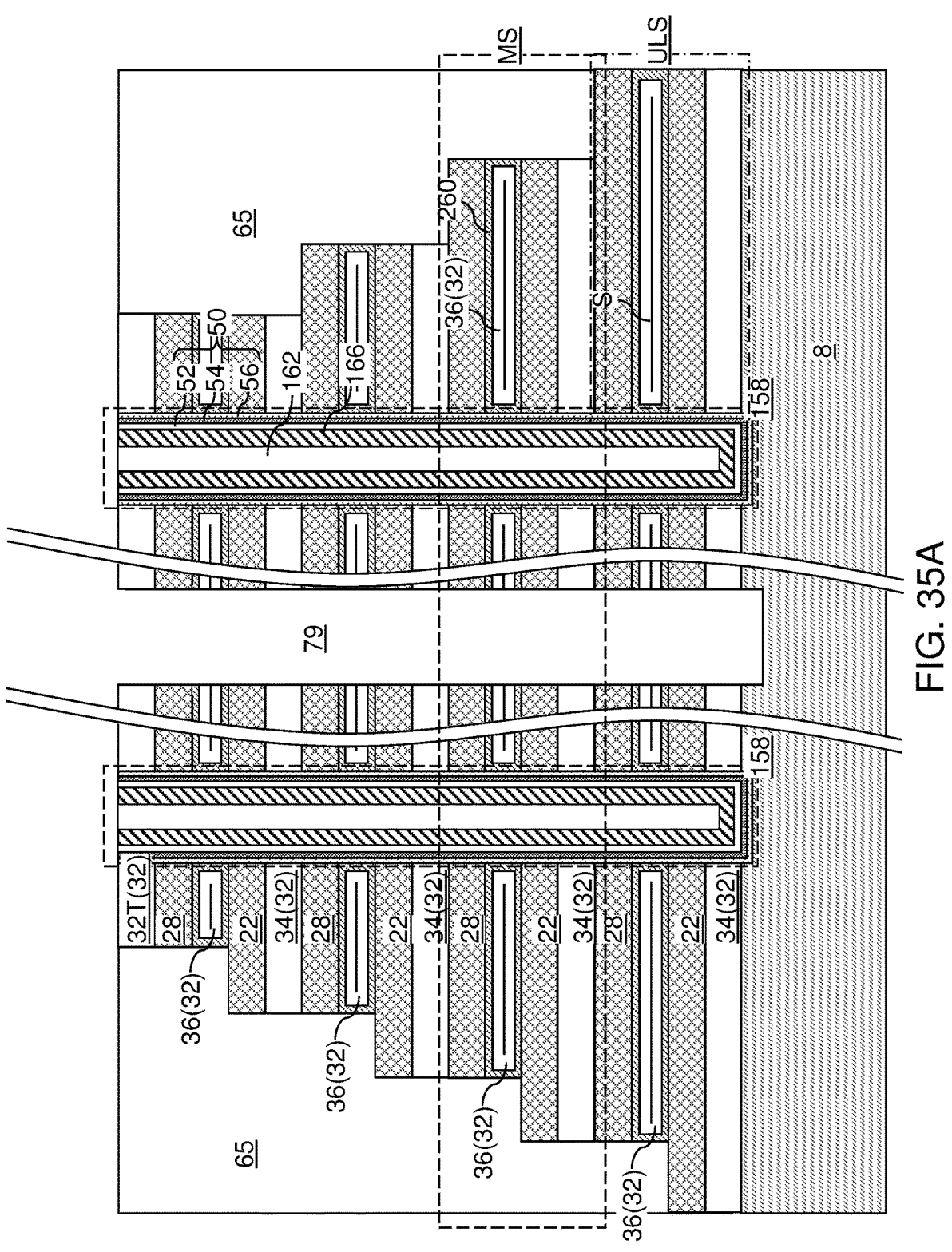
FIG. 35A is a vertical cross-sectional view of the third exemplary structure after formation of source layers and drain layers according to the third embodiment of the present disclosure.
Figure 35B:
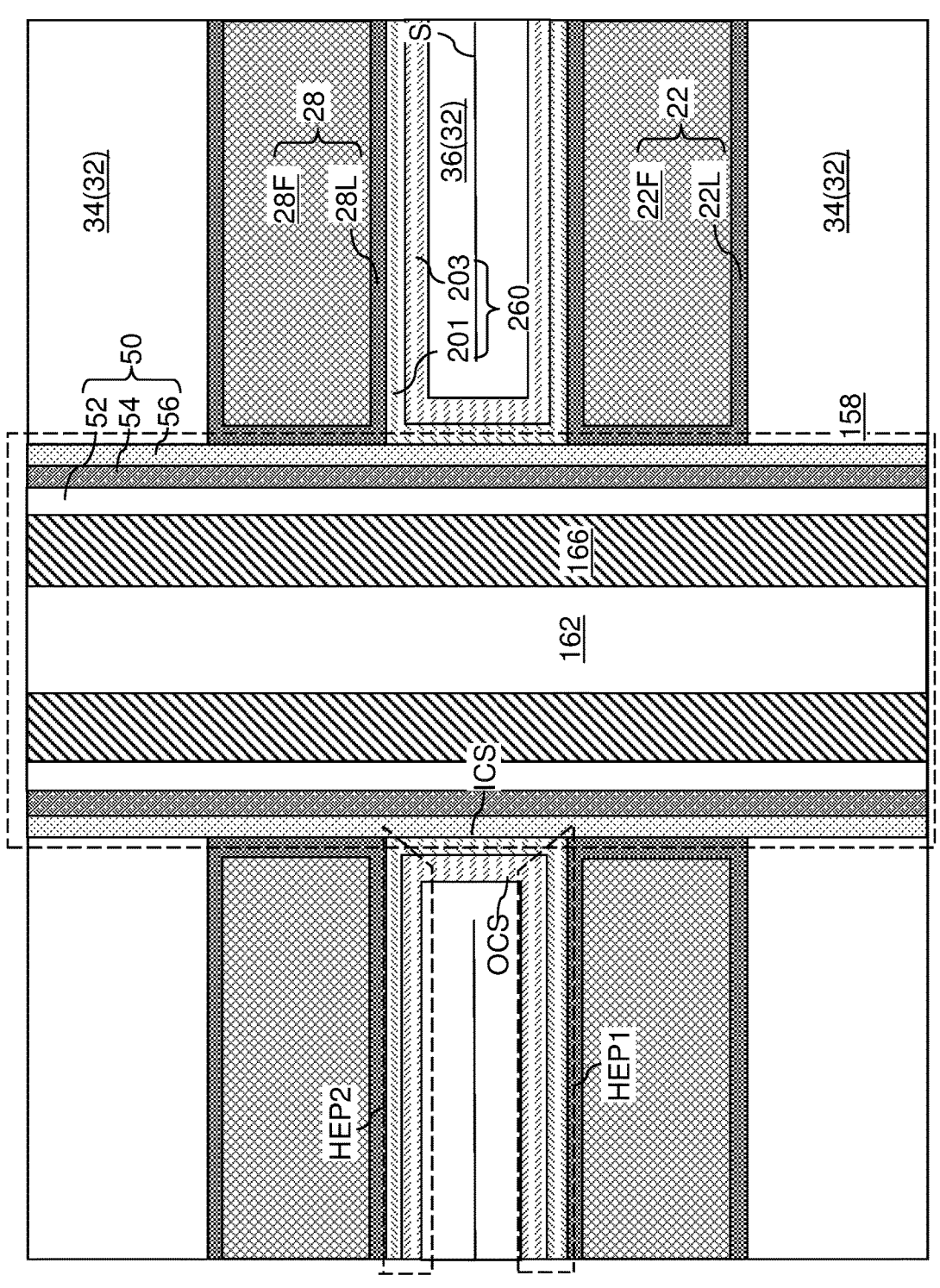
FIG. 35B is a vertical cross-sectional view of a portion of the third exemplary structure of FIG. 35A in the first configuration according to the third embodiment of the present disclosure.
Figure 35C:
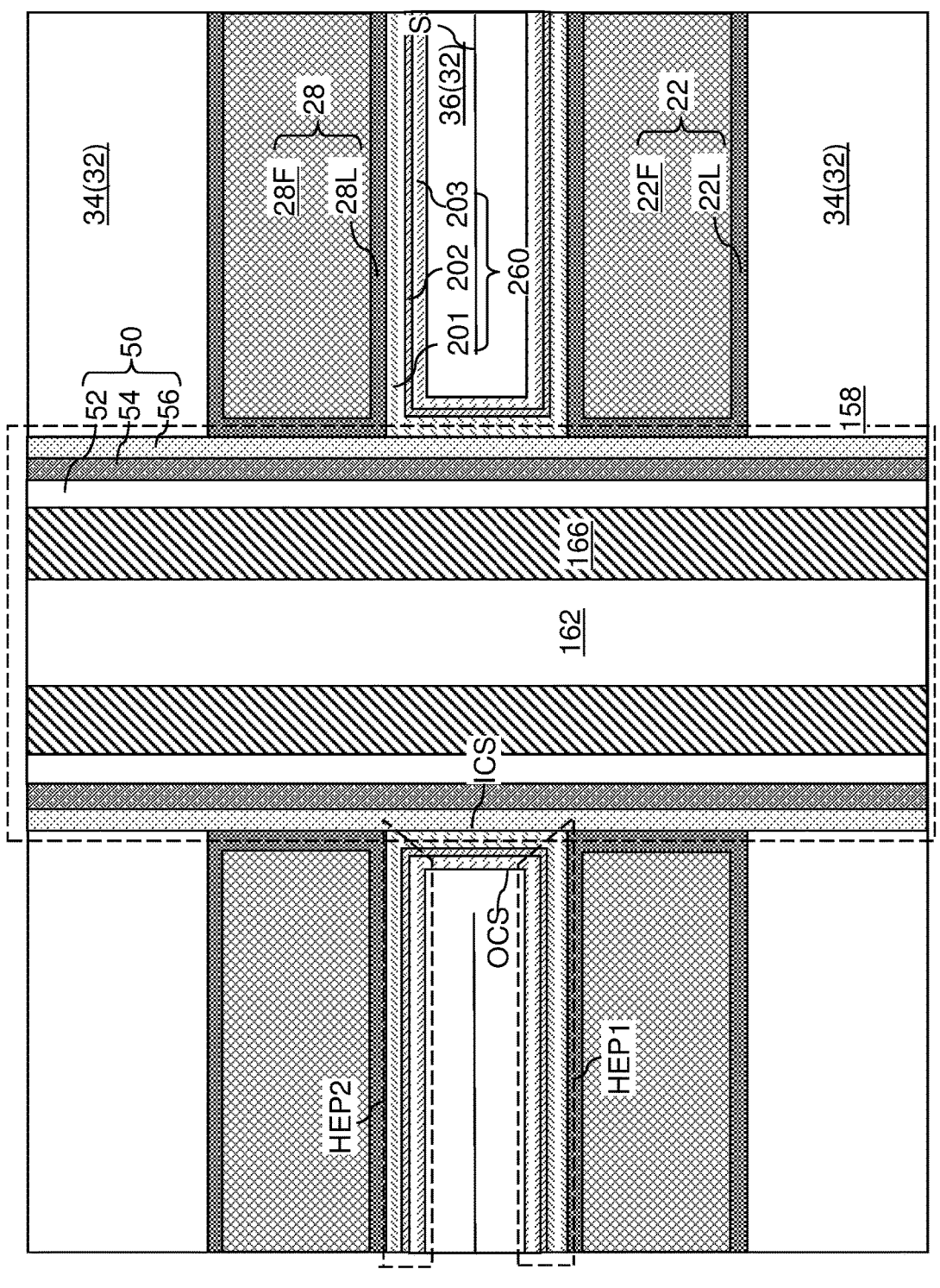
FIG. 35C is a vertical cross-sectional view of a portion of the third exemplary structure of FIG. 35A in the second configuration according to the third embodiment of the present disclosure.

Referring to FIGS. 35A-35C, at least one conductive material can be deposited in the source-level backside recesses 143S and the drain-level backside recesses 143D through the backside trenches 79. FIG. 35B illustrates a first configuration of the third exemplary structure around a memory opening fill structure 158. FIG. 35C illustrates a second configuration of the third exemplary structure around the memory opening fill structure 158.

In one embodiment, the at least one conductive material comprises at least one metallic material. In one embodiment, the at least one metallic material can include a conductive metallic compound material (such as TaN, TiN, WN, MoN, TiC, TaC, WC, or a combination thereof) that forms a metallic barrier liner, and a metallic fill material (such as W, Co, Ru, or Mo) that fills remaining volumes of the source-level backside recesses 143S and the drain-level backside recesses 143D that are not filled by the metallic barrier liner. The at least one metallic material fills all volumes of the source-level backside recesses 143S and the drain-level backside recesses 143D. Alternatively, the at least one conductive material may comprise a heavily doped semiconductor material, i.e., a semiconductor material including electrical dopants at a sufficiently high atomic concentration and functions as a conductive material. For example, the source layers 22 and the drain layers 28 may comprise heavily doped polysilicon having a p-type or n-type dopant concentration of $1\times10^{19}$ to $1\times10^{22}$ $cm^{-3}$.

Portions of the at least one conductive material deposited in the backside trenches 79 or above the topmost insulating layer 32T can be removed by an etch process, which may include an anisotropic etch process. Remaining portions of the at least one metallic material that fills the source-level backside recesses 143S constitute source layers 22. Remaining portions of the at least one metallic material that fills the drain-level backside recesses 143D constitute drain layers 28. In one embodiment, each source layer 22 may comprise a combination of a respective metallic barrier liner 22L and a respective metallic fill material portion 22F, and each drain layer 28 may comprise a combination of a respective metallic barrier liner 28L and a respective metallic fill material portion 28F. In one embodiment, the source layers 22 may be electrically grounded, and the drain layers 28 may function as bit lines during operation of the three-dimensional memory device, which functions as a three-dimensional NOR memory array.

In an alternative embodiment, the order of steps of forming the composite metal oxide semiconductor channel layers 260 and the source and drain layers (22, 28) is reversed. In this alternative embodiment, the source-level sacrificial material layer 142S and the drain-level sacrificial material layers 142D are replaced with the source layers 22 and the drain layers 28, as shown in FIGS. 34-35C. After formation of the source and drain layers (22, 28), the channel-level sacrificial layers 31 are replaced with the composite metal oxide semiconductor channel layers 260, as shown in FIGS. 30A-32C.

Generally, the source-level sacrificial material layer 142S and the drain-level sacrificial material layers 142D are replaced with the source layers 22 and the drain layers 28, respectively. The channel-level insulating layer 36 is located between a respective vertically neighboring pair of a source layer 22 and drain layer 28. In one embodiment, each of the source layers 22 and the drain layers 28 may consist essentially of at least one electrically conductive material.

Generally, at least one instance of a unit layer stack ULS can be formed in over a horizontal top surface of a substrates 8. Each unit layer stack ULS comprises a source layer 22, a channel-level insulating layer 36, a composite metal oxide semiconductor channel layer 260, a drain layer 28, and a vertical-isolation insulating layer 34. A combination of a unit layer stack ULS and portions of the memory opening fill structures 158 located between the horizontal plane including the top surface of the unit layer stack ULS and the horizontal plane including the bottom surface of the unit layer stack ULS constitutes a memory structure MS. At least one instance of a memory structure MS can be formed in over a horizontal top surface of the substrate 8.

In one embodiment, lateral extents of the source layers 22 within the plurality of instances of the memory structure MS decrease with a vertical distance from the horizontal top surface of the substrate 8. In one embodiment, lateral extents of the drain layers 28 within the plurality of instances of the memory structure MS decrease with a vertical distance from the horizontal top surface of the substrate 8. In one embodiment, the plurality of instances of the memory structure MS comprises stepped surfaces including horizontal surface segments and vertical surface segments that are interconnected, the vertical surface segments comprising a subset of vertical surfaces of the source layers 22, the drain layers 28, and the composite metal oxide semiconductor channel layers 260.

In one embodiment, each source layer 22 can contact a first horizontal surface of a first horizontally-extending portion HEP1 of a respective composite metal oxide semiconductor channel layer 260, and each drain layer 28 can contact a first horizontal surface of a second horizontally-extending portion HEP2 of the respective composite metal oxide semiconductor channel layer 260.

In one embodiment, each of the source layer 22 and the drain layer 28 comprises: a respective metallic barrier liner (22L, 28L) comprising a conductive metallic compound material and contacting the composite metal oxide semiconductor channel layer 260 and comprising two horizontally-extending portions and a tubular portion connecting the two horizontally-extending portions; and a respective metallic fill material layer (22F, 28F) comprising at least one metal and laterally surrounding the tubular portion of the respective metallic barrier liner (22L, 28L) and located between the two horizontally-extending portions.

Figure 36:
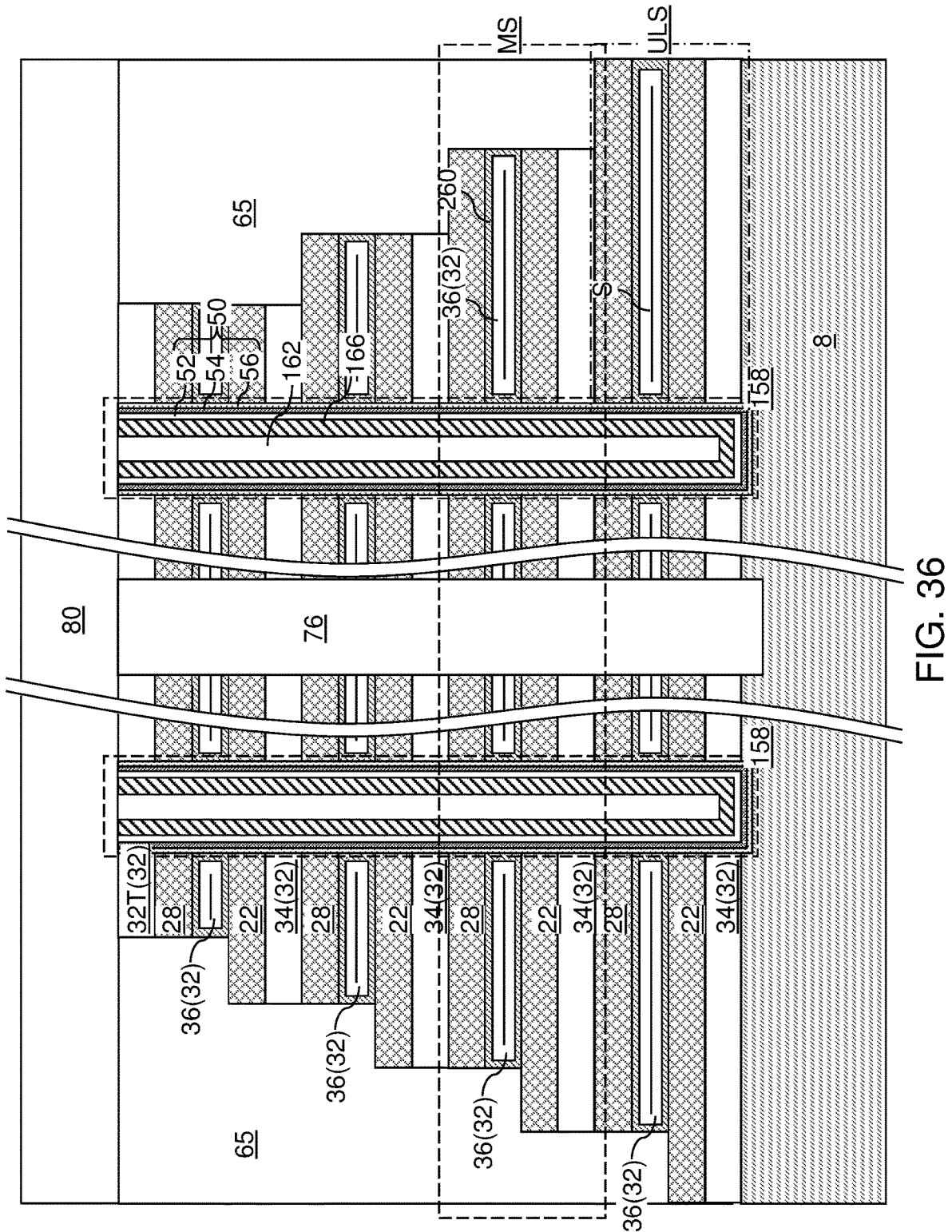
FIG. 36 is a vertical cross-sectional view of the third exemplary structure after formation of a backside trench fill structure and a contact-level dielectric layer according to the third embodiment of the present disclosure.

Referring to FIG. 36, a dielectric material, such as silicon oxide, can be deposited in each backside trench to form backside trench fill structures 76. Portions of the dielectric material that is deposited over the topmost insulating layer 32T can constitute a contact-level dielectric layer 80. Each backside trench fill structure 76 can vertically extend through the multiple instances of a unit layer stack ULS including a source layer 22, a channel-level sacrificial layer 36, a drain layer 28, and a vertical-isolation insulating layer 34.

Figure 37A:
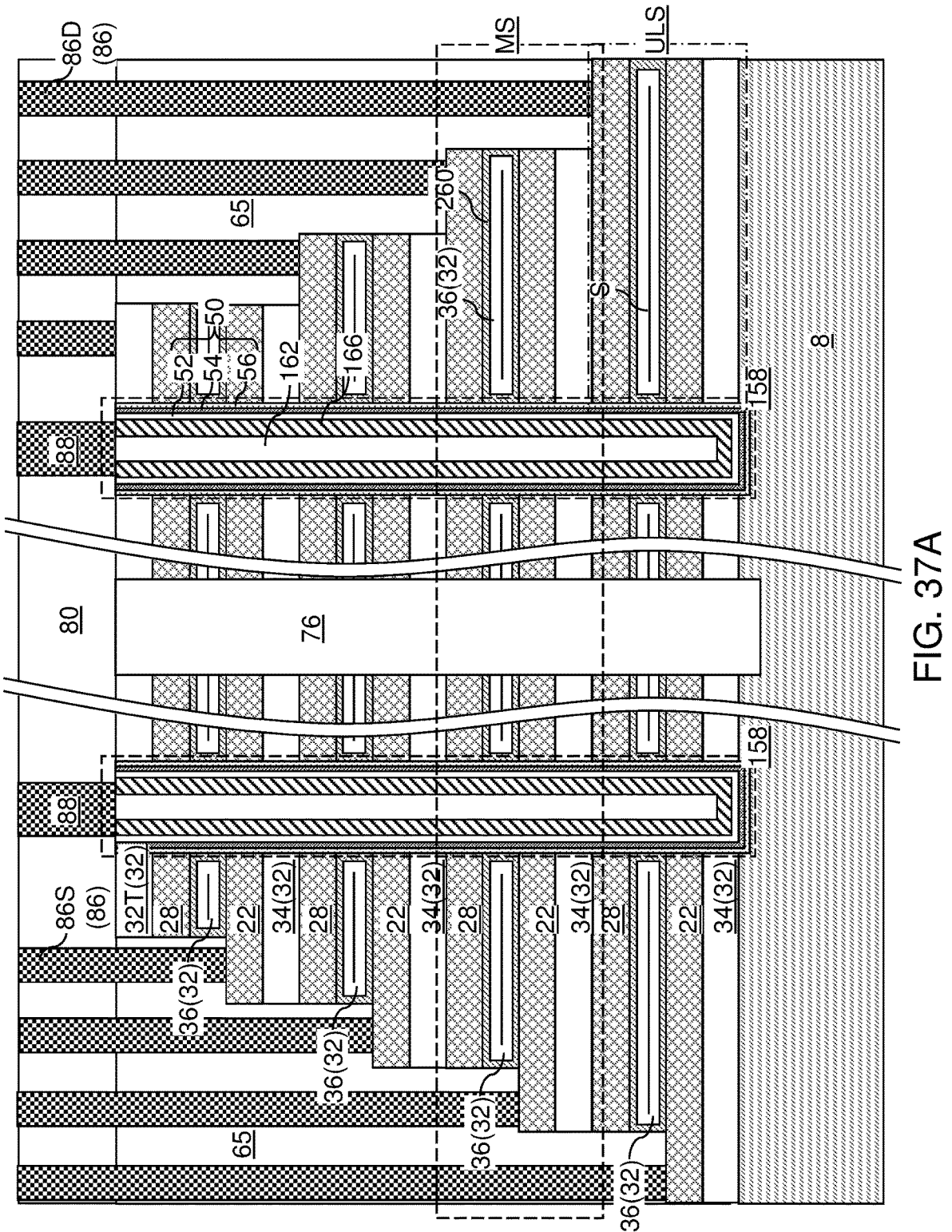
FIG. 37A is a vertical cross-sectional view of the third exemplary structure after formation of contact via structures according to the third embodiment of the present disclosure.
Figure 37B:
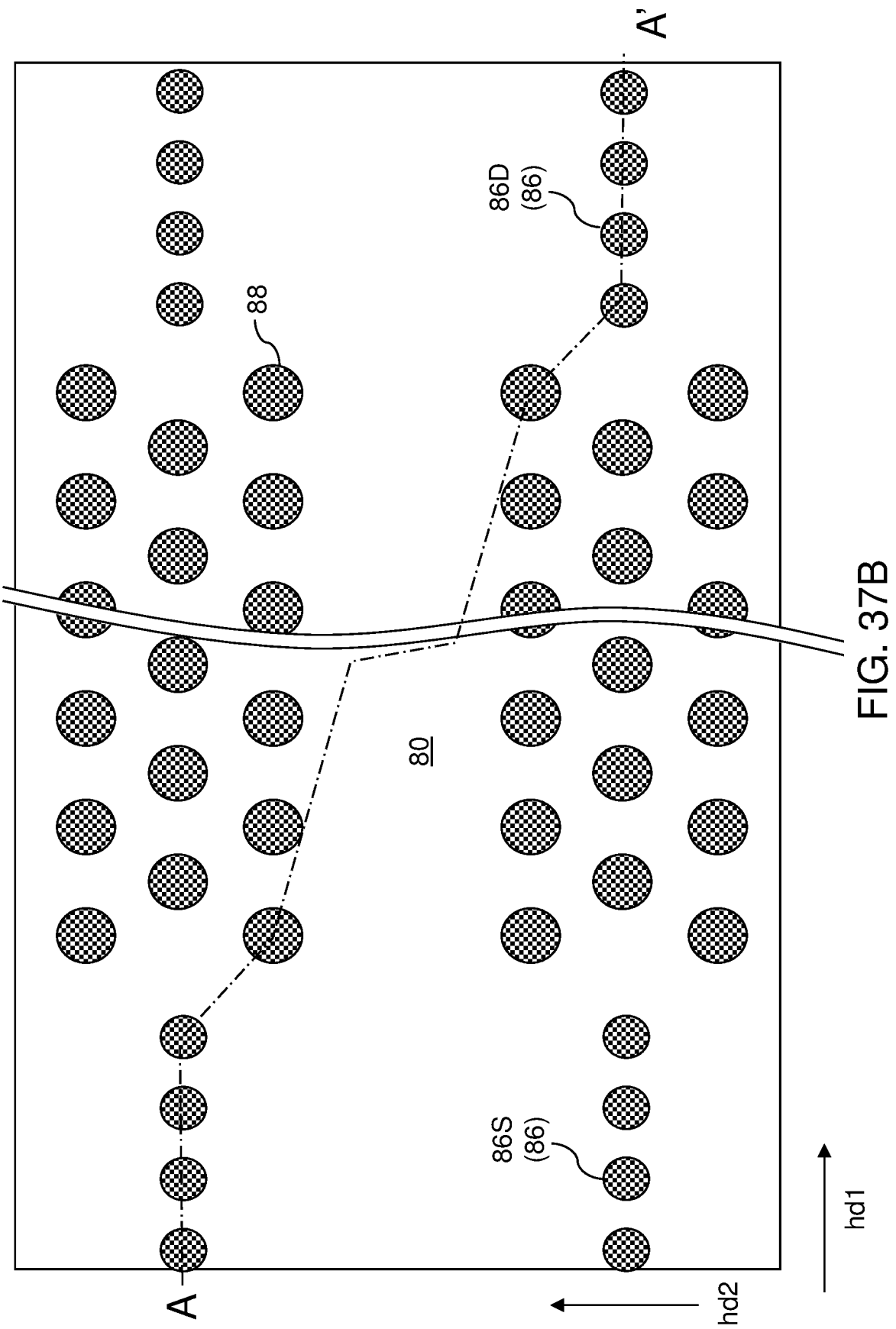
FIG. 37B is a top-down view of the third exemplary structure of FIG. 37A. The vertical plane A-A' is the plane of the vertical cross-sectional view of FIG. 37A.

Referring to FIGS. 37A and 37B, contact via structures (88, 86) can be formed through the contact-level dielectric layer 80 and optionally through a retro-stepped dielectric material portion 65. The contact via structures (88, 86) include word line contact via structures 88 each of which contacts a respective one of the gate electrodes 166. Word-line-interconnect metal lines (not shown) can be subsequently formed over the contact-level dielectric layer 80. Each of the word-line-interconnect metal lines can be in electrical contact with a respective one of the gate electrodes 166 through a respective word line contact via structure 88.

Further, the contact via structures (88, 86) include layer contact via structures 86 that contact a respective one of the source layers 22 and the drain layers 28 within the respective staircase regions (200A, 200B). The layer contact via structures 86 include source layer contact via structures 86S and drain layer contact via structures 86D. Each source layer contact via structure 86S contacts a respective one of the source layers 22. Each drain layer contact via structure 86D contacts a respective one of the drain layers 28. Source interconnect metal lines (not shown) and drain interconnect metal lines (not shown) can be subsequently formed over the contact-level dielectric layer 80 to electrically connect each of the layer contact via structures (86S, 86D) to a respective node of a driver circuit, which includes source line drivers, bit line drivers, and a sensing circuit.

In one embodiment, the source layers 22 in the alternating stack of source layers 22 and drain layers 28 have different lateral extents that decrease with a vertical distance from the substrate, and the drain layers 28 in the alternating stack of source layers 22 and drain layers 28 have different lateral extents that decrease with a vertical distance from the substrate. A first retro-stepped dielectric material portion 65 contacts horizontal surfaces of the source layers 22 in the alternating stack and laterally surrounds the source layer contact via structures 86S. A second retro-stepped dielectric material portion 65 contacts horizontal surfaces of the drain layers 28 in the alternating stack and laterally surrounds the drain layer contact via structures 86D.

Figure 38:
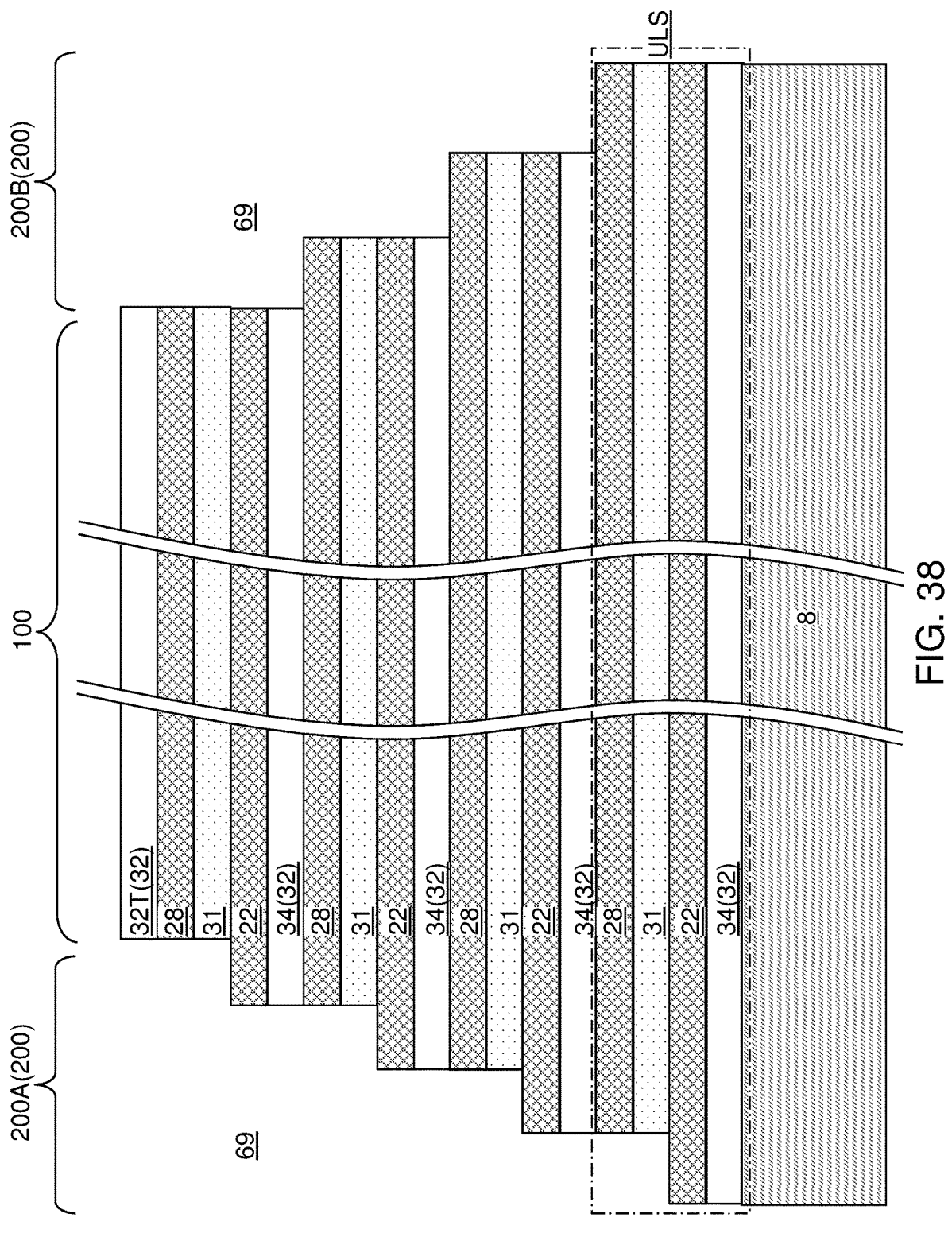
FIG. 38 is a vertical cross-sectional view of an alternative embodiment of the third exemplary structure after formation of a plurality of a unit layer stack including a vertical-isolation insulating layer, a source-level material layer, a channel-level sacrificial layer, and a drain-level material layer according to the third embodiment of the present disclosure.

FIG. 38 is a vertical cross-sectional view of an alternative embodiment of the third exemplary structure after formation of a plurality of a unit layer stack including a vertical-isolation insulating layer 34, a source-level material layer, a channel-level sacrificial layer 31, and a drain-level material layer according to the third embodiment of the present disclosure. The alternative embodiment of the third exemplary structure illustrated in FIG. 40 may be derived from the third exemplary structure illustrated in FIG. 25 by forming a source layer 22 as each source-level material layer, and by forming a drain layer 28 as each drain-level material layer. The source layers 22 and the drain layers 28 comprise and/or consist essentially of at least one conductive material, which may be a single conductive material. In one embodiment, each of the source layers 22 and the drain layers 28 may have a homogenous material composition throughout.

Since the source-level material layers and the drain-level material layers are formed as source layers 22 and drain layers 28, respectively, processes described with a reference to replacement of sacrificial source-level material layers 142S and sacrificial drain-level material layers 142D may be omitted during subsequent processing steps. Specifically, the processing steps described with reference to FIGS. 34 and 35A-35C may be omitted. In other words, the processing steps described with reference to FIGS. 26A-33C may be performed, followed by the processing steps described with reference to FIGS. 36-37B.

Generally, one or more instances of a unit layer stack ULS can be formed over a substrate 8. The unit layer stack ULS comprises a vertical-isolation insulating layer 34, a source-level material layer, a channel-level sacrificial layer 31, and a drain-level material layer. Each source-level material layer is formed as, or is subsequently replaced with, a source layer 22; and each drain-level material layer is formed as, or is subsequently replaced with, a drain layer 28.

Figure 39A:
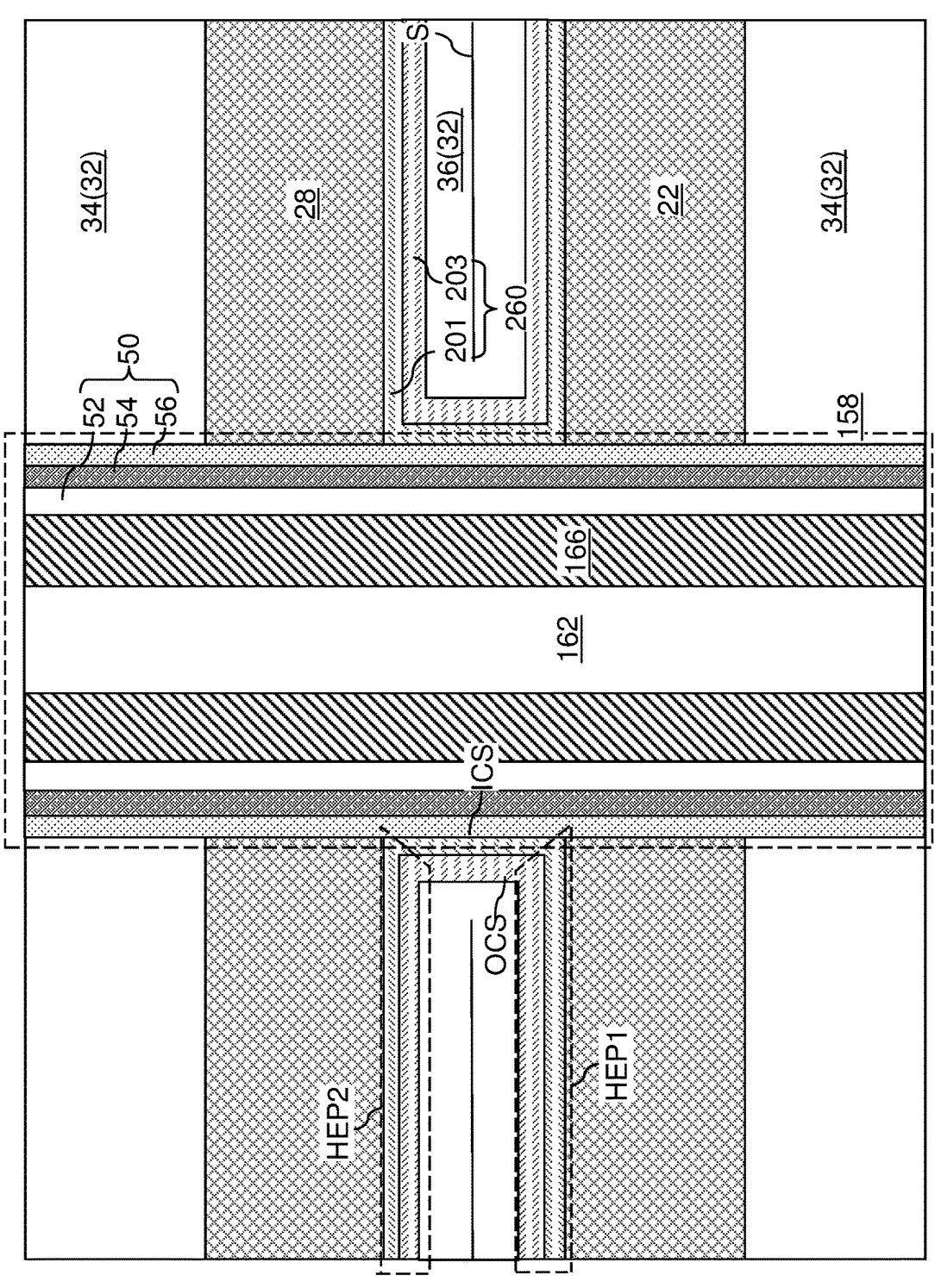
FIG. 39A is a vertical cross-sectional view of a portion of the alternative embodiment of the third exemplary structure in a first configuration after formation of channel-level insulating layers according to the third embodiment of the present disclosure.

FIG. 39A is a vertical cross-sectional view of a portion of the alternative embodiment of the third exemplary structure in a first configuration after formation of channel-level insulating layers 36 according to the third embodiment of the present disclosure.

Figure 39B:
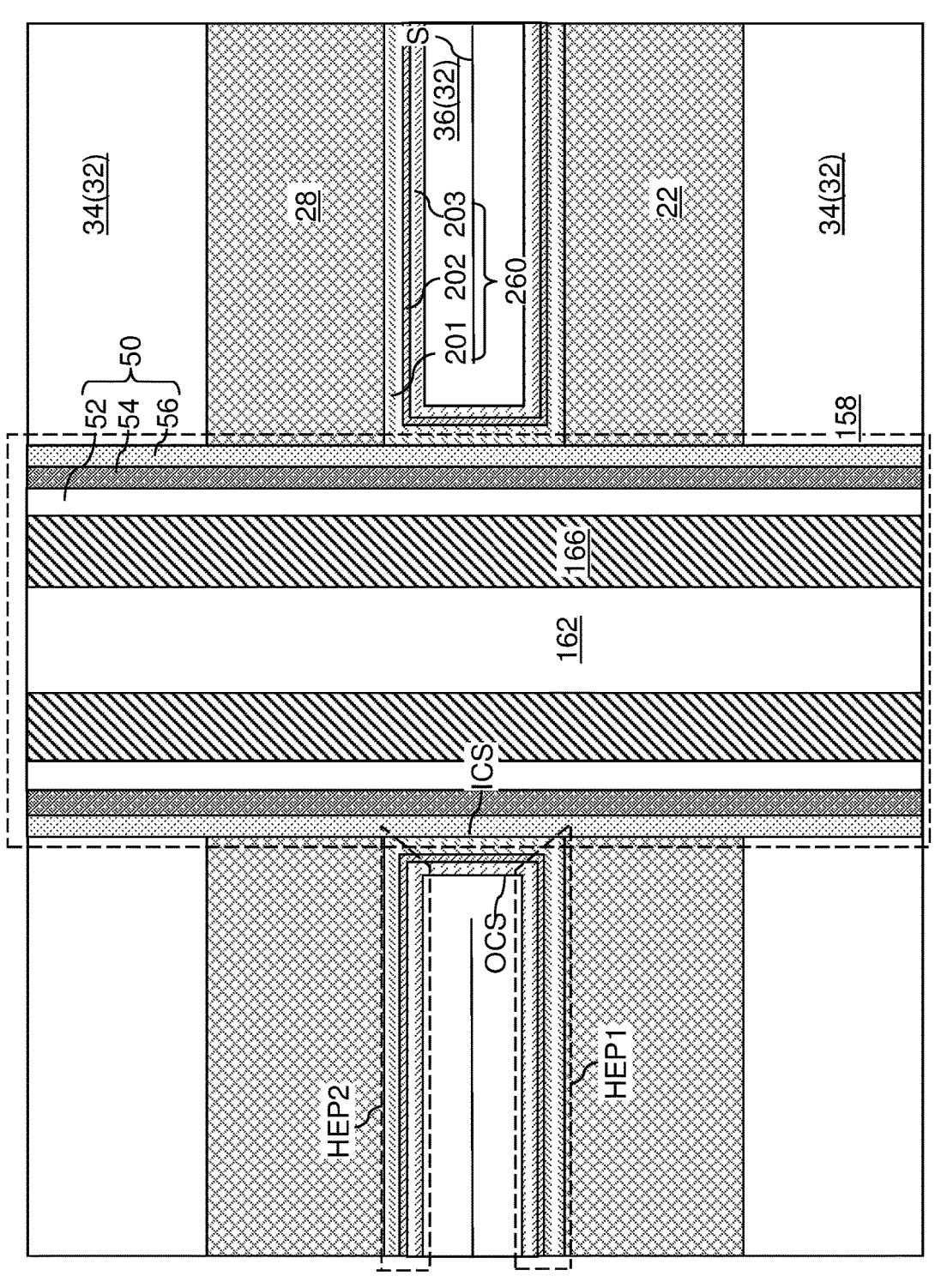
FIG. 39B is a vertical cross-sectional view of a portion of the alternative embodiment of the third exemplary structure in a second configuration after formation of channel-level insulating layers according to the third embodiment of the present disclosure.

FIG. 39B is a vertical cross-sectional view of a portion of the alternative embodiment of the third exemplary structure in a second configuration after formation of channel-level insulating layers 36 according to the third embodiment of the present disclosure.

Referring to all drawings and according to various embodiments of the present disclosure, a three-dimensional memory device includes an alternating stack of insulating layers 32 and electrically conductive layers (22, 28), a memory opening 149 vertically extending through the alternating stack, a memory film 50 located in the memory opening, and a composite metal oxide semiconductor channel 260 containing a first semiconducting metal oxide channel layer 601 having a first band gap and a second semiconducting metal oxide channel layer 603 having a second band gap that is different from the first band gap.

In one embodiment, the composite metal oxide semiconductor channel comprises at least one metal and oxygen, or at least one metal, oxygen and nitrogen.

In one embodiment, the first band gap is smaller than the second band gap. In one embodiment, the second semiconducting metal oxide channel layer comprises indium gallium zinc oxide, and the first semiconducting metal oxide channel layer comprises indium tin zinc oxide or zinc oxynitride.

In the alternative embodiments of FIGS. 35C and 39B, the composite metal oxide semiconductor channel 260 further comprises an intermediate semiconducting channel layer 602 having a graded band gap and interposed between the first semiconducting metal oxide channel layer 601 and the second semiconducting metal oxide channel layer 603.

In one embodiment, an atomic concentration of free charge carriers within the first semiconducting metal oxide channel layer 601 is greater than an atomic concentration of free charge carriers within the second semiconducting metal oxide channel layer 603.

In one embodiment, the composite metal oxide semiconductor channel layer 260 comprises an inner cylindrical sidewall ICS, an outer cylindrical sidewall OCS, a first horizontally-extending portion HEP1 adjoined to first closed peripheries of the inner cylindrical sidewall ICS and the outer cylindrical sidewall OCS, and a second horizontally-extending portion HEP2 adjoined to second closed peripheries of the inner cylindrical sidewall ICS and the outer cylindrical sidewall OCS.

In one embodiment, the electrically conductive layers (22, 28) comprise source layers 22 contacting first horizontal surfaces of the first horizontally-extending portion HEP1 of the composite metal oxide semiconductor channel layers 260; drain layers 28 contacting first horizontal surfaces of the second horizontally-extending portions HEP2 of the composite metal oxide semiconductor channel layers 260. In one embodiment, a gate electrode 166 is located within a volume that is laterally surrounded by the inner cylindrical sidewall ICS.

In one embodiment, the memory film 50 is located between the gate electrode 166 and the inner cylindrical sidewall ICS. In one embodiment, each of the first semiconducting metal oxide channel layers 201 contacts one of the source layers 22 and one of the drain layers 28.

In one embodiment, the insulating layers 32 comprise channel-level insulating layers 36 laterally surrounding and contacting the outer cylindrical sidewall OCS of the composite metal oxide semiconductor channel layer 260; and vertical-isolation insulating layers 34 located in contact with one of the source layers 22 or the drain layers 28, and is vertically spaced from the channel-level insulating layer 36 by the one of the source layers 22 or the drain layers 28.

In one embodiment, a first horizontal surface of the channel-level insulating layer 36 contacts a second horizontal surface of the first horizontally-extending portion HEP1 of the composite metal oxide semiconductor channel layer 260; and a second horizontal surface of the channel-level insulating layer 36 contacts a second horizontal surface of the second horizontally-extending portion HEP2 of the composite metal oxide semiconductor channel layer 260.

In one embodiment, the channel-level insulating layers 36 comprise a horizontally-extending seam "S"; and the vertical-isolation insulating layers 34 do not include a seam therein. In one embodiment, lateral extents of the source layers 22 and the drain layers 28 decrease with a vertical distance from an underlying substrate 8.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers;
a memory opening vertically extending through the alternating stack;
a memory film located in the memory opening; and
a composite metal oxide semiconductor channel comprising a first semiconducting metal oxide channel layer having a first band gap and a second semiconducting metal oxide channel layer having a second band gap that is different from the first band gap, wherein the composite metal oxide semiconductor channel comprises at least one metal and oxygen, or at least one metal, oxygen and nitrogen;
wherein the composite metal oxide semiconductor channel layer comprises an inner cylindrical sidewall, an outer cylindrical sidewall, a first horizontally-extending portion adjoined to first closed peripheries of the inner cylindrical sidewall and the outer cylindrical sidewall, and a second horizontally-extending portion adjoined to second closed peripheries of the inner cylindrical sidewall and the outer cylindrical sidewall;
wherein the electrically conductive layers comprise:
source layers contacting first horizontal surfaces of the first horizontally-extending portions of the composite metal oxide semiconductor channel layers; and
drain layers contacting first horizontal surfaces of the second horizontally-extending portions of the composite metal oxide semiconductor channel layers;
wherein the insulating layers comprise:
channel-level insulating layers laterally surrounding and contacting the outer cylindrical sidewall of the composite metal oxide semiconductor channel layer; and
vertical-isolation insulating layers located contact with one of the source layers or the drain layers, and vertically spaced from the channel-level insulating layers by the one of the source layers or the drain layers; and
wherein:
a first horizontal surface of the channel-level insulating layer contacts a second horizontal surface of the first horizontally-extending portion of the composite metal oxide semiconductor channel layer; and
a second horizontal surface of the channel-level insulating layer contacts a second horizontal surface of the second horizontally-extending portion of the composite metal oxide semiconductor channel layer.

2. The three-dimensional memory device of claim 1, wherein the first band gap is smaller than the second band gap.

3. The three-dimensional memory device of claim 2, wherein the second semiconducting metal oxide channel layer comprises indium gallium zinc oxide.

4. The three-dimensional memory device of claim 3, wherein the first semiconducting metal oxide channel layer comprises indium tin zinc oxide.

5. The three-dimensional memory device of claim 3, wherein the first semiconducting metal oxide channel layer comprises zinc oxynitride.

6. The three-dimensional memory device of claim 1, wherein the composite metal oxide semiconductor channel further comprises an intermediate semiconducting channel layer having a graded band gap and interposed between the first semiconducting metal oxide channel layer and the second semiconducting metal oxide channel layer.

7. The three-dimensional memory device of claim 1, wherein an atomic concentration of free charge carriers within the first semiconducting metal oxide channel layer is greater than an atomic concentration of free charge carriers within the second semiconducting metal oxide channel layer.

8. The three-dimensional memory device of claim 1, further comprising a gate electrode located within a volume that is laterally surrounded by the inner cylindrical sidewall.

9. The three-dimensional memory device of claim 8, wherein:
the first semiconducting metal oxide channel layer contacts one of the source layers and one of the drain layers; and
the memory film is located between the gate electrode and the inner cylindrical sidewall.

10. The three-dimensional memory device of claim 1, wherein:
the channel-level insulating layers comprise a horizontally-extending seam; and
the vertical-isolation insulating layers do not include a seam therein.

11. The three-dimensional memory device of claim 1, wherein lateral extents of the source layers and the drain layers decrease with a vertical distance from an underlying substrate.

* * * * *